United States Patent
Bui et al.

(10) Patent No.: US 8,912,615 B2
(45) Date of Patent: Dec. 16, 2014

(54) SHALLOW JUNCTION PHOTODIODE FOR DETECTING SHORT WAVELENGTH LIGHT

(71) Applicant: OSI Optoelectronics, Inc., Hawthorne, CA (US)

(72) Inventors: Peter Steven Bui, Cerritos, CA (US); Narayan Dass Taneja, Long Beach, CA (US)

(73) Assignee: OSI Optoelectronics, Inc., Hawthorne, CA (US)

( * ) Notice: Subject to any disclaimer, the term of this patent is extended or adjusted under 35 U.S.C. 154(b) by 105 days.

(21) Appl. No.: 13/749,616

(22) Filed: Jan. 24, 2013

(65) Prior Publication Data

US 2014/0203386 A1  Jul. 24, 2014

(51) Int. Cl.
H01L 31/0352 (2006.01)
H01L 27/146 (2006.01)
H01L 31/103 (2006.01)

(52) U.S. Cl.
CPC .... *H01L 31/035272* (2013.01); *H01L 27/1463* (2013.01); *H01L 27/14643* (2013.01); *H01L 31/103* (2013.01); *H01L 27/14618* (2013.01); *H01L 27/14658* (2013.01); *H01L 27/14627* (2013.01)
USPC .... 257/431; 257/432; 257/443; 257/E21.001; 438/48; 438/54; 438/66; 438/69; 438/87

(58) Field of Classification Search
CPC ............... H01L 31/035272; H01L 27/14643; H01L 31/0232; H01L 27/1463; H01L 27/14603; H01L 27/14627; H01L 31/103
USPC ........... 257/431, 432, 443, E21.001; 438/48, 438/54, 66, 69, 87
See application file for complete search history.

(56) References Cited

U.S. PATENT DOCUMENTS

| 3,041,226 A | 6/1962 | Pennington |
| 3,713,921 A | 1/1973 | Fleischer et al. |
| 3,765,969 A | 10/1973 | Kragness et al. |
| 3,801,390 A | 4/1974 | Lepselter et al. |

(Continued)

FOREIGN PATENT DOCUMENTS

| EP | 0347157 A2 | 12/1989 |
| EP | 04036282 A2 | 7/1991 |

(Continued)

OTHER PUBLICATIONS

Y Akatsu, Y. Muramoto, K. Kato, M. Ikeda, M. Ueki, A. Kozen, T. Kurosaki, K. Kawano, and J. Yoshida, 'Long-wavelength multimode waveguide photodiodes suitable for hybrid optical module integrated with planar lightwave circuit', Electron. Lett., vol. 31, pp. 2098-2100, 1995.

(Continued)

*Primary Examiner* — Thinh T Nguyen
(74) *Attorney, Agent, or Firm* — Novel IP

(57) ABSTRACT

The present invention is a photodiode or photodiode array having improved ruggedness for a shallow junction photodiode which is typically used in the detection of short wavelengths of light. In one embodiment, the photodiode has a relatively deep, lightly-doped P zone underneath a P+ layer. By moving the shallow junction to a deeper junction in a range of 2-5 μm below the photodiode surface, the improved device has improved ruggedness, is less prone to degradation, and has an improved linear current.

16 Claims, 42 Drawing Sheets

(56) References Cited

U.S. PATENT DOCUMENTS

| | | |
|---|---|---|
| 3,808,068 A | 4/1974 | Johnson et al. |
| 3,887,936 A | 6/1975 | Shannon et al. |
| 3,895,976 A | 7/1975 | Dumas |
| 3,982,269 A | 9/1976 | Torreno |
| 4,079,405 A | 3/1978 | Ohuchi |
| 4,190,467 A | 2/1980 | Lien |
| 4,200,472 A | 4/1980 | Chappell |
| 4,210,923 A | 7/1980 | North et al. |
| 4,219,368 A | 8/1980 | David |
| 4,238,760 A | 12/1980 | Carr |
| 4,290,844 A | 9/1981 | Rotolante et al. |
| 4,329,702 A | 5/1982 | Wallace |
| 4,616,247 A | 10/1986 | Chang |
| 4,857,980 A | 8/1989 | Hoeberechts |
| 4,874,939 A | 10/1989 | Nishimoto et al. |
| 4,887,140 A | 12/1989 | Wang |
| 4,904,608 A | 2/1990 | Gentner et al. |
| 4,904,861 A | 2/1990 | Epstein et al. |
| 4,998,013 A | 3/1991 | Epstein et al. |
| 5,040,039 A | 8/1991 | Hattori |
| 5,049,962 A | 9/1991 | Huang et al. |
| 5,053,318 A | 10/1991 | Gulla et al. |
| 5,144,379 A | 9/1992 | Eshita et al. |
| 5,214,276 A | 5/1993 | Himoto et al. |
| 5,237,197 A | 8/1993 | Snoeys et al. |
| 5,252,142 A | 10/1993 | Matsuyama et al. |
| 5,252,851 A | 10/1993 | Mita |
| 5,254,480 A | 10/1993 | Tran |
| 5,276,955 A | 1/1994 | Noddin et al. |
| 5,315,148 A | 5/1994 | Fujimura |
| 5,408,122 A | 4/1995 | Reele |
| 5,414,295 A | 5/1995 | Le Roux |
| 5,418,396 A | 5/1995 | Mita |
| 5,430,321 A | 7/1995 | Effelsberg |
| 5,446,308 A | 8/1995 | Piccone et al. |
| 5,446,751 A | 8/1995 | Wake |
| 5,457,322 A | 10/1995 | Kitaguchi |
| 5,501,990 A | 3/1996 | Holm et al. |
| 5,517,052 A | 5/1996 | Ishaque |
| 5,543,736 A | 8/1996 | Gardner |
| 5,576,559 A | 11/1996 | Davis |
| 5,599,389 A | 2/1997 | Iwasaki |
| 5,608,237 A | 3/1997 | Aizawa |
| 5,656,508 A | 8/1997 | So et al. |
| 5,670,383 A | 9/1997 | Piccone |
| 5,670,817 A | 9/1997 | Robinson |
| 5,698,454 A | 12/1997 | Zommer |
| 5,777,352 A | 7/1998 | Reele |
| 5,818,096 A | 10/1998 | Ishibashi et al. |
| 5,825,047 A | 10/1998 | Ajisawa et al. |
| 5,869,834 A | 2/1999 | Wipenmyr |
| 5,880,482 A | 3/1999 | Adesida |
| 5,889,313 A | 3/1999 | Parker |
| 5,914,502 A | 6/1999 | Simmonet |
| 5,923,720 A | 7/1999 | Barton et al. |
| 5,928,438 A | 7/1999 | Salami et al. |
| 6,027,956 A | 2/2000 | Irissou |
| 6,031,254 A | 2/2000 | Quoirin |
| 6,075,275 A | 6/2000 | Irissou |
| 6,121,552 A | 9/2000 | Brosnihan |
| 6,144,379 A | 11/2000 | Bertram |
| 6,169,319 B1 | 1/2001 | Malinovich |
| 6,175,141 B1 | 1/2001 | Hofbauer et al. |
| 6,204,087 B1 | 3/2001 | Parker |
| 6,218,684 B1 | 4/2001 | Kuhara et al. |
| 6,218,704 B1 | 4/2001 | Brown |
| 6,277,668 B1 | 8/2001 | Goossen |
| 6,303,967 B1 | 10/2001 | Irissou |
| 6,326,300 B1 | 12/2001 | Liu et al. |
| 6,326,649 B1 | 12/2001 | Chang et al. |
| 6,352,517 B1 | 3/2002 | Flock et al. |
| 6,392,282 B1 | 5/2002 | Sahara |
| 6,399,991 B1 | 6/2002 | Ando |
| 6,426,991 B1 | 7/2002 | Mattson et al. |
| 6,438,296 B1 | 8/2002 | Kongable |
| 6,458,619 B1 | 10/2002 | Irissou |
| 6,483,130 B1 | 11/2002 | Yang |
| 6,489,635 B1 | 12/2002 | Sugg |
| 6,504,158 B2 | 1/2003 | Possin |
| 6,504,178 B2 | 1/2003 | Carlson |
| 6,507,050 B1 | 1/2003 | Green |
| 6,510,195 B1 | 1/2003 | Chappo et al. |
| 6,541,836 B2 | 4/2003 | Iwanczyk |
| 6,546,171 B2 | 4/2003 | Fukutomi |
| 6,569,700 B2 | 5/2003 | Yang |
| 6,593,636 B1 | 7/2003 | Bui et al. |
| 6,613,974 B2 | 9/2003 | Husher |
| 6,667,528 B2 | 12/2003 | Cohen |
| 6,670,258 B2 | 12/2003 | Carlson et al. |
| 6,677,182 B2 | 1/2004 | Carlson |
| 6,683,326 B2 | 1/2004 | Iguchi |
| 6,690,078 B1 | 2/2004 | North |
| 6,713,768 B2 | 3/2004 | Iwanczyk |
| 6,734,416 B2 | 5/2004 | Carlson et al. |
| 6,762,473 B1 | 7/2004 | Goushcha |
| 6,772,729 B2 | 8/2004 | Brosseau et al. |
| 6,815,790 B2 | 11/2004 | Bui et al. |
| 6,826,080 B2 | 11/2004 | Park et al. |
| 6,853,046 B2 | 2/2005 | Shibayama |
| 6,914,271 B2 | 7/2005 | Menard |
| 7,019,338 B1 | 3/2006 | Ballon |
| 7,038,288 B2 | 5/2006 | Lai |
| 7,057,254 B2 | 6/2006 | Bui et al. |
| 7,057,255 B2 | 6/2006 | Yamabayashi |
| 7,057,257 B2 | 6/2006 | Tran |
| 7,112,465 B2 | 9/2006 | Goushcha et al. |
| 7,138,697 B2 | 11/2006 | Chu |
| 7,148,464 B2 | 12/2006 | Shibayama |
| 7,157,785 B2 | 1/2007 | Takei |
| 7,161,155 B1 | 1/2007 | Deych |
| 7,198,972 B2 | 4/2007 | Sato |
| 7,230,226 B2 * | 6/2007 | Inuiya ..................... 250/208.1 |
| 7,242,009 B1 | 7/2007 | Wilson |
| 7,242,069 B2 | 7/2007 | Bui et al. |
| 7,256,386 B2 | 8/2007 | Carlson |
| 7,256,470 B2 | 8/2007 | Bui et al. |
| 7,279,731 B1 | 10/2007 | Bui et al. |
| 7,423,305 B2 | 9/2008 | Shinohara |
| 7,456,453 B2 | 11/2008 | Inoue |
| 7,470,966 B2 | 12/2008 | Bui |
| 7,560,790 B2 | 7/2009 | Shibayama |
| 7,560,791 B2 | 7/2009 | Wilson |
| 7,576,369 B2 | 8/2009 | Bui |
| 7,579,666 B2 | 8/2009 | Bui |
| 7,622,785 B2 | 11/2009 | Sasagawa |
| 7,649,236 B2 | 1/2010 | Fujii |
| 7,655,999 B2 | 2/2010 | Bui |
| 7,656,001 B2 | 2/2010 | Bui |
| 7,709,921 B2 | 5/2010 | Bui |
| 7,728,367 B2 | 6/2010 | Bui |
| 7,810,740 B2 | 10/2010 | Shibayama |
| 7,880,258 B2 | 2/2011 | Bui et al. |
| 7,898,055 B2 | 3/2011 | Bui |
| 7,948,049 B2 | 5/2011 | Bui |
| 7,968,964 B2 | 6/2011 | Bui |
| 8,035,183 B2 | 10/2011 | Bui |
| 8,049,294 B2 | 11/2011 | Bui |
| 8,120,023 B2 | 2/2012 | Bui |
| 8,164,151 B2 | 4/2012 | Bui et al. |
| 8,324,670 B2 | 12/2012 | Bui |
| 8,338,905 B2 | 12/2012 | Bui |
| 8,399,909 B2 | 3/2013 | Bui |
| 8,461,541 B2 | 6/2013 | Garcia |
| 8,476,725 B2 | 7/2013 | Bui |
| 8,519,503 B2 | 8/2013 | Bui |
| 8,674,401 B2 | 3/2014 | Bui |
| 8,686,529 B2 | 4/2014 | Bui |
| 2001/0034105 A1 | 10/2001 | Carlson |
| 2002/0020893 A1 | 2/2002 | Lhorte |
| 2002/0056845 A1 | 5/2002 | Iguchi et al. |
| 2002/0148967 A1 | 10/2002 | Iwanczyk |
| 2003/0116187 A1 | 6/2003 | Husher |
| 2004/0104351 A1 | 6/2004 | Shibayama |
| 2004/0113185 A1 | 6/2004 | Shibayama |

(56) References Cited

U.S. PATENT DOCUMENTS

| | | |
|---|---|---|
| 2004/0129991 A1 | 7/2004 | Lai |
| 2004/0129992 A1 | 7/2004 | Shibayama |
| 2004/0135170 A1 | 7/2004 | Menard |
| 2004/0206886 A1 | 10/2004 | Carlson et al. |
| 2004/0222358 A1 | 11/2004 | Bui et al. |
| 2004/0222482 A1 | 11/2004 | Bui |
| 2004/0241897 A1 | 12/2004 | Rhee et al. |
| 2004/0262652 A1 | 12/2004 | Gouschcha et al. |
| 2005/0082640 A1 | 4/2005 | Takei |
| 2005/0184354 A1 | 8/2005 | Chu |
| 2005/0186754 A1 | 8/2005 | Kim |
| 2006/0220078 A1 | 10/2006 | Bui et al. |
| 2006/0255420 A1 | 11/2006 | Bui et al. |
| 2006/0278896 A1 | 12/2006 | Inoue |
| 2006/0278898 A1 | 12/2006 | Shibayama |
| 2007/0001254 A1 | 1/2007 | Inada |
| 2007/0090394 A1 | 4/2007 | Bui et al. |
| 2007/0096178 A1 | 5/2007 | Iguchi |
| 2007/0131992 A1* | 6/2007 | Dosluoglu et al. ............ 257/292 |
| 2007/0257329 A1 | 11/2007 | Bui et al. |
| 2007/0278534 A1 | 12/2007 | Bui et al. |
| 2007/0296005 A1 | 12/2007 | Bui et al. |
| 2008/0067622 A1 | 3/2008 | Bui et al. |
| 2008/0099871 A1 | 5/2008 | Bui et al. |
| 2008/0128846 A1 | 6/2008 | Bui et al. |
| 2008/0277753 A1 | 11/2008 | Bui et al. |
| 2010/0032710 A1 | 2/2010 | Bui |
| 2010/0065939 A1 | 3/2010 | Bui |
| 2010/0213565 A1 | 8/2010 | Bui |
| 2011/0079728 A1 | 4/2011 | Garcia |
| 2011/0175188 A1 | 7/2011 | Bui |
| 2012/0104532 A1 | 5/2012 | Bui |

FOREIGN PATENT DOCUMENTS

| | | |
|---|---|---|
| EP | 0723301 A2 | 7/1996 |
| EP | 0723301 B1 | 7/2000 |
| EP | 1069626 | 1/2001 |
| EP | 1069626 A2 | 1/2001 |
| EP | 1205983 | 5/2002 |
| EP | 1205983 A1 | 5/2002 |
| WO | 0052766 | 9/2000 |
| WO | 0052766 A1 | 9/2000 |
| WO | 2010031011 | 3/2010 |

OTHER PUBLICATIONS

Fukano et al., 'High-REsponsivity and Low-Operation-Voltage Edge-Illuminated Refracting-Facet Photodiodes with Large Alignment Tolerance for Single-Mode Fiber', Journal of Lightwave Technology, vol. 16, No. 5, May 1997.

International Search Report PCT/US2009/056875, Jan. 7, 2010, UDT Sensors, Inc.

List of references cited by examiner for U.S. Appl. No. 13/725,803,Form 892 Aug. 21, 2013.

International Search Report PCT/US09/56875 Jan. 7, 2010.

* cited by examiner

SHALLOW JUNCTION PHOTODIODE FOR DETECTING SHORT WAVELENGTH LIGHT

FIELD

The present specification relates generally to the field of radiation detectors, and in particular, to a shallow junction photodiode having improved device performance characteristics. Specifically, the present specification discloses photodiodes having a doping profile P+P N N+ shallow junction for use in short wavelength light applications such as in CT scanning, X-ray scanning, and other light detection operations.

BACKGROUND

Active solid-state semiconductor devices, and in particular, silicon photodiodes, are among the most popular photodetectors having a sufficiently high performance over a large wavelength range and a sufficient ease of use. Silicon photodiodes are sensitive to light in the wide spectral range, extending from deep ultraviolet through visible to near infrared, which is approximately 200 nm to 1100 nm. Silicon photodiodes, by using their ability to detect the presence or absence of minute light intensities, facilitate the precise measurement of these minute light intensities upon appropriate calibration. For example, appropriately calibrated silicon photodiodes detect and measure light intensities varying over a wide range, from very minute light intensities of below $10^{-13}$ watts/$cm^2$ to high intensities above $10^{-3}$ watts/$cm^2$.

Silicon photodiodes can be employed in an assortment of applications including, but not limited to, spectroscopy, distance and speed measurement, laser ranging, laser guided missiles, laser alignment and control systems, optical free air communication, optical radar, radiation detection, optical position encoding, film processing, flame monitoring, scintillator read out, environmental applications such as spectral monitoring of earth ozone layer and pollution monitoring, low light-level imaging, such as night photography, nuclear medical imaging, photon medical imaging, and multi-slice computer tomography (CT) imaging, security screening and threat detection, thin photochip applications, and a wide range of computing applications.

Typically, photodiode arrays employ a scintillator material for absorbing high energy (ionizing) electromagnetic or charged particle radiation, which, in response, fluoresces photons at a characteristic wavelength. Scintillators are defined by their light output (number of emitted photons per unit absorbed energy) short fluorescence decay times, and optical transparency at wavelengths of their own specific emission energy. The lower the decay time of a scintillator, that is, the shorter the duration of its flashes of fluorescence are, the less so-called "dead time" the detector will have and the more ionizing events per unit of time it will be able to detect. Scintillators are used to detect electromagnetic waves or particles in many security and detection systems, including CT, X-ray, and gamma ray. There, a scintillator converts the energy to light of a wavelength which can be detected by photomultiplier tubes (PMTS) or P– N junction photodiodes.

Photodiodes are typically characterized by certain parameters, such as, among others, electrical characteristics, optical characteristics, current characteristics, voltage characteristics, and noise. Electrical characteristics predominantly comprise shunt resistance, series resistance, junction capacitance, rise or fall time and/or frequency response. Optical characteristics comprise responsivity, quantum efficiency, non-uniformity, and/or non-linearity. Photodiode noise may comprise, among others, thermal noise, quantum, photon or shot noise, and/or flicker noise.

Conventional shallow junction photodiodes are prone to junction degradation and yield loss during assembly due to a very shallow P+N junction, which is typically 0.3 µm. Therefore, what is needed is a photodiode that has improved ruggedness and is less prone to degradation or failure during assembly of scintillator crystals, thereby improving yield and reducing cost. What is also needed is a photodiode having an improved linear current.

SUMMARY

The present specification is directed toward a photodiode having a top surface defined by at least one $SiO_2$ layer comprising: a low resistivity substrate; a high resistivity silicon layer positioned atop the low resistivity substrate and below the top surface of the photodiode; a first P doped zone within the high resistivity silicon layer, wherein the first P doped zone has a thickness of 2-5 µm; a first P+ doped zone positioned between the top of the first P doped zone and the top of the photodiode.

In one embodiment, the low resistivity substrate has a thickness in a range of 150 µm to 350 µm. In one embodiment, the low resistivity substrate is doped n+.

In one embodiment, the high resistivity silicon layer has a thickness in a range of 10 µm to 100 µm. In one embodiment, the high resistivity silicon layer is doped n.

In one embodiment, the first P+ doped zone and a portion of the first P doped zone is surrounded by P+ doped ring.

In one embodiment, the photodiode further comprises a first N+ region extending throughout the thickness of the high resistivity silicon layer. In one embodiment, the photodiode further comprises a second N+ region extending throughout the thickness of the high resistivity silicon layer, wherein the second N+ region is separated from the first N+ region by a third region and wherein the first P doped zone and first P+ doped zone is located in the third region. In one embodiment, the photodiode further comprises a third N+ region extending throughout the thickness of the high resistivity silicon layer, wherein the third N+ region is separated from the second N+ region by a fourth region. In one embodiment, the photodiode further comprises a second P doped zone within said fourth region in the high resistivity silicon layer, wherein the second P doped zone has a thickness of 2-5 µm. In one embodiment, the photodiode further comprises a second P+ doped zone positioned between the top of the second P doped zone and the top of the photodiode in the fourth region.

In one embodiment, all of the first P+ doped zone and a portion of the first P doped zone is surrounded by P+ doped ring. In one embodiment, all of the second P+ doped zone and a portion of the second P doped zone is surrounded by P+ doped ring.

In one embodiment, the photodiode further comprises an anode and a cathode on the top surface of the photodiode.

In one embodiment, the photodiode further comprises an anode on the top surface of the photodiode and a cathode on a backside of the photodiode.

In one embodiment, the photodiode further comprises an anode on the top surface of the photodiode, a cathode on the top surface of the photodiode, and a cathode on a backside of the photodiode.

The present specification is also directed toward a method of fabricating a photodiode on a substrate wafer having a high resistivity silicon layer front side and a low resistivity silicon substrate back side, said method comprising the steps of:

providing an oxide layer on the front side of the wafer; implementing an etching process on the front side to define a first plurality of regions on the front side; filling the first plurality of regions with n+ dopant; depositing an oxide layer on the front side of the wafer; implementing a second etching process on the front side to define a second plurality of regions on the front side; filling the second plurality of regions with a p dopant; depositing an oxide layer on the front side of the wafer; performing a deep drive-in process to redistribute p dopant atoms and deposit them deeper into the wafer creating deep p active areas; implementing a third etching process on the front side to define a third plurality of regions on the front side, wherein the third plurality of regions is on a right side and a left side of each deep p active area; forming deep p+ ring zones in each of the third plurality of regions; depositing an oxide layer on the front side of the wafer; forming an anti-reflective layer on the front side and the back side of the wafer; forming shallow p+ active area regions on the front side of the wafer, on top of the deep p active area regions; forming at least one contact window on the wafer; and performing a metal deposition process to deposit metal on the device wafer, wherein said metal deposition process creates connections and wherein said metal deposition process forms a reflective metal shield.

In one embodiment, the metal deposition process is performed on the front side of the wafer to form both a cathode and an anode and on the back side to form an anode.

In another embodiment, the metal deposition process is performed on the front side of the wafer to form both an anode and a cathode on the front side, forming contacts only on the front side of the device.

In another embodiment, the metal deposition process is performed on the front side of the wafer to form an anode and on the back side of the wafer to form a cathode, forming contacts only on the back side of the device.

In one embodiment, the metal used for depositing metal on the front side for both the anode and cathode is aluminum and the metal used for forming the cathode on the backside is a Cr/Au alloy, forming contacts on both the front side and the back side of the device.

The present specification is also directed toward a photodiode having a top surface defined by at least one $SiO_2$ layer comprising: a high resistivity bulk wafer positioned below the top surface of the photodiode; a first P doped zone within the high resistivity bulk wafer, wherein the first P doped zone has a thickness of 2-5 μm; a first P+ doped zone positioned between the top of the first P doped zone and the top of the photodiode.

In one embodiment, the high resistivity bulk wafer has a thickness in a range of 250 μm to 400 μm.

In one embodiment, the first P+ doped zone and a portion of the first P doped zone is surrounded by P+ doped ring.

In one embodiment, the photodiode further comprises a first N+ region extending throughout the thickness of the high resistivity bulk wafer. In one embodiment, the photodiode further comprises a second N+ region extending throughout the thickness of the high resistivity bulk wafer, wherein the second N+ region is separated from the first N+ region by a third region and wherein the first P doped zone and first P+ doped zone is located in the third region. In one embodiment, the photodiode further comprises a third N+ region extending throughout the thickness of the high resistivity bulk wafer, wherein the third N+ region is separated from the second N+ region by a fourth region. In one embodiment, the photodiode further comprises a second P doped zone within said fourth region in the high resistivity bulk wafer, wherein the second P doped zone has a thickness of 2-5 μm. In one embodiment, the photodiode further comprises a second P+ doped zone positioned between the top of the second P doped zone and the top of the photodiode in the fourth region.

In one embodiment, all of the first P+ doped zone and a portion of the first P doped zone is surrounded by P+ doped ring. In one embodiment, all of the second P+ doped zone and a portion of the second P doped zone is surrounded by P+ doped ring.

In one embodiment, the photodiode further comprises an anode and a cathode on the top surface of the photodiode.

In another embodiment, the photodiode further comprises an anode on the top surface of the photodiode and a cathode on a backside of the photodiode.

In another embodiment, the photodiode further comprises an anode on the top surface of the photodiode, a cathode on the top surface of the photodiode, and a cathode on a backside of the photodiode.

BRIEF DESCRIPTION OF THE DRAWINGS

These and other features and advantages of the present specification will be appreciated, as they become better understood by reference to the following detailed description when considered in connection with the accompanying drawings wherein.

DETAILED DESCRIPTION

Figure 1:
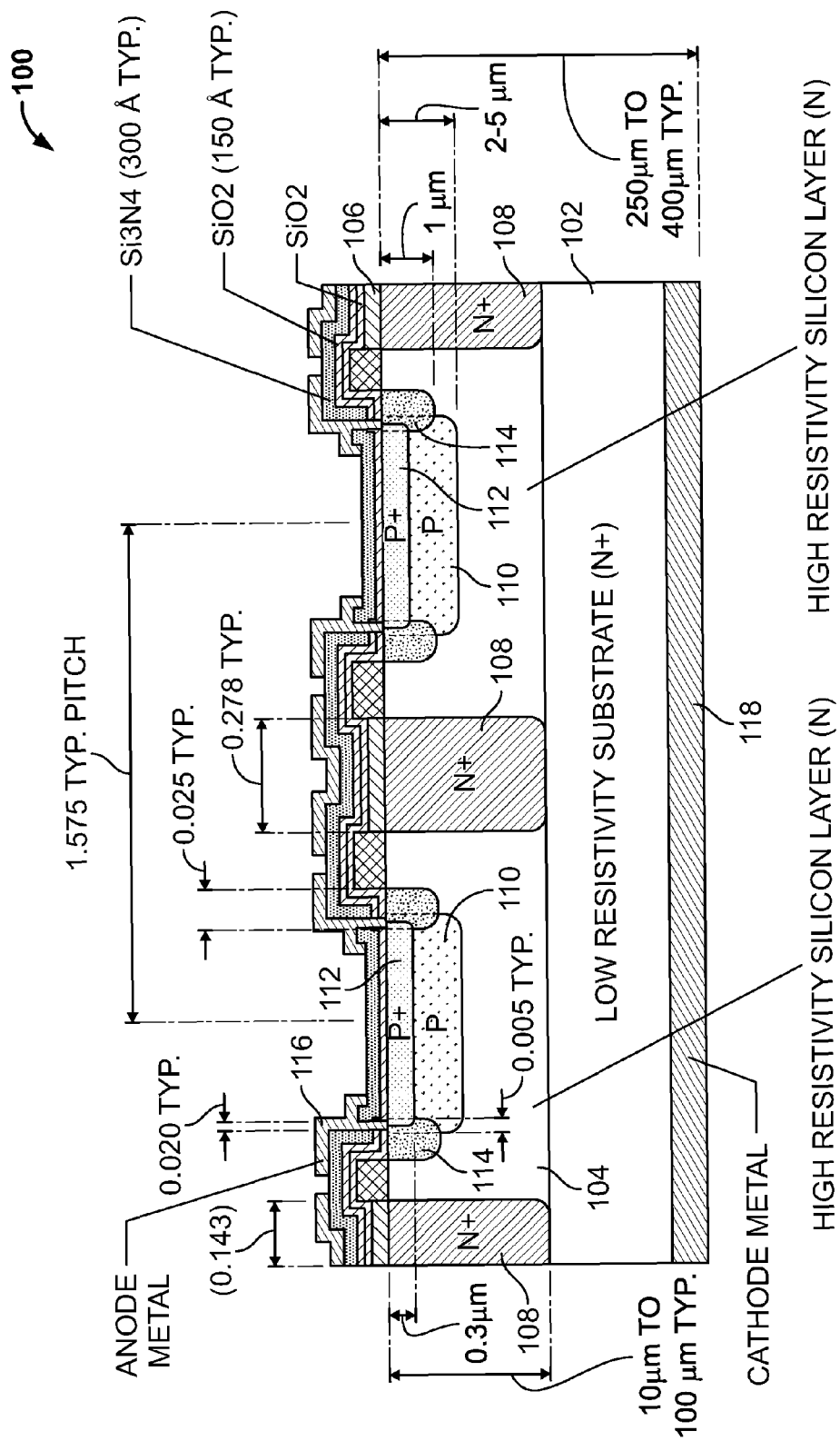
FIG. 1 illustrates a photodiode device, in accordance with an embodiment of the present specification.

The present specification describes a photodiode having improved device characteristics, such as low capacitance, low dark current, improved signal-to-noise ratio, and lower fabrication and manufacturing costs.

In order to improve the ruggedness of the device, especially when scintillator crystals are mounted on the photodiodes, a new structure is provided whereby a lowly doped, deep P-zone is introduced underneath the shallow P+ layer. Thus, the PN junction is moved deep down underneath the silicon-oxide interface yielding photodiodes with increased ruggedness and stability.

While the present specification is described in detail with respect to an individual photodiode element, it should be understood to those of ordinary skill in the art that a plurality of such photodiode elements may be aggregated on a substrate to form a multi-element photodiode array. Further, while the photodiode and photodiode array of present specification is described with respect to p+ diffused active areas on an n-type silicon wafer, it should be noted and understood by those of ordinary skill in the art that the present specification can be designed and manufactured with reverse polarity, and more specifically, n+ diffused active areas on p-type silicon substrate wafers. Thus, the present specification is not limited to the polarity presented herein.

The present specification is directed towards multiple embodiments. The following disclosure is provided in order to enable a person having ordinary skill in the art to practice the invention. Language used in this specification should not be interpreted as a general disavowal of any one specific embodiment or used to limit the claims beyond the meaning of the terms used therein. The general principles defined herein may be applied to other embodiments and applications without departing from the spirit and scope of the invention. Also, the terminology and phraseology used is for the purpose of describing exemplary embodiments and should not be considered limiting. Thus, the present specification is to be accorded the widest scope encompassing numerous alternatives, modifications and equivalents consistent with the principles and features disclosed. For purpose of clarity, details relating to technical material that is known in the technical fields related to the invention have not been described in detail so as not to unnecessarily obscure the present invention.

In one embodiment, the present specification is directed towards a shallow junction photodiode characterized by a doping profile P+ P N N+ used in the detection of short wavelength light such as that employed in CT scanning, X-ray scanning, etc.

A conventional structure of a shallow junction photodiode having a P+ N N+ profile comprises a shallow p+ region. In order to improve the ruggedness of a photodiode, especially when scintillator crystals are mounted on the photodiode, a new structure is provided whereby a lowly doped and deep P-zone is introduced underneath the shallow P+ layer.

The present specification provides a photodiode having improved ruggedness, stability and performance characteristics. The photodiode of the present specification is advantageous in that it provides improved ruggedness for a shallow junction photodiode which is typically used in the detection of short wavelengths of light. By the introduction of a relatively deep, lightly doped P zone underneath the P+ layer of a conventional shallow junction photodiode, the shallow junction (typically 0.3 µm deep) is moved to a deeper junction (on the order of 2-5 µm deep). This causes the improved photodiode to have a higher linear current since the integrated total boron dose of the P+ P layer is higher than the only P+ layer of a conventional shallow junction photodiode. Further, the improved, rugged photodiode of the present specification results in improved yield and reduced cost, since the photodiode is less prone to degradation and/or failure on shunt resistance during assembly of scintillator crystals.

In one embodiment, the improved P+ P N N+ photodiode device of the present specification is front-side illuminated. In one embodiment, the photodiode has bottom contacts only, wherein the anode is on the front side and the cathode is on the back side. In another embodiment, the photodiode has top contacts only, wherein the anode and cathode are on the top side. In yet another embodiment, the photodiode has both top and bottom contacts, wherein the anode is on the front side and the cathode is on both the front side and backside. In the cases where the devices have bottom contacts, a metal is also provided on the backside so that a contact can be made with the cathode on the backside. In one embodiment, the metal employed on the front side is aluminum. In one embodiment, the metal employed on the backside to create contacts is a Cr/Au alloy.

FIG. 1 illustrates a photodiode, in accordance with an embodiment of the present specification. The photodiode 100 comprises substrate wafer starting material further comprising a high resistivity silicon layer 102 on top of a relatively low resistivity wafer 104, which, in one embodiment is a silicon, n-type wafer (n+). In an embodiment, the resistivity of the silicon layer 102 ranges from 10 ohm cm to 10,000 ohm cm and that of the silicon n-type wafer 104 ranges from 0.001 ohm cm to 0.1 ohm cm. In an embodiment, the low resistivity substrate has a thickness in a range of 150 µm to 650 µm, and the high resistivity silicon layer has a thickness in a range of 10 µm to 100 µm. Thus, the overall thickness of the silicon substrate starting material ranges from 250 µm to 750 µm.

The photodiode 100 represents a two element array and further comprises a mask oxide layer 106 deposited on top of the silicon layer 102. The mask oxide layer 106 comprises silicon oxide ($SiO_2$) and/or silicon nitride ($Si_3N_4$), whereby thermal oxidation is employed to achieve the mask oxidation. In one embodiment, the oxide layer 106 comprises $SiO_2$ having a thickness of approximately 8,000 Å. In one embodiment the $SiO_2$ layer defines a top surface of the photodiode 100.

The photodiode also comprises three n+ diffused zones 108 below the top surface of the photodiode 100 and positioned within the high resistivity silicon layer 102, on an extreme right edge and an extreme left edge, as well as in the center of the photodiode 100.

In multi-element photodiode arrays, crosstalk occurs as carriers generated in one element migrate to adjacent elements and cause crosstalk. The n+ diffused zones 108 function like a barrier, reflecting minority carriers and thus, do not let the minority carriers migrate to adjacent elements. In order to have a maximum blocking effect, the n+ diffused zones 108 need to extend to the low resistivity substrate layer 102, however, since there is a tradeoff with long diffusion time and cost, in an embodiment, while n+ diffused zones 108 are made deep, they do not extend all the way to the low resistivity substrate layer 102. In another embodiment, the three n+ diffused zones 108 are separated from each other and each n+ zone has a thickness extending through the entire depth of the low resistivity silicon layer 102.

The photodiode 100 further comprises two p diffused regions 110 positioned within the high resistivity silicon layer 102 as illustrated in FIG. 1. In an embodiment, the p diffused regions 110 have a thickness of approximately 2-5 μm. Also, in an embodiment, each p diffused region 110 is positioned between two n+ diffused regions 108. The photodiode 100 further comprises two shallow p+ diffused zones or regions 112 positioned within the high resistivity silicon layer 102 and directly on top of the p diffused regions 110 and below the top layer of the photodiode as illustrated in FIG. 1. In an embodiment, the depth of the shallow p+ zones 112 is approximately 0.3 μm.

In an embodiment, the p+ diffused zones 112 and a portion of the p doped zones is surrounded by p+ doped rings 114.

In one embodiment, as shown in FIGS. 1 and 19-21, the photodiode 100 further comprises anodes 116 on the top surface of the photodiode and a cathode 118 on a backside of the photodiode 100.

Figure 13:
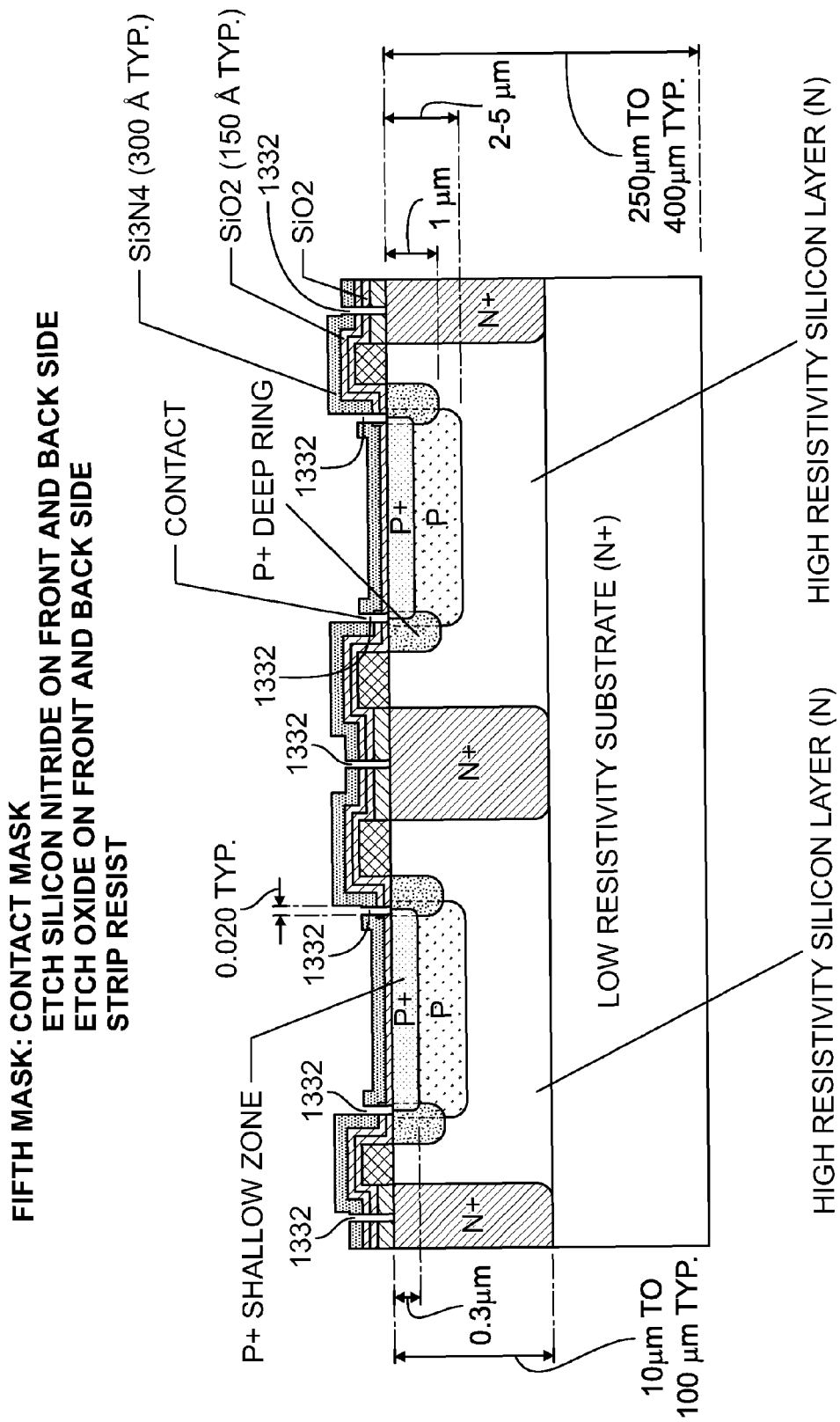
FIG. 13 is a cross-sectional view of the wafer shown in FIG. 12, illustrating a manufacturing step for a photodiode having both top and bottom contact devices whereby the wafer is subjected to an etching process, in one embodiment of the manufacture of the photodiode of the present specification.
Figure 14:
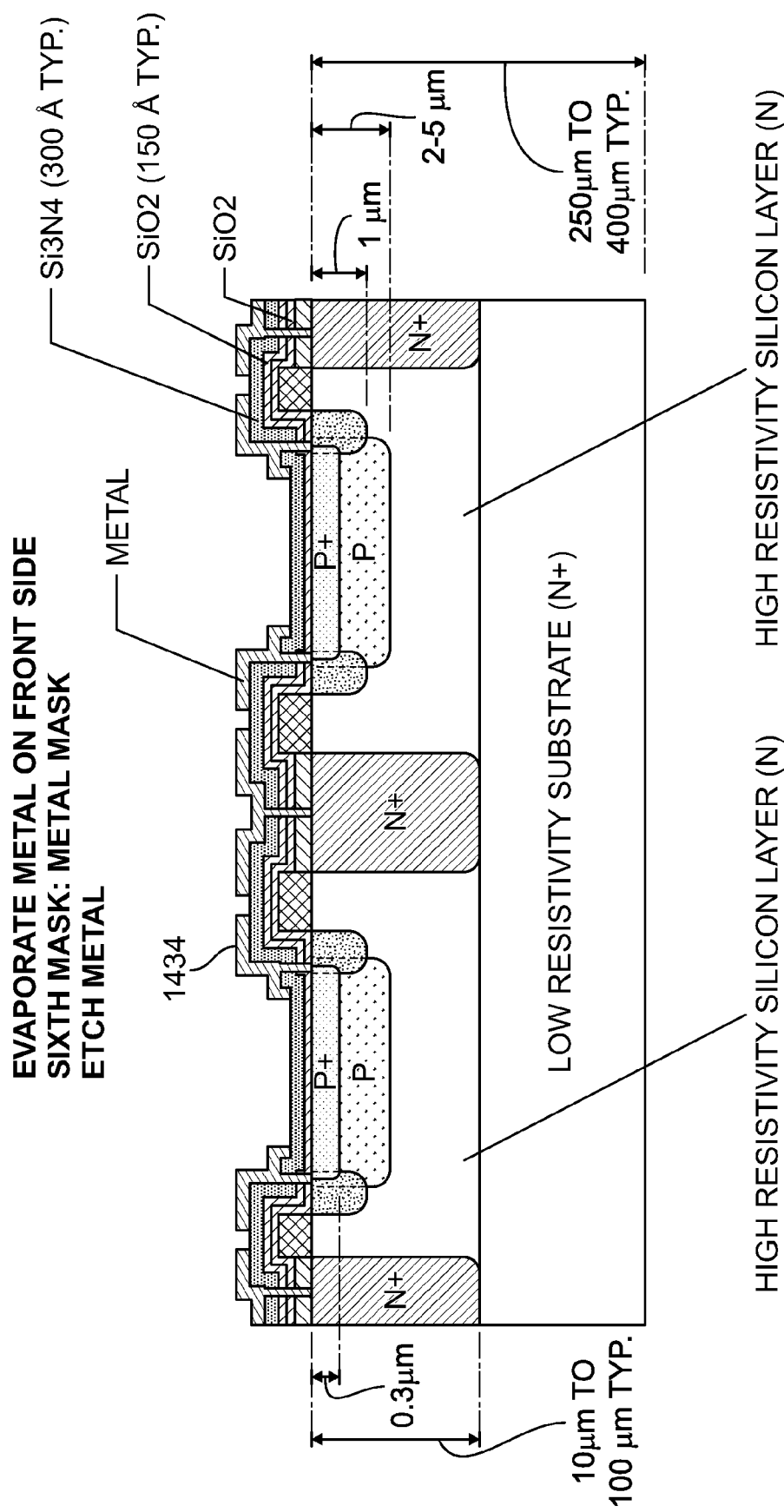
FIG. 14 is a cross-sectional view of the wafer shown in FIG. 13, illustrating a manufacturing step for a photodiode having both top and bottom contact devices whereby the wafer is subjected to a metal masking process, in one embodiment of the manufacture of the photodiode of the present specification.
Figure 15:
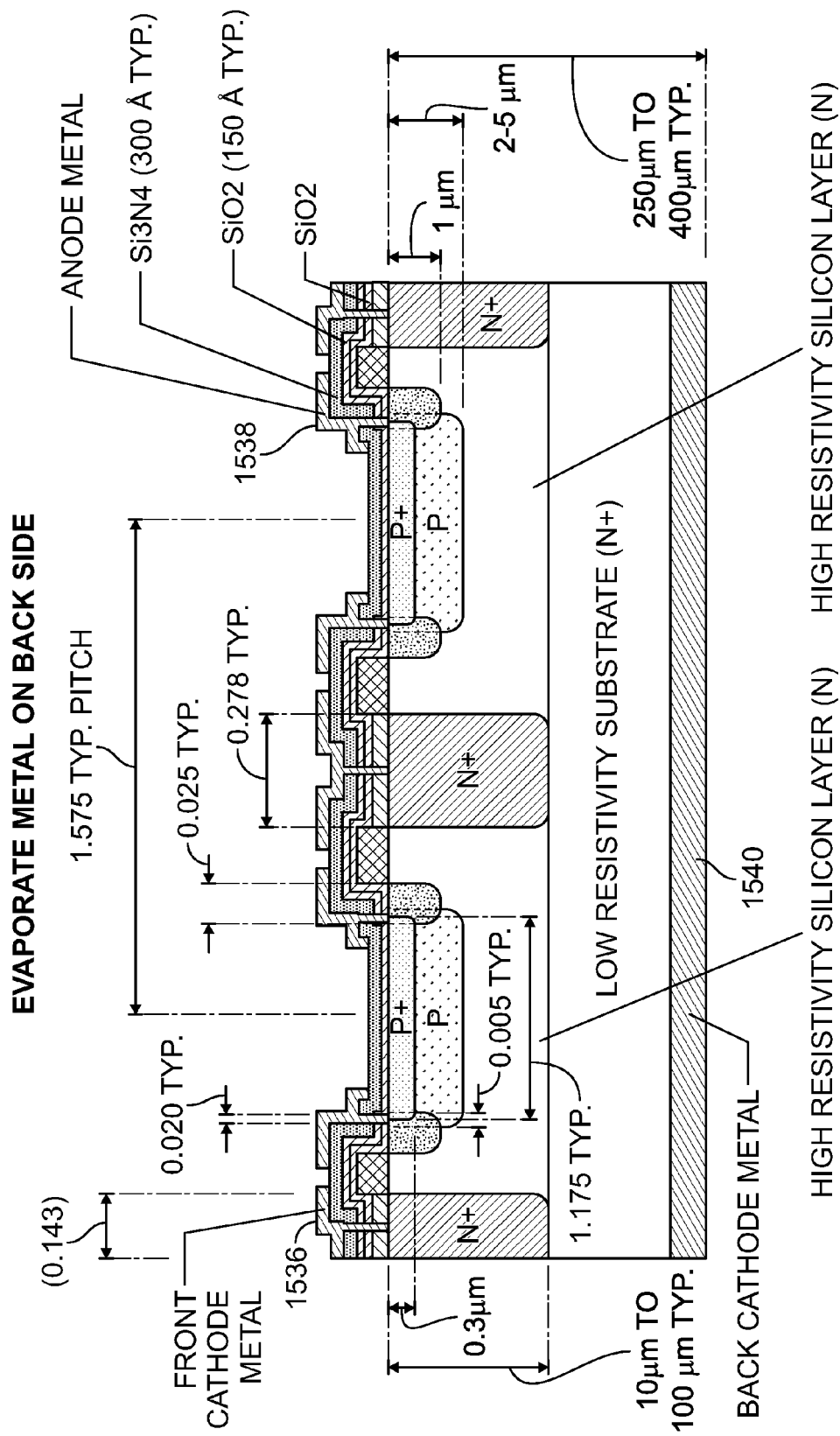
FIG. 15 is a cross-sectional view of the wafer shown in FIG. 14, illustrating manufacturing step for a photodiode having both top and bottom contact devices whereby the wafer is subjected to an additional metal masking process, in one embodiment of the manufacture of the photodiode of the present specification.

In another embodiment, the photodiode 100 comprises an anode on the top surface of the photodiode, a cathode on the top surface of the photodiode, and a cathode on a backside of the photodiode, as illustrated and described in greater detail with respect to FIGS. 13-15.

Figure 16:
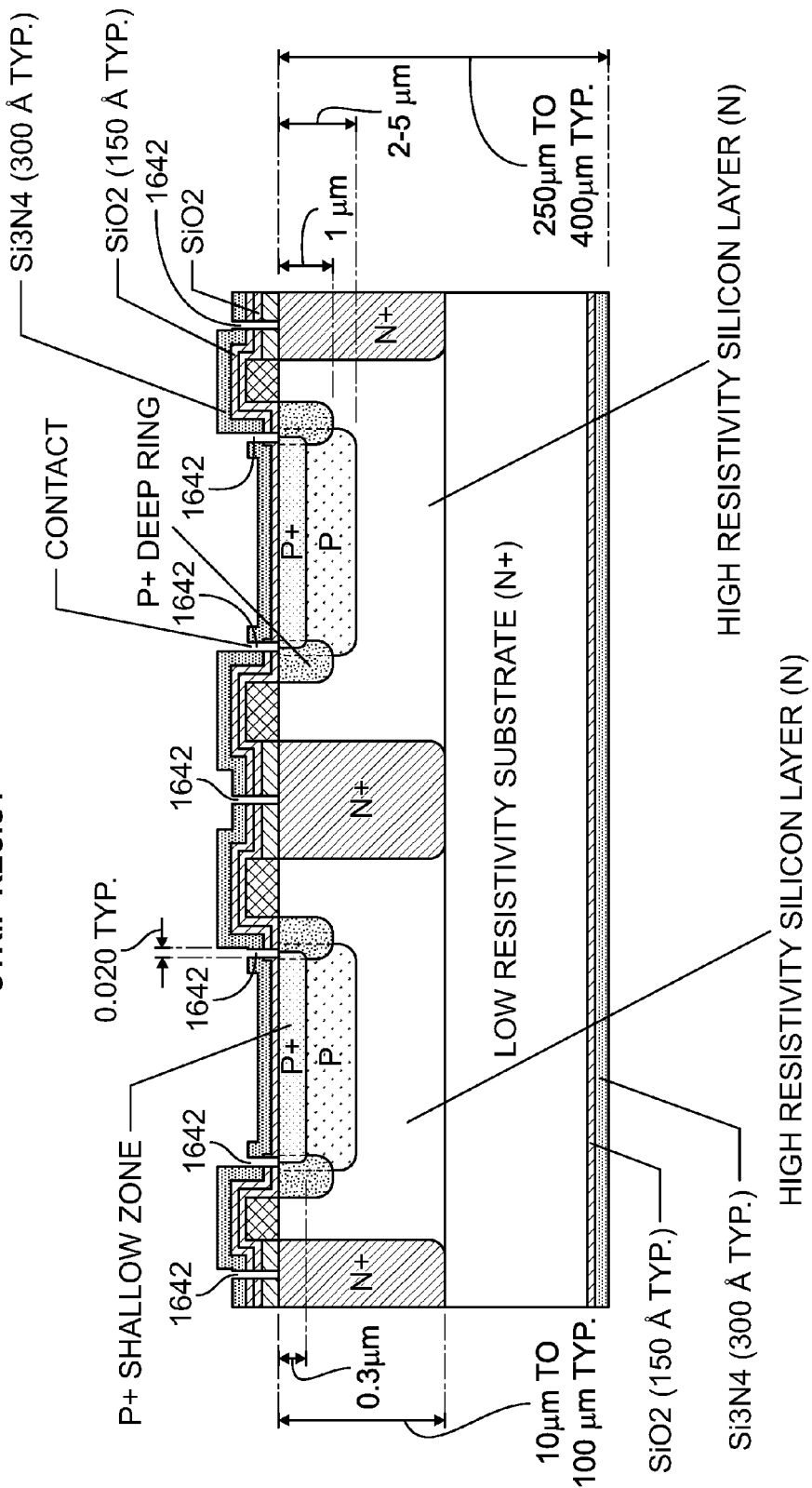
FIG. 16 is a cross-sectional view of the wafer shown in FIG. 12, illustrating a manufacturing step for a photodiode having top contacts only whereby the wafer is subjected to an etching process, in one embodiment of the manufacture of the photodiode of the present specification.
Figure 17:
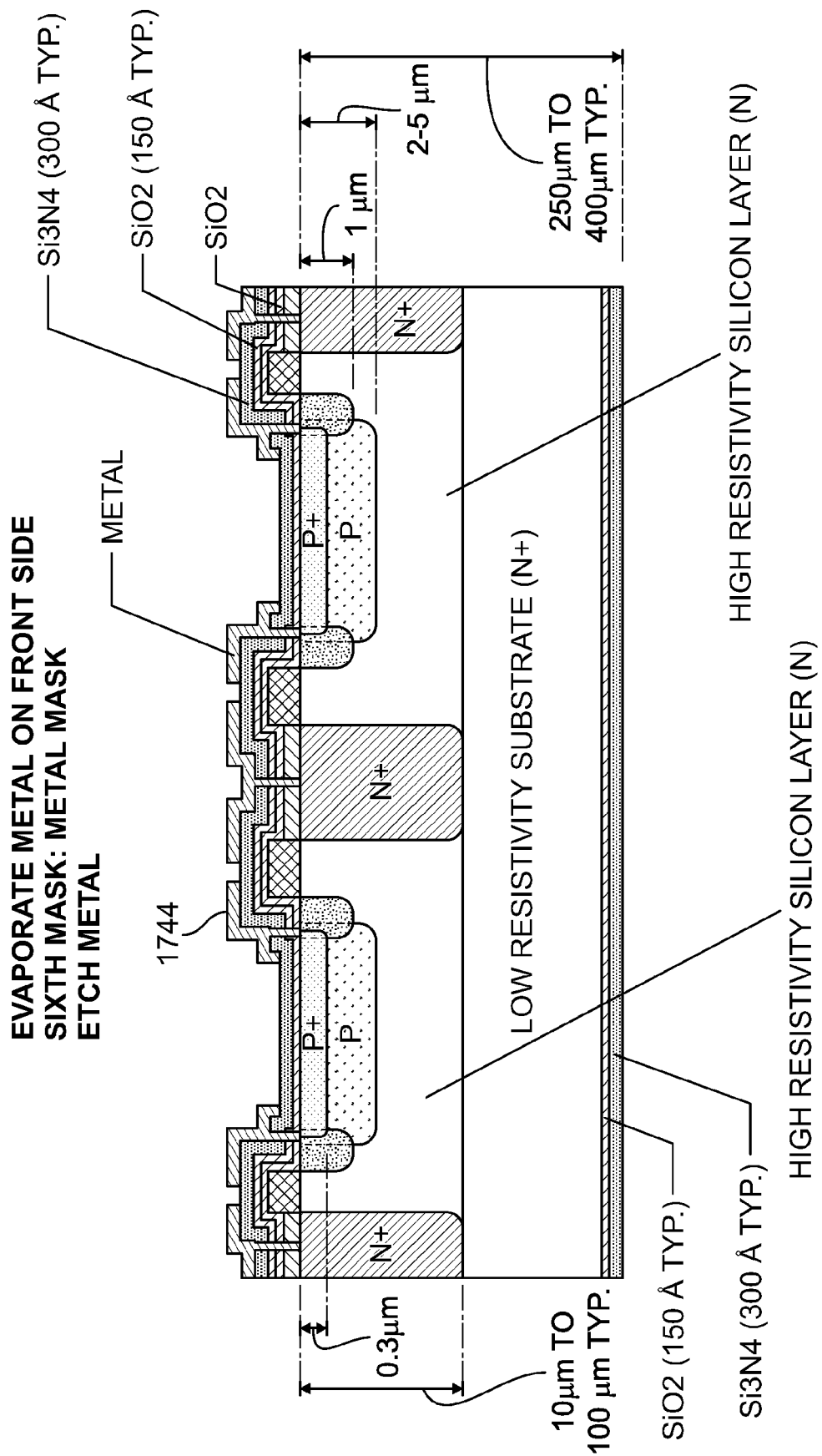
FIG. 17 is a cross-sectional view of the wafer shown in FIG. 16, illustrating a manufacturing step for a photodiode having top contacts only whereby the wafer is subjected to a metal masking process, in one embodiment of the manufacture of the photodiode of the present specification.
Figure 18:
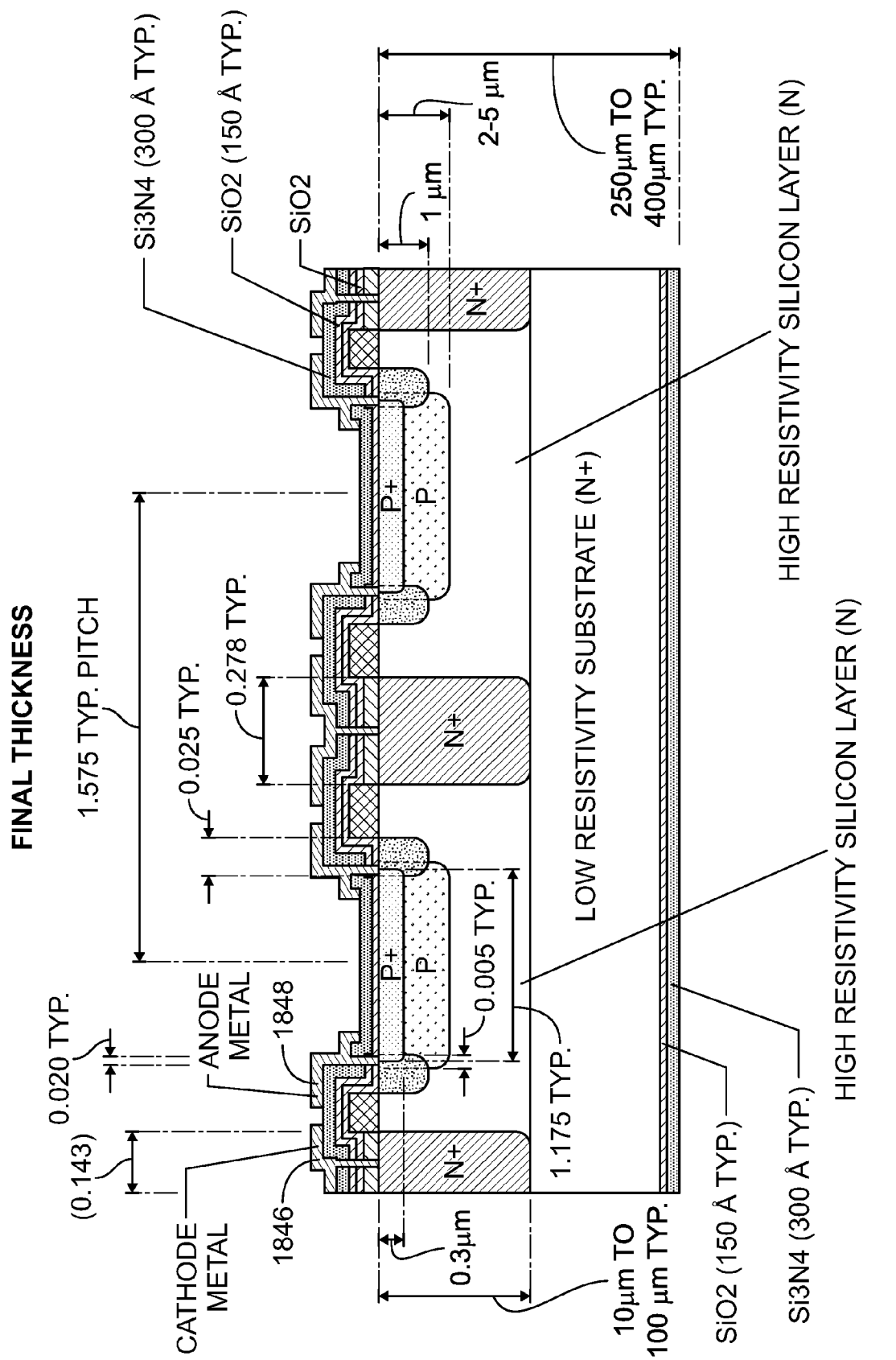
FIG. 18 is a cross-sectional view of the wafer shown in FIG. 17, illustrating a manufacturing step for a photodiode having top contacts only whereby the wafer is subjected to an additional metal masking process, in one embodiment of the manufacture of the photodiode of the present specification.

In yet another embodiment, the photodiode 100 comprises anodes and a cathode on the top surface of the photodiode, as is illustrated and described in greater detail with respect to FIGS. 16-18.

FIGS. 2 through 21 depict cross-sectional views of exemplary manufacturing steps of the photodiode of the present specification.

Figure 2:
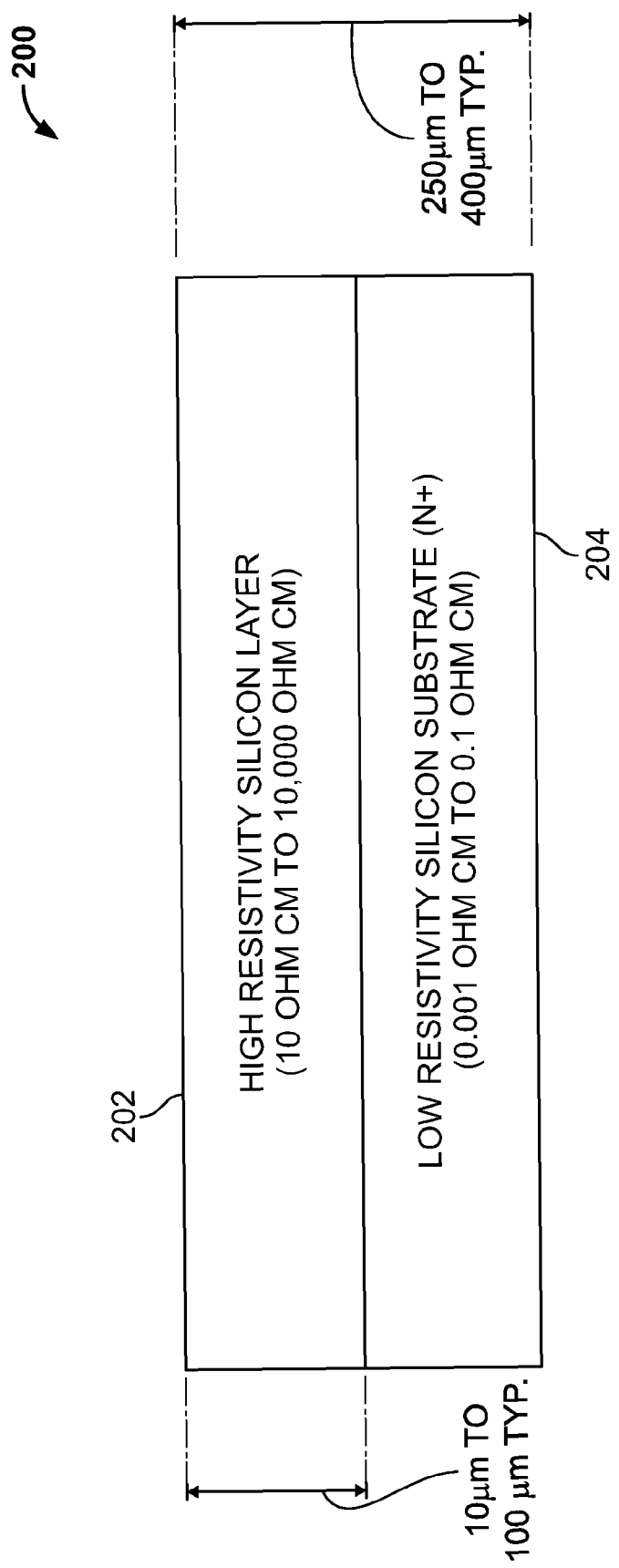
FIG. 2 illustrates a cross-sectional view of a substrate wafer used as a starting material in one embodiment of the manufacture of the photodiode of the present specification.

Referring now to FIG. 2, the starting material of the photodiode is a device wafer 200 comprising a high resistivity silicon layer 202 on top of a relatively low resistivity wafer 204, which, in one embodiment, is a silicon, n-type wafer. In an embodiment, the resistivity of the silicon layer 202 ranges from 10 ohm cm to 10,000 ohm cm and that of the silicon n type wafer 204 ranges from 0.001 ohm cm to 0.1 ohm cm. In an embodiment, the device wafer 200 has an overall thickness ranging from 250-750 μm and the silicon layer 202 has a thickness ranging from 10-100 μm. While it is preferred that the device wafer 200 be comprised of silicon, one of ordinary skill in the art would appreciate that any suitable semiconductor material, which can be processed in accordance with the manufacturing steps of the present specification, may be used. It should be understood by those of ordinary skill in the art, however, that the above specifications are not binding and that the type of material and resistivity can easily be changed to suit the design, fabrication, and functional requirements of the present specification.

Figure 3:
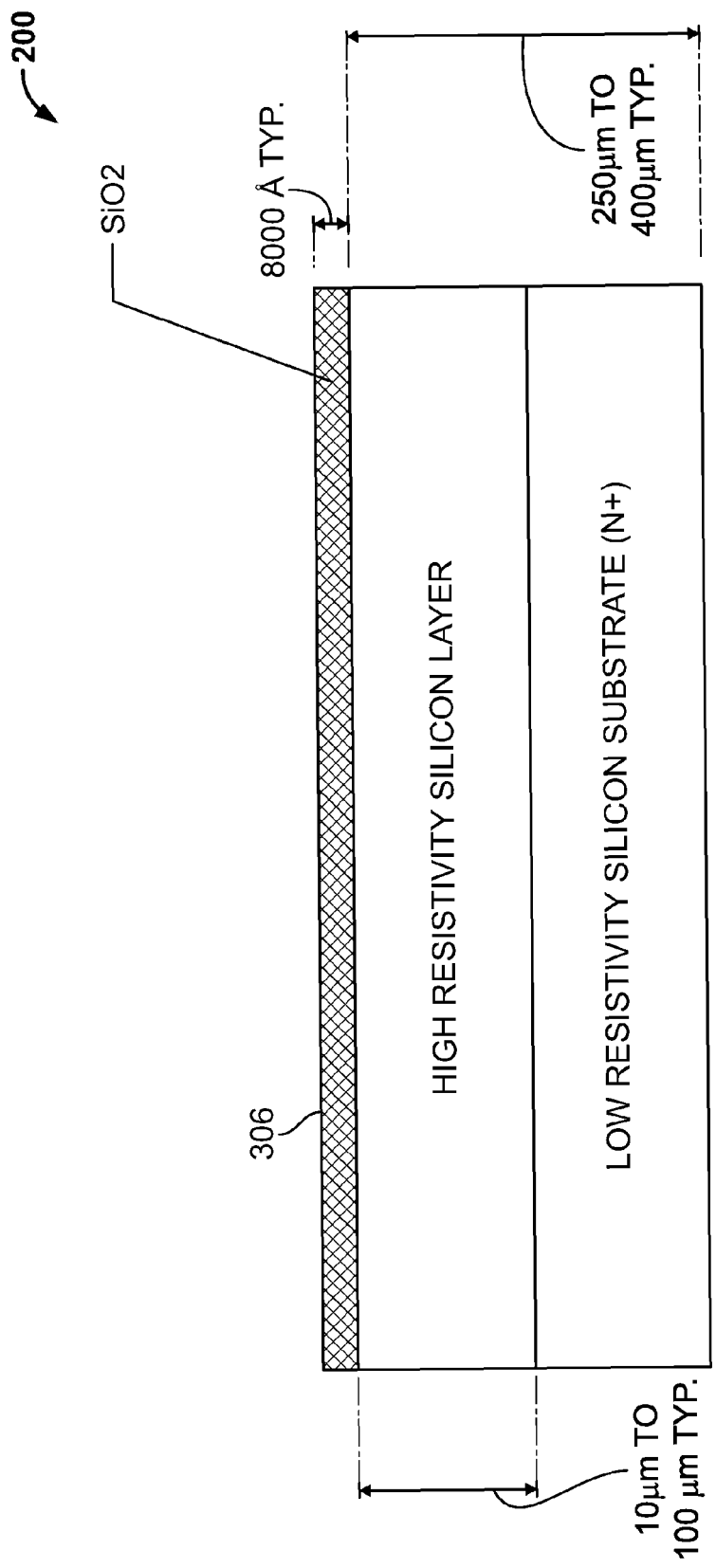
FIG. 3 illustrates a cross-sectional view of the wafer shown in FIG. 2, after a mask oxidation process step, in one embodiment of the manufacture of the photodiode of the present specification.

Referring to FIG. 3, the silicon layer 202 is subjected to a standard mask oxidation process for growing a mask oxide layer 306 on the silicon layer 202. In one embodiment, the mask oxide layer 306 comprises silicon oxide ($SiO_2$) and/or silicon nitride ($Si_3N_4$), and thermal oxidation is employed to achieve mask oxidation. In one embodiment, the oxide layer 306 comprises $SiO_2$ having a thickness of approximately 8,000 Å. Standard mask oxidation is well known to those of ordinary skill in the art and will not be described in further detail herein.

Figure 4:
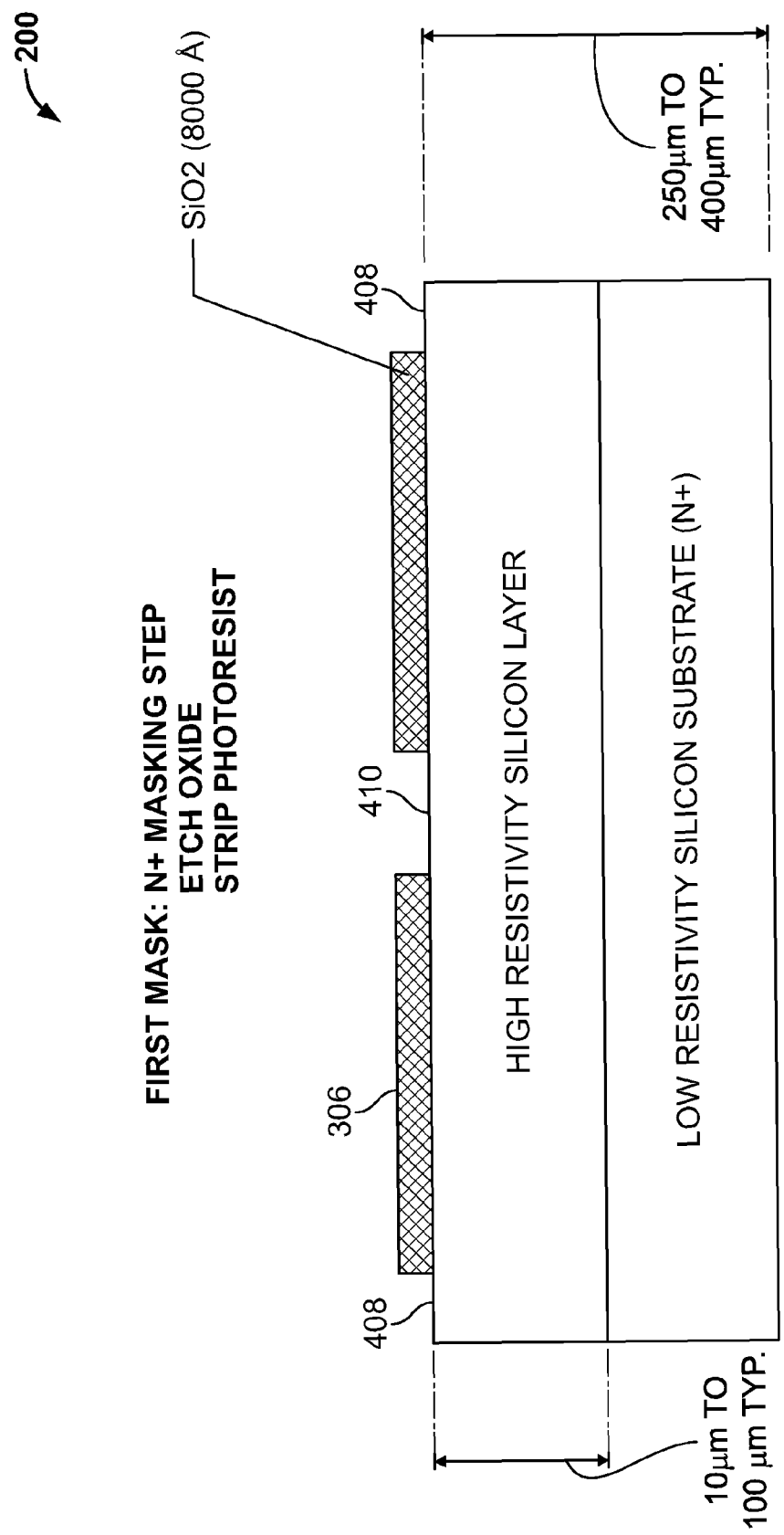
FIG. 4 illustrates a cross-sectional view of the wafer shown in FIG. 3, after a n+ photolithography process step, in one embodiment of the manufacture of the photodiode of the present specification.

As shown in FIG. 4, after the standard mask oxidation is complete, the device wafer 200 is subjected to n+ photolithography. After selecting a suitable material and creating a suitable photoresist pattern, a thin photoresist layer is applied to the front and back side of device wafer 200 to etch the pattern on the surfaces of the wafer. Generally, the photoresist layer is a photosensitive polymeric material for photolithography and photoengraving that can form a patterned coating on a surface. In one embodiment, the photoresist layer is applied via a spin coating technique. Spin coating is well known to those of ordinary skill in the art and will not be described in detail herein.

Next, the photoresist-coated device wafer 200 is aligned with an n+ mask. N+ masking techniques are employed to protect portions of device wafer 200. Generally, photographic masks are high precision plates containing microscopic images of preferred pattern or electronic circuits. They are typically fabricated from flat pieces of quartz or glass with a layer of chrome on one side. The mask geometry is etched in the chrome layer. In one embodiment, the n+ mask comprises a plurality of diffusion windows with appropriate geometrical and dimensional specifications. The n+ mask allows selective irradiation of the photoresist on the device wafer. Regions that are exposed to radiation are removed while those that are protected from diffusion remain shielded by the n+ mask.

An intense light, such as UV light, is projected through the mask, exposing portions of the photoresist layer in the pattern of the n+ mask. The exposed and remaining photoresist is then subjected to a suitable chemical or plasma etching process to reveal the pattern transfer from the mask to the photoresist layer. In one embodiment, the device wafer 200 is subjected to oxide etching to remove portions 408, 410 of the silicon dioxide layer 306.

Figure 5:
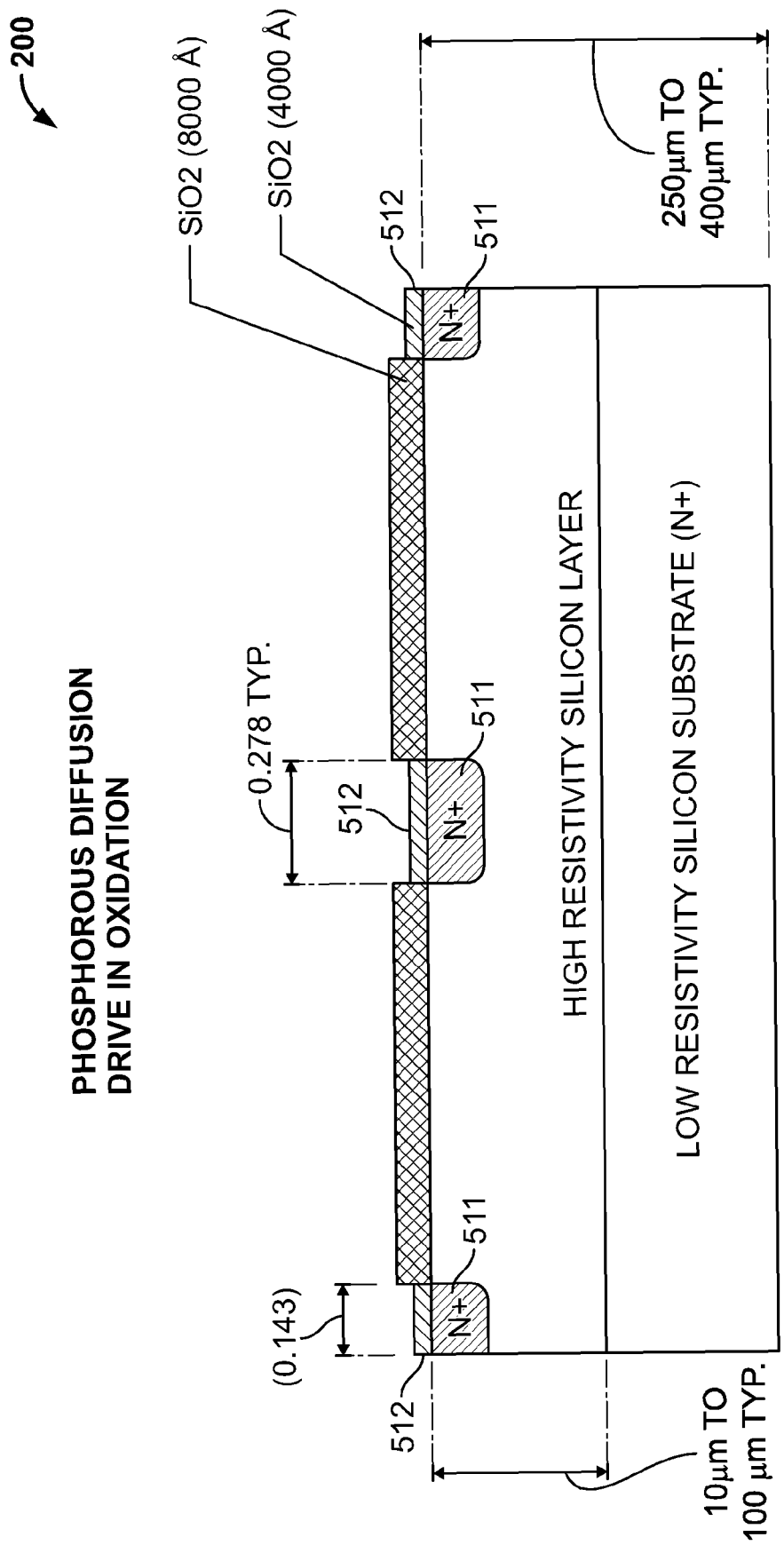
FIG. 5 illustrates a cross-sectional view of the wafer shown in FIG. 4, after a n+ diffusion process step, in one embodiment of the manufacture of the photodiode of the present specification.

Next as shown in FIG. 5 the device wafer 200 is subjected to n+ diffusion followed by drive-in oxidation after the previous n+ masking and etching steps. Generally, diffusion facilitates propagation of a diffusing material through a host material. An appropriate amount of dopant atoms, such as phosphorous, is deposited onto the device wafer 200 and fills the gaps left by the removed photoresist layer. Then, the wafer 200 is subjected to a drive-in oxidation process that is used to redistribute the dopant atoms and deposit them deeper into the wafer. In one embodiment, this process fills the regions 408, 410, via deep diffusion, with n+ dopant 511. In an embodiment, the width of the n+ diffused zones ranges from approximately 0.143 to 0.278 μm. In an embodiment, the n+ diffused zones are optional and are not present in the photodiode. The presence of the n+ diffused reduces surface leakage current and crosstalk, but will increases a furnace processing time. Therefore, inclusion of n+ deep diffused zones is a tradeoff between device performance and processing cost.

Next, the regions 408, 410 are covered with oxide layer 512. In one embodiment, oxide layer 512 has a thickness of approximately 4,000 Å.

Figure 6:
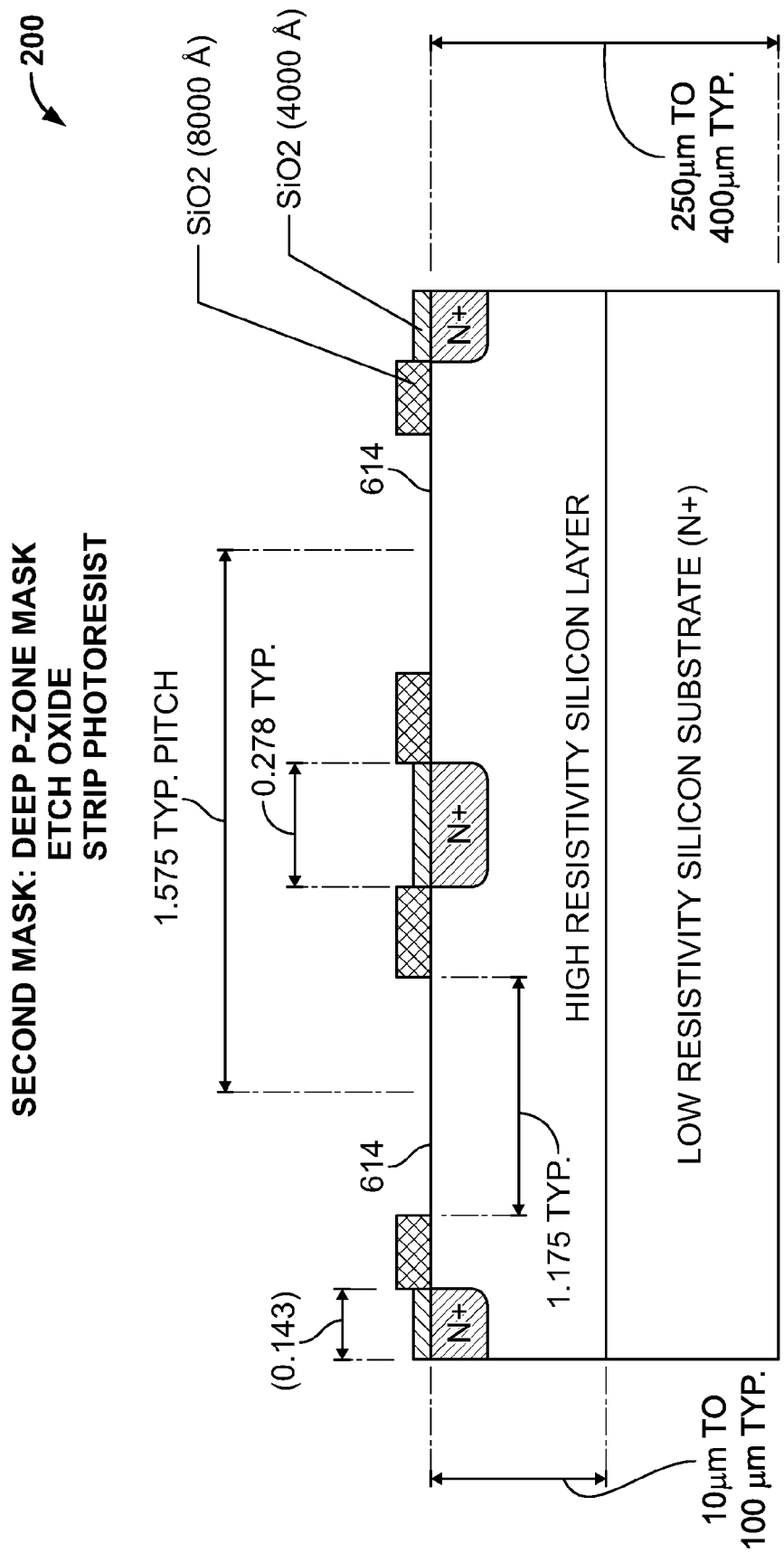
FIG. 6 illustrates a cross-sectional view of the wafer shown in FIG. 5, after an etching and lithography process step, in one embodiment of the manufacture of the photodiode of the present specification.

Next as shown in FIG. 6 device wafer 200 is subjected to a lithography process, creating deep p diffused regions 614. In an embodiment, the exposed silicon surface of region 614 is approximately 1.75 μm wide and is subsequently oxidized. As with any conventional lithography process, p lithography comprises at least the following tasks, but not limited to such tasks: substrate preparation; photoresist application; soft baking; mask alignment; exposure; development; hard backing; and etching. In addition, various other chemical treatments may be performed.

The p masking and diffusion process is similar to that delineated with respect to the n+ masking process described earlier and will not be repeated in detail herein. The p masking process further comprises deposition and deep drive-in oxidation, allowing for predefined and/or predetermined thermal budget in accord with the principles of the present specification.

Figure 7:
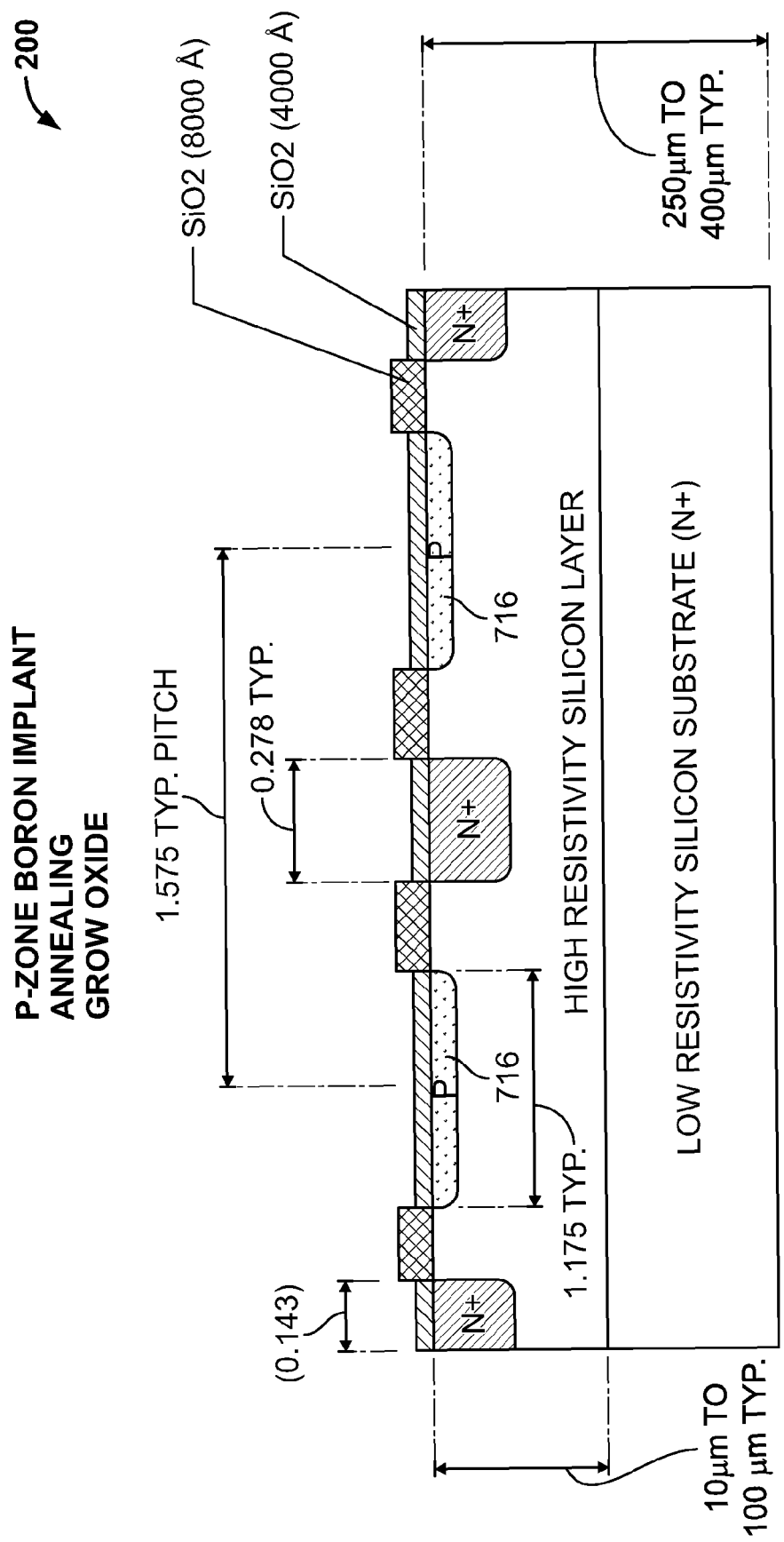
FIG. 7 illustrates a cross-sectional view of the wafer shown in FIG. 6, after a boron implant and annealing process step, in one embodiment of the manufacture of the photodiode of the present specification.

This is followed by boron implant and annealing, as shown in FIG. 7, to form a shallow p active area 716. Next, the regions 716 are covered with an oxide layer.

Figure 8:
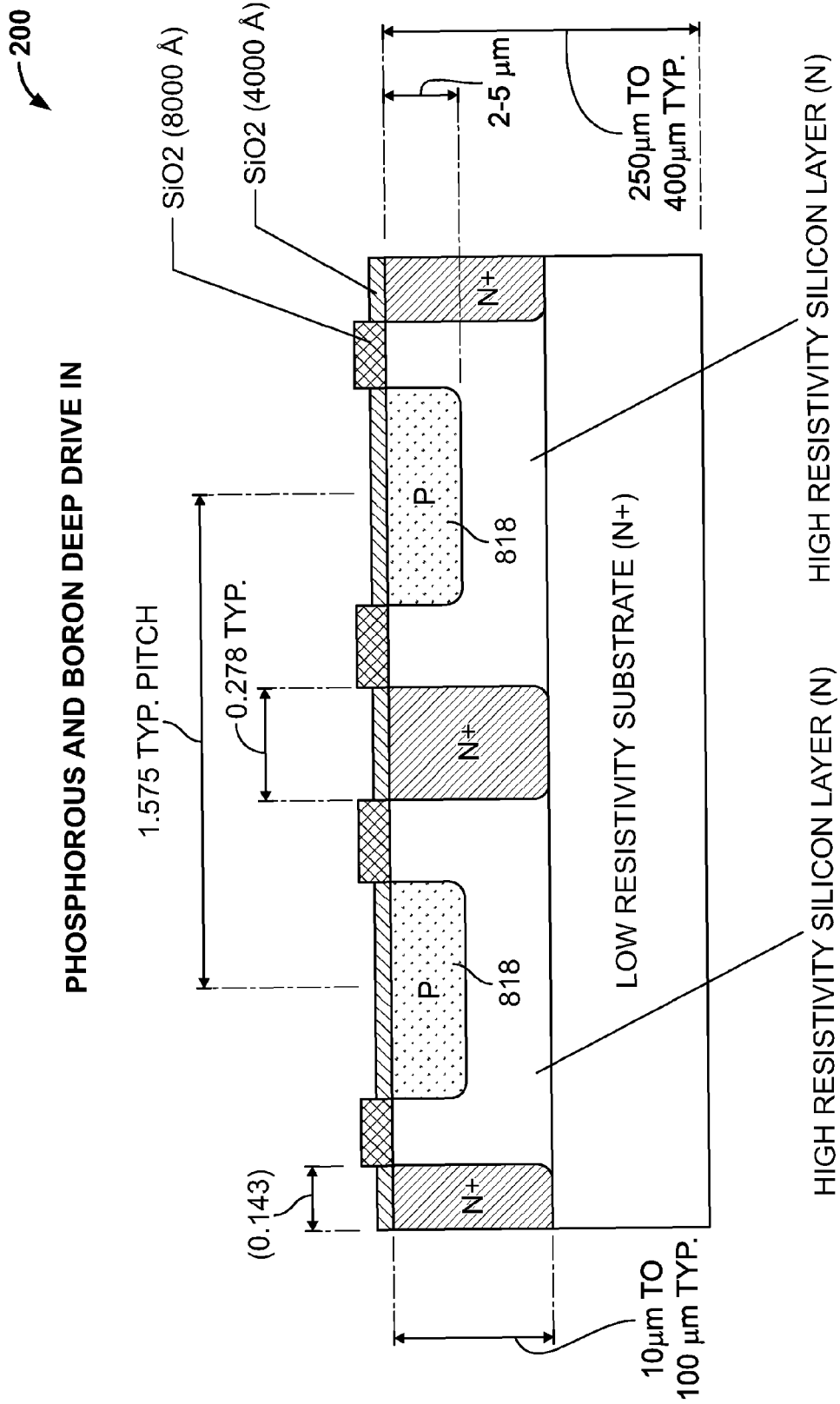
FIG. 8 illustrates a cross-sectional view of the wafer shown in FIG. 7, after a p diffusion process step, in one embodiment of the manufacture of the photodiode of the present specification.

Next, as shown in FIG. 8 device wafer 200 is subjected to p diffusion followed by drive-in oxidation after the previous p masking and etching steps. An appropriate amount of dopant atoms, such as phosphorous, is deposited onto the substrate wafer and fills the gaps left by the removed photoresist layer. Then, the wafer 200 is subjected to a drive-in oxidation process that is used to redistribute the dopant atoms and deposit them deeper into the wafer creating deep p active areas 818. In an embodiment, the depth of the p type dopant ranges between 2 to 5 μm.

Figure 9:
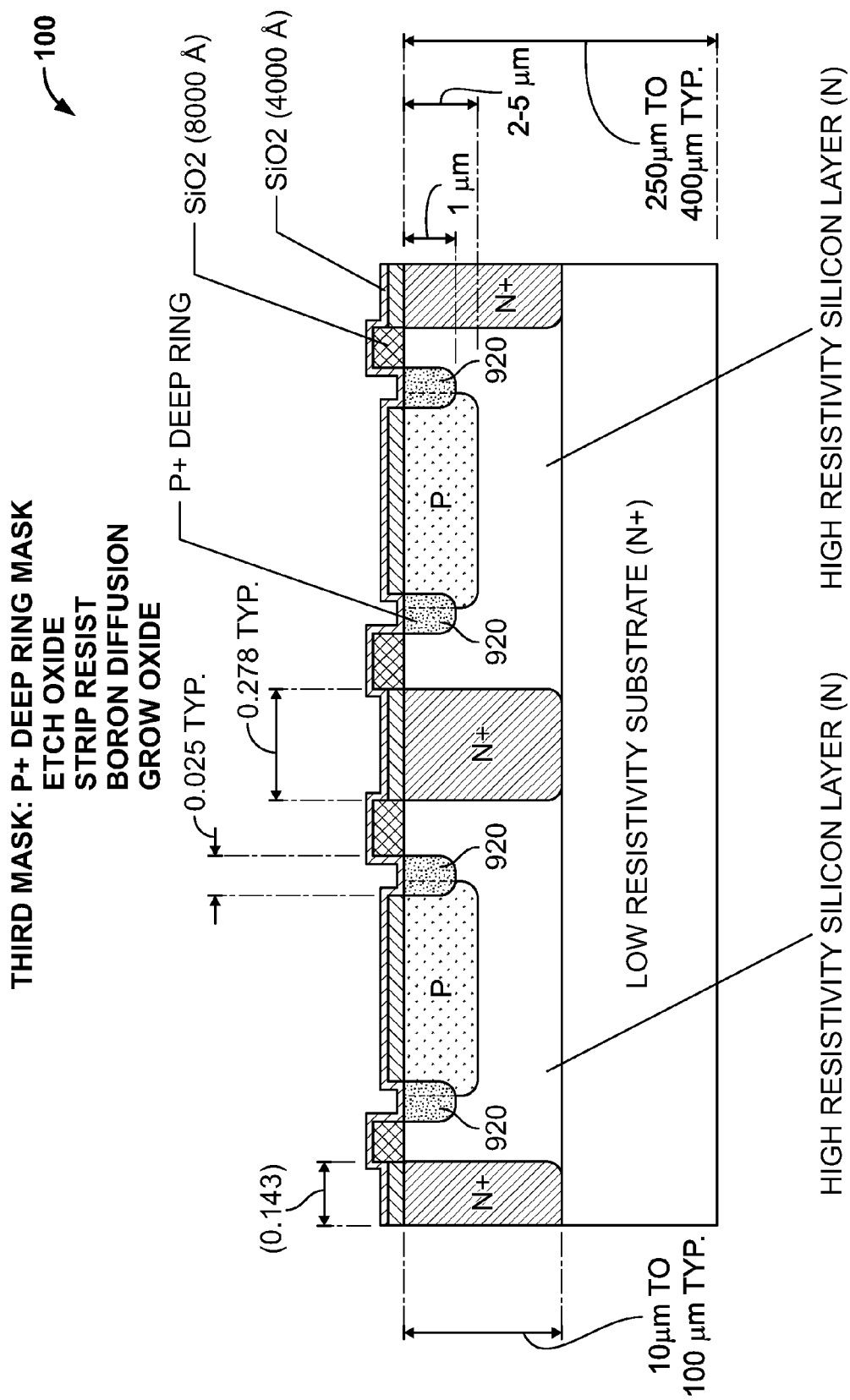
FIG. 9 illustrates a cross-sectional view of the wafer shown in FIG. 8, after an etching and deep ring p+ masking process step, in one embodiment of the manufacture of the photodiode of the present specification.

FIG. 9 illustrates the step of subjecting the device wafer 200 to etching and deep ring p+ masking process in order to create p+ deep ring zones 920, which are then covered with an oxide layer. The p+ deep ring zones 920 are created in order to ensure that the contact metal will not punch through the junction and degrade the dark current. In an embodiment, the photodiode of the present invention does not include p+ deep ring zones 920, described in greater detail below.

Figure 10:
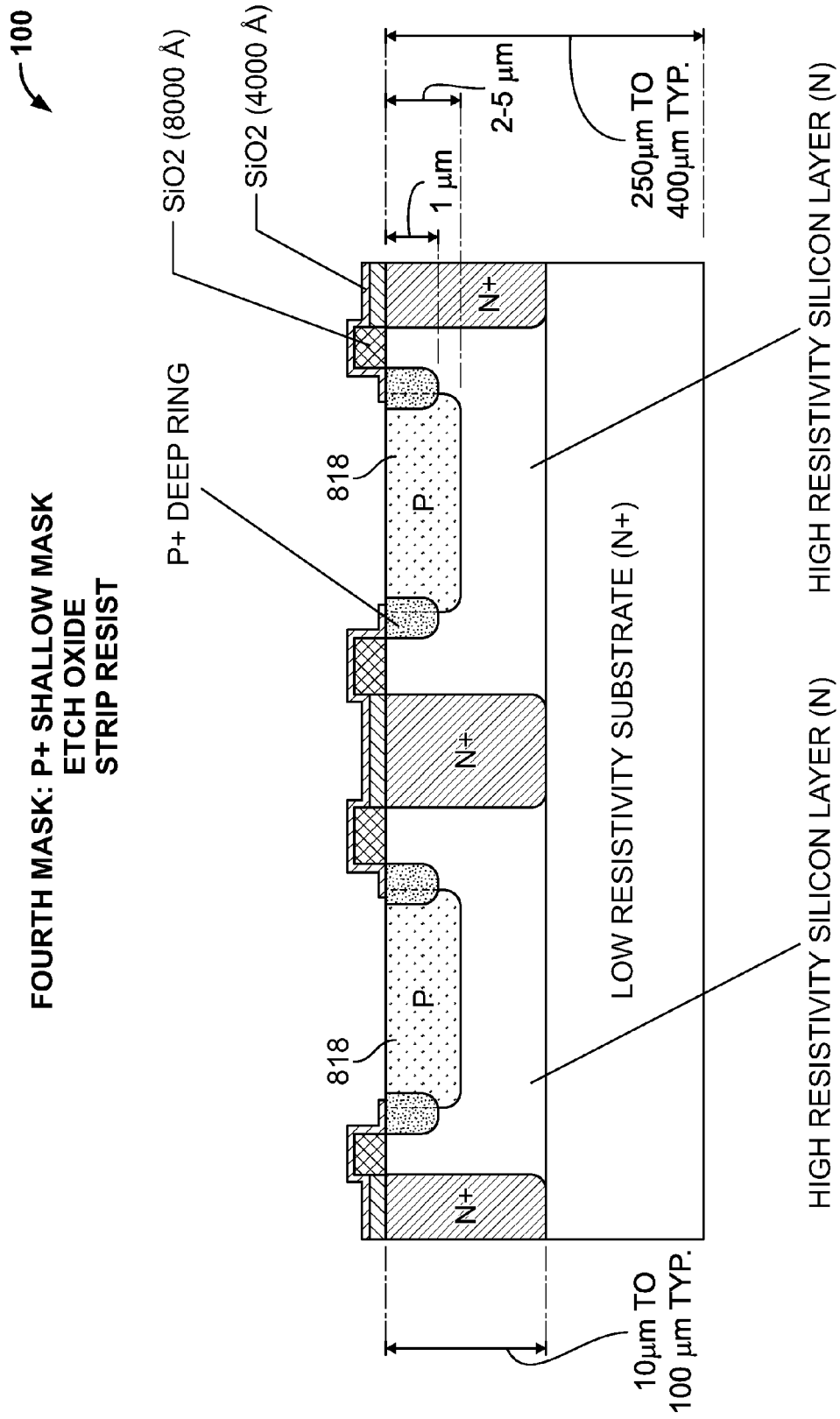
FIG. 10 illustrates a cross-sectional view of the wafer shown in FIG. 9, after an etching process step, in one embodiment of the manufacture of the photodiode of the present specification.
Figure 11:
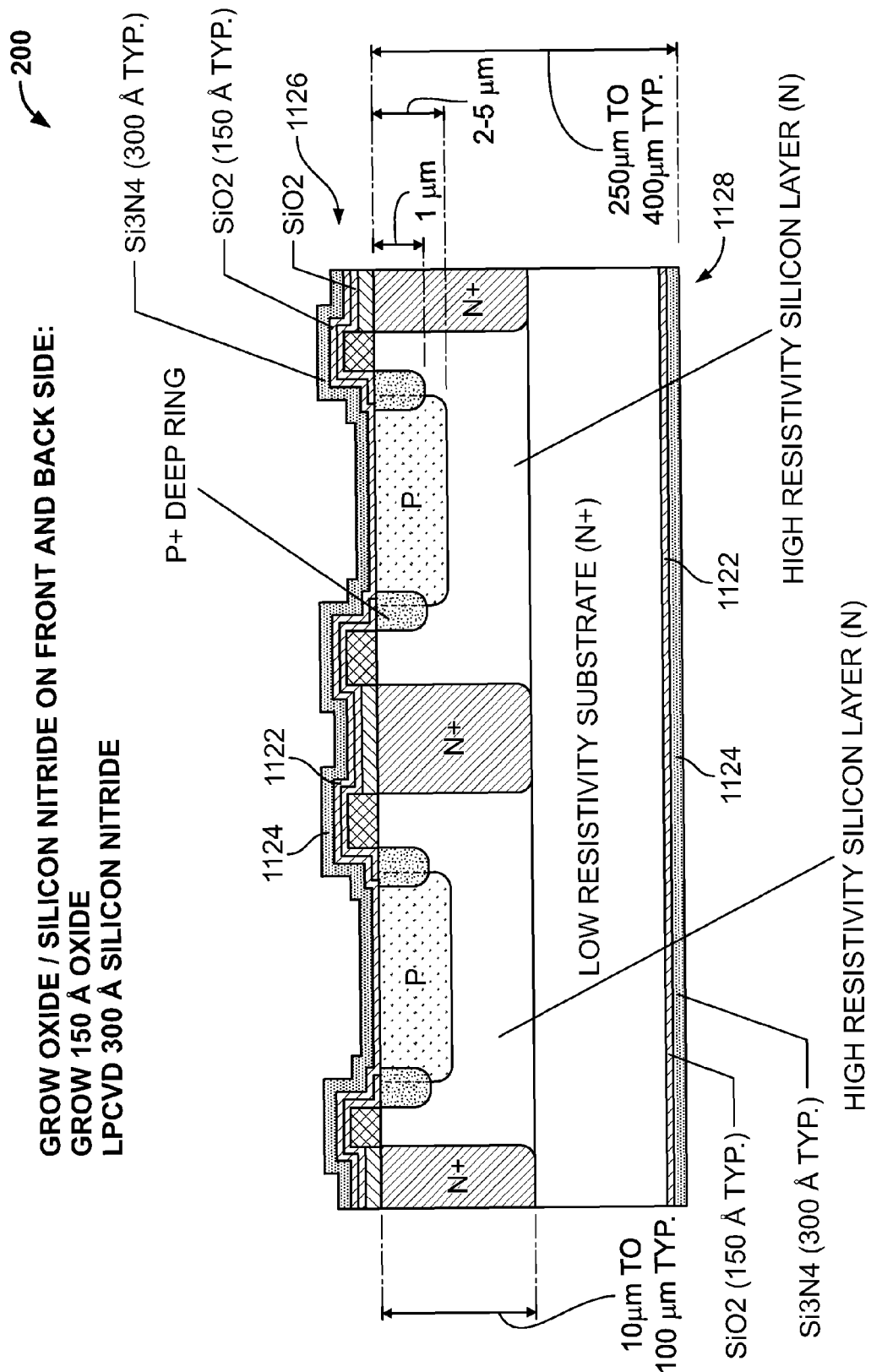
FIG. 11 illustrates a cross-sectional view of the wafer shown in FIG. 10, after a process for growing oxide and nitride layers on a front and backside step, in one embodiment of the manufacture of the photodiode of the present specification.

Next as shown in FIGS. 10 and 11 respectively, oxide layers covering the deep p active areas 818 are etched and layers of oxide such as silicon oxide 1122 and silicon nitride 1124 are grown on a front side 1126 and a backside 1128 of the wafer device 200. In an embodiment, the oxide layer 1122 has a thickness of approximately 150 Å and the nitride layer 1124 has a thickness of approximately 300 Å, forming an anti-reflective layer on the device wafer.

Figure 12:
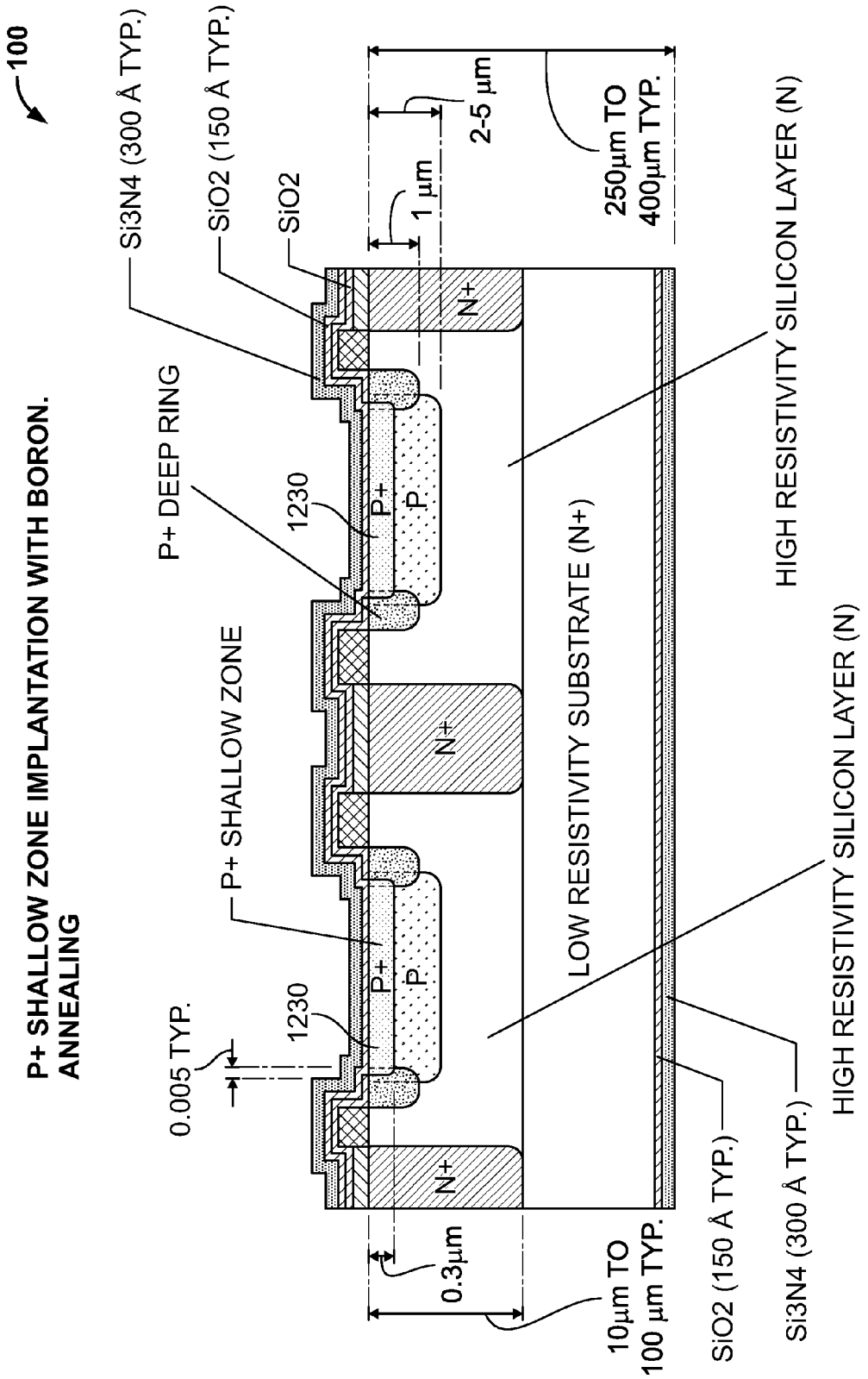
FIG. 12 illustrates a cross-sectional view of the wafer shown in FIG. 11, after a boron implant and annealing process step for forming shallow $p_+$ active areas, in one embodiment of the manufacture of the photodiode of the present specification.

This is followed by boron implant and annealing, as shown in FIG. 12, to form shallow $p_+$active areas 1230. In an embodiment, the depth of the shallow p+ areas 1230 is approximately 0.3 μm. Thus, the PN junction is moved deep down underneath the oxide interface rendering the photodiodes increased ruggedness and stability, because when crystals are mounted on the surface of the silicon photodiode, it increases the likelihood of mechanical abrasion, scratches, etc. introduced on the silicon surface, resulting in degradation.

The improved P+ P N N+ junction photodiode of the present specification is front-side illuminated. The photodiode may be designed as having: top contacts with an anode and a cathode on a front/top side of the wafer device 200, or bottom contact with an anode on a front side and a cathode on a back side of the wafer device 200, or else both top and bottom contact devices with an anode on a front side, and a cathode on both front and back side of the wafer device 200.

FIGS. 13, 14, and 15 illustrate manufacturing steps for designing a photodiode having both top and bottom contact devices with an anode on a front side, and a cathode on both front and back side of the wafer device 200. Once shallow p+ active area 1230 is formed as illustrated in FIG. 12, the wafer device 200 is subjected to a contact masking process. As shown in FIG. 13, the nitride layer 1124 and the oxide layer 1122 are etched away from a front side 1126 and a backside 1128 of the wafer device 200. Contact mask areas 1332 approximately 0.02 μm wide are formed on the front side 1332. Next, as shown in FIGS. 14 and 15, the wafer device 200 is subjected to metal masking. A metal layer 1434 is deposited on the front side 1126 to form a cathode 1536 and an anode 1538 and on the back side to form a cathode 1540. In various embodiments, the metal used for forming the cathode and anode on the front side is aluminum; whereas that used for forming the cathode on the backside is a Cr/Au alloy. In various embodiments, an aluminum/nickel/gold alloy may be used for forming the cathode and anode on the front and backside of the photodiode. In other embodiments, a titanium/palladium/silver alloy may be used for forming the cathode and anode on the front and backside of the photodiode FIGS. 16, 17 and 18 illustrate manufacturing steps for fabricating a photodiode having top contacts with an anode and a cathode on a front/top side of the wafer device 200. Once shallow p+ active area 1230 is formed as illustrated in FIG. 12, the wafer device 200 is subjected to a contact masking process. The nitride layer 1124 and the oxide layer 1122 are etched away from a front side 1332 of the wafer device 200. Referring to FIG. 16, contact mask areas 1642 approximately 0.02 μm wide are formed on the front side 1332. Next as shown in FIGS. 17 and 18, the wafer device 200 is subjected to metal masking. A metal layer 1744 is deposited on the front side 1332 to form a cathode 1846 and an anode 1848. In various embodiments, the metal used for forming the cathode and anode on the front side is aluminum.

Figure 19:
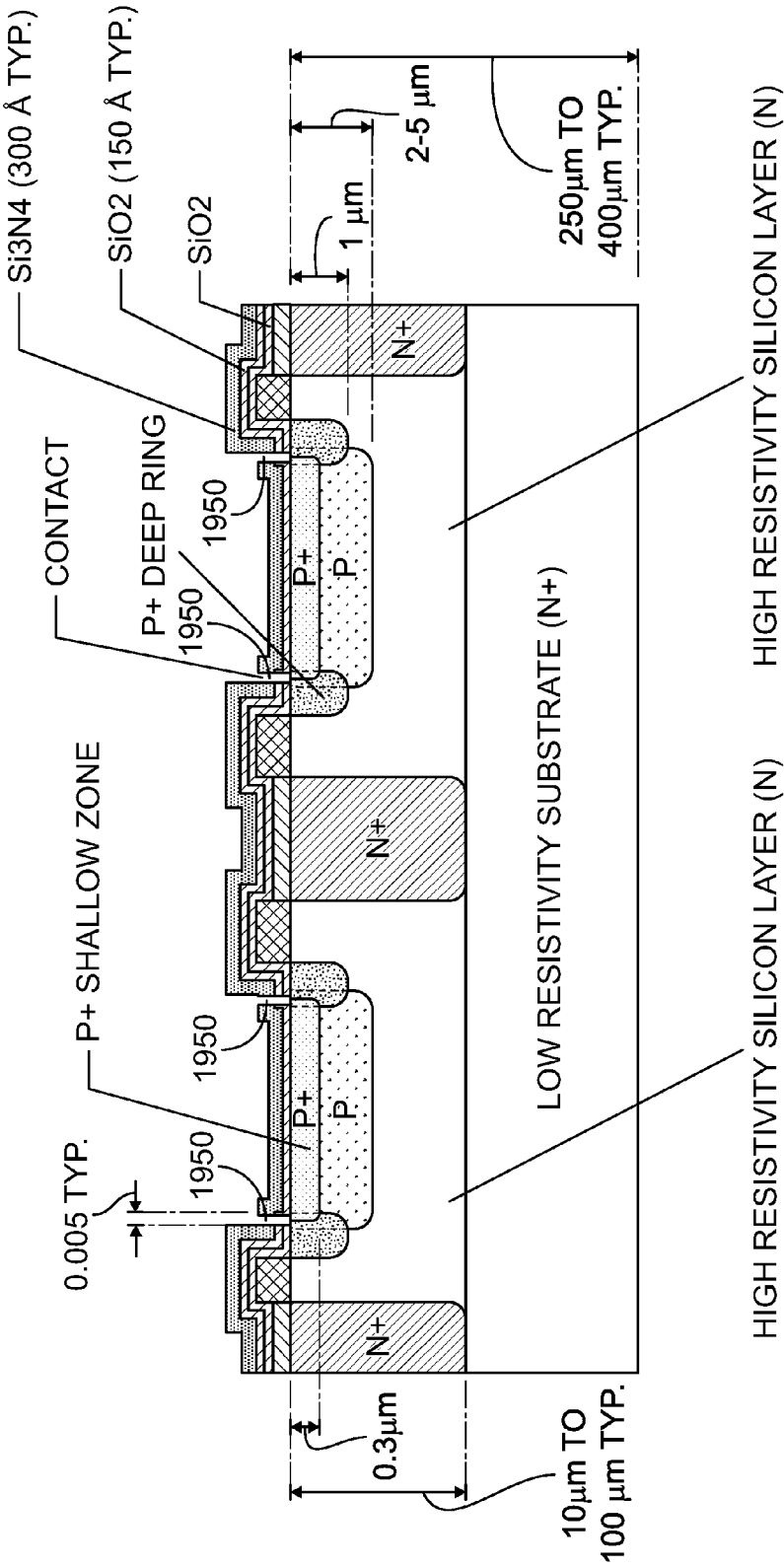
FIG. 19 is a cross-sectional view of the wafer shown in FIG. 12, illustrating a manufacturing step for a photodiode having bottom contacts only whereby the wafer is subjected to an etching process, in one embodiment of the manufacture of the photodiode of the present specification.
Figure 20:
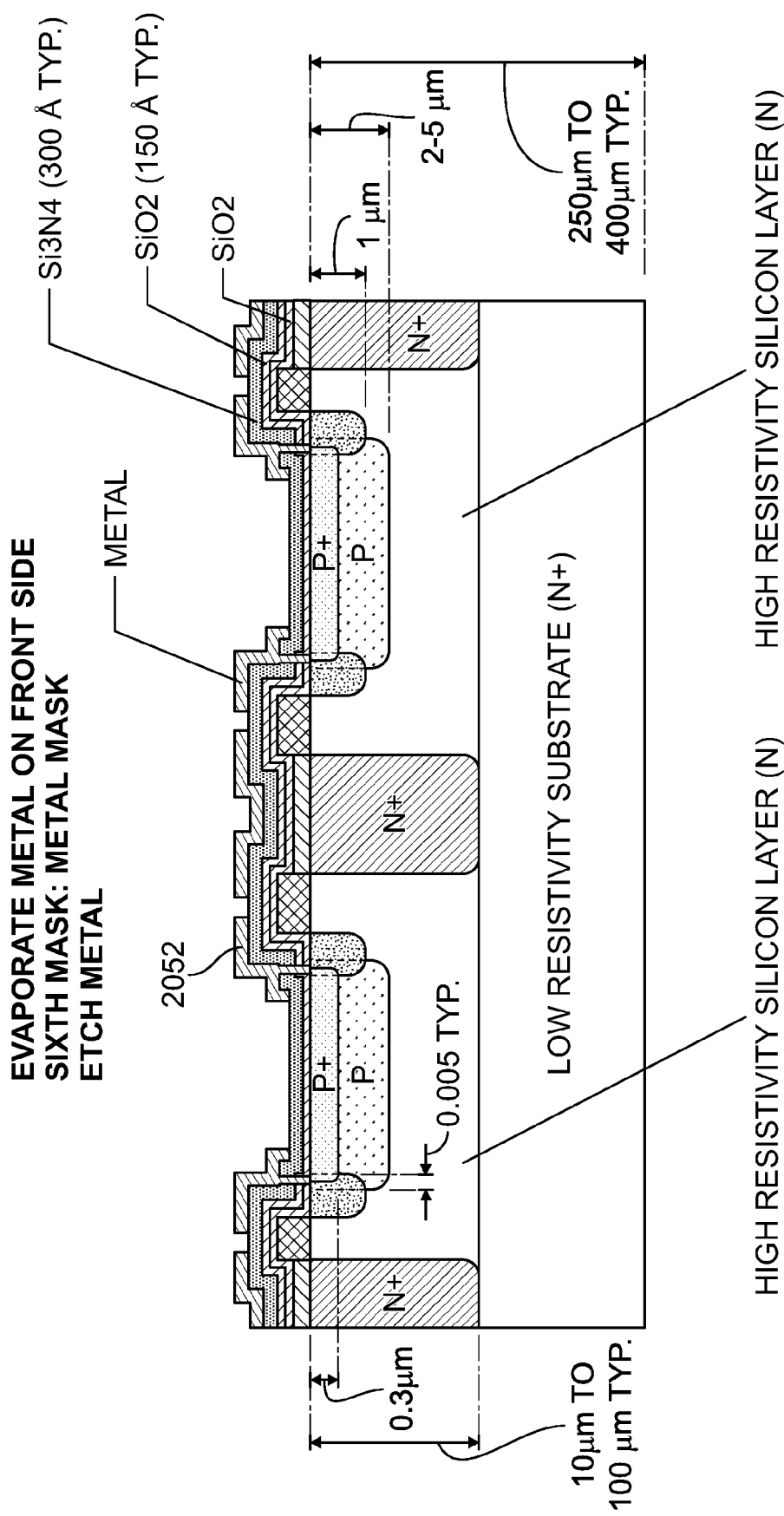
FIG. 20 is a cross-sectional view of the wafer shown in FIG. 19, illustrating a manufacturing step for a photodiode having bottom contacts only whereby the wafer is subjected to a metal masking process, in one embodiment of the manufacture of the photodiode of the present specification.
Figure 21:
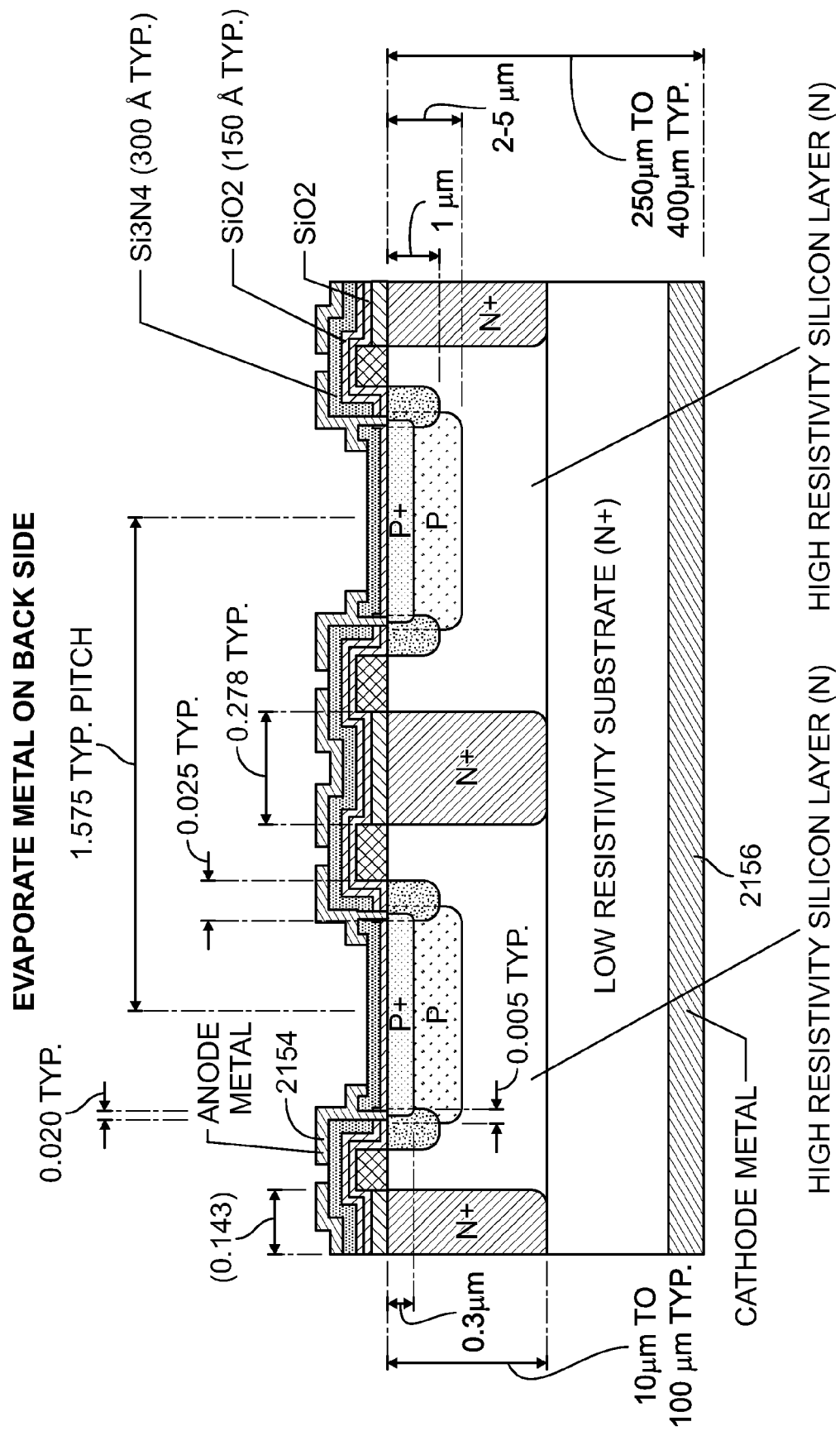
FIG. 21 is a cross-sectional view of the wafer shown in FIG. 20, illustrating a manufacturing step for a photodiode having bottom contacts only whereby the wafer is subjected to an additional metal masking process, in one embodiment of the manufacture of the photodiode of the present specification.

FIGS. 19, 20 and 21 illustrate manufacturing steps for fabricating a photodiode having bottom contact with an anode on a front side and a cathode on a back side of the wafer device 200. Once shallow p+ active area 1230 is formed as illustrated in FIG. 12, the wafer device 200 is subjected to a contact masking process. The nitride layer 1324 and the oxide layer 1322 are etched off from a front side 1332 of the wafer device 200. Contact mask areas 1950 approximately 0.02 μm wide are formed on the front side 1332, as anode contacts are to be present on the front side. Next as shown in FIGS. 20 and 21, the wafer device 200 is subjected to metal masking. A metal layer 2052 is deposited on the front side 1332 to form an anode 2154 and on the backside to form a cathode 2156. In various embodiments, the metal used for forming the cathode on the back side is a backside is a Cr/Au alloy.

Conventional shallow junction photodiodes comprise deep p+ ring zones on which the anode metal contacts are located. During an aluminum-silicon alloying process (also called a sintering process), which is usually performed at approximately 425° C. for approximately 20 minutes, aluminum reacts with silicon and provides the photodiode device with a good ohmic contact. However, during the sintering process, aluminum penetrates the p+ shallow layer of the photodiode and may reach the depletion region, causing high dark currents in the photodiode. In order to avoid this, aluminum contact pads are placed on the deep p+ ring zones.

In an alternate embodiment of the present invention, a photodiode is manufactured without having a deep p+ ring zone. Since, the photodiode of the present invention comprises a deep p zone underneath a shallow p zone, the pn junction is now located a few microns below the surface, and aluminum cannot penetrate a few microns below to reach the depletion region. The photodiode without deep p+ rings, in one embodiment, has bottom contacts only, wherein an anode is provided on the front side of the photodiode and a cathode is provided on the back side. In another embodiment, the photodiode without deep p+ rings has top contacts only, wherein both anode and cathode are provided on the front side of the photodiode. In yet another embodiment, the photodiode without deep p+ rings has both top and bottom contacts, wherein an anode is provided on the front side and a cathode on both the front side and back side. In the cases where the photodiodes have bottom contacts, a metal is also provided on the back side so that a contact may be made with the cathode on the back side. In one embodiment, the metal employed on the front side is aluminum and, the metal employed on the back side to create contacts is a Chromium/Gold (Cr/Au) alloy.

Figure 22:
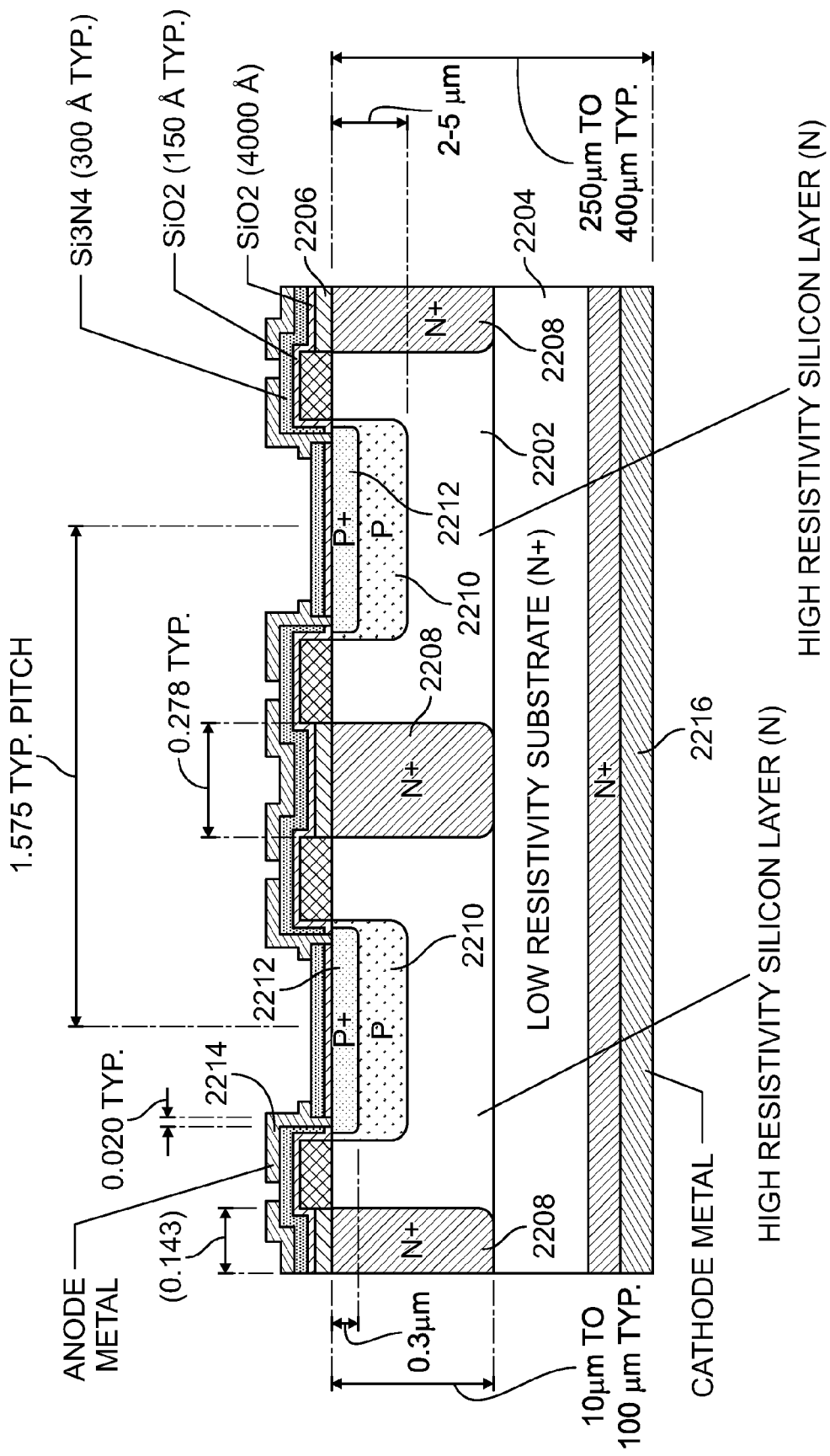
FIG. 22 illustrates a photodiode device, without a deep p ring, in accordance with another embodiment of the present specification.

FIG. 22 illustrates a photodiode without a deep p ring, in accordance with an embodiment of the present specification. The photodiode 2200 comprises substrate wafer starting material further comprising a high resistivity silicon layer 2202 on top of a relatively low resistivity wafer 2204, which, in one embodiment is a silicon, n-type wafer (n+). In an embodiment, the resistivity of the silicon layer 2202 ranges from 10 ohm cm to 10,000 ohm cm and that of the silicon n-type wafer 2204 ranges from 0.001 ohm cm to 0.1 ohm cm. In an embodiment, the low resistivity substrate has a thickness in a range of 150 µm to 350 µm, and the high resistivity silicon layer has a thickness in a range of 10 µm to 100 µm. Thus, the overall thickness of the silicon substrate starting material ranges from 250 µm to 400 µm.

The photodiode 2200 further comprises a mask oxide layer 2206 deposited on top of the silicon layer 2202. The mask oxide layer 2206 comprises silicon oxide ($SiO_2$) and/or silicon nitride ($Si_3N_4$), whereby thermal oxidation is employed to achieve the mask oxidation. In one embodiment, the oxide layer 2206 comprises $SiO_2$ having a thickness of approximately 4,000 Å. In one embodiment the $SiO_2$ layer defines a top surface of the photodiode 2200.

The photodiode also comprises three n+ diffused zones 2208 below the top surface of the photodiode 2200 and positioned within the high resistivity silicon layer 2202, on an extreme right edge and an extreme left edge, as well as in the center of the photodiode 2200. In an embodiment, the three n+ diffused zones 2208 are separated from each other and each n+ zone has a thickness extending through the entire depth of the silicon layer 2202.

The photodiode 2200 further comprises two p diffused regions 2210 positioned within the high resistivity silicon layer 2202 as illustrated in FIG. 22. In an embodiment, the p diffused regions 2210 have a thickness of approximately 2-5 µm. Also, in an embodiment, each p diffused region 2210 is positioned between two n+ diffused regions 2208. The photodiode 2200 further comprises two shallow p+ diffused zones or regions 2212 positioned within the high resistivity silicon layer 2202 and directly on top of the p diffused regions 2210 and below the top layer of the photodiode as illustrated in FIG. 22. In an embodiment, the depth of the shallow p+ zones 2212 is approximately 0.3 µm.

In one embodiment, as shown in FIGS. 22 and 32-34, the photodiode 2200 further comprises anodes 2214 on the top surface of the photodiode and a cathode 2216 on a backside of the photodiode 2200.

Figure 35:
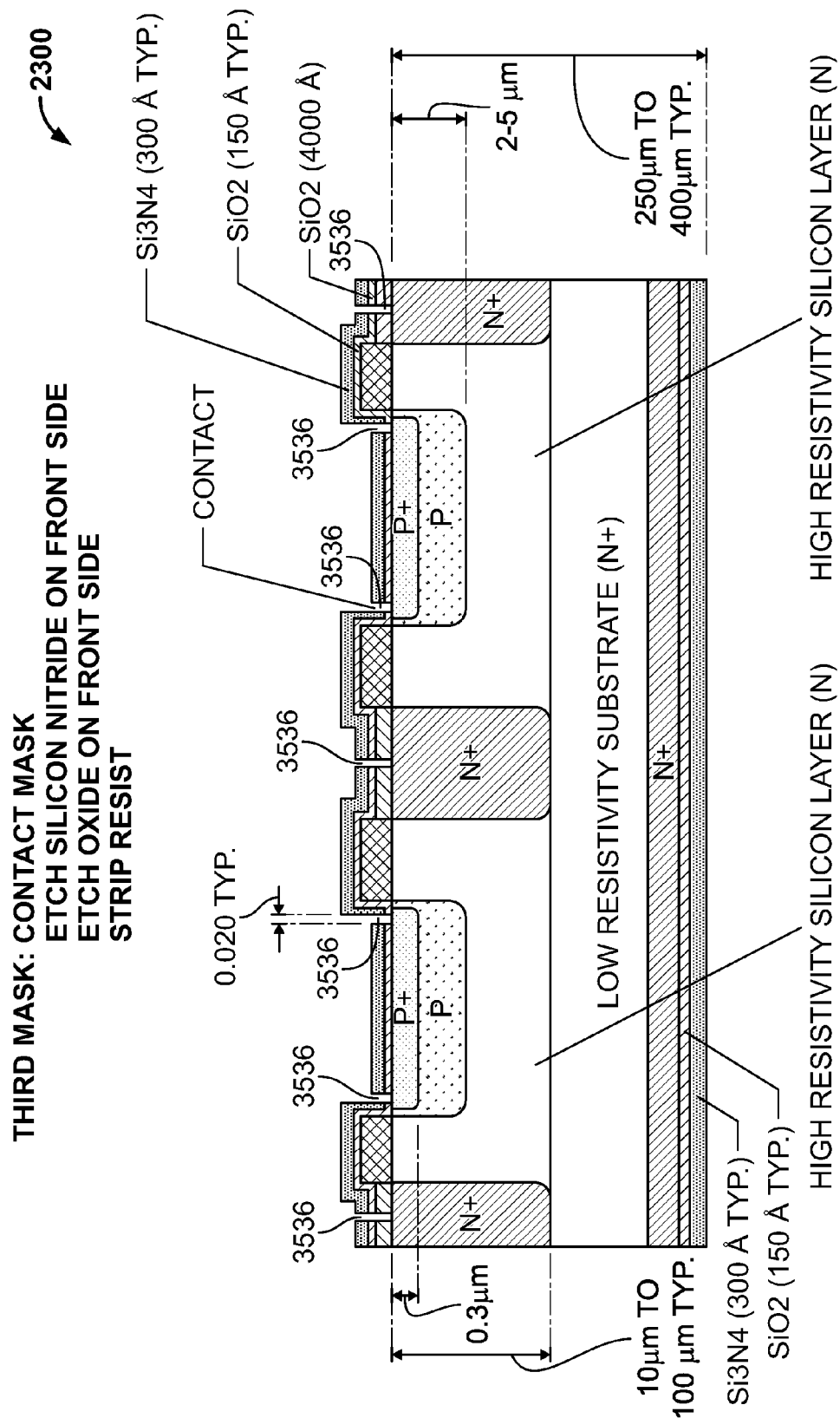
FIG. 35 is a cross-sectional view of the wafer shown in FIG. 31, illustrating a manufacturing step for a photodiode having top contacts only whereby the wafer is subjected to an etching process, for the manufacture of the photodiode without a deep p ring in accordance with one embodiment the present specification.
Figure 36:
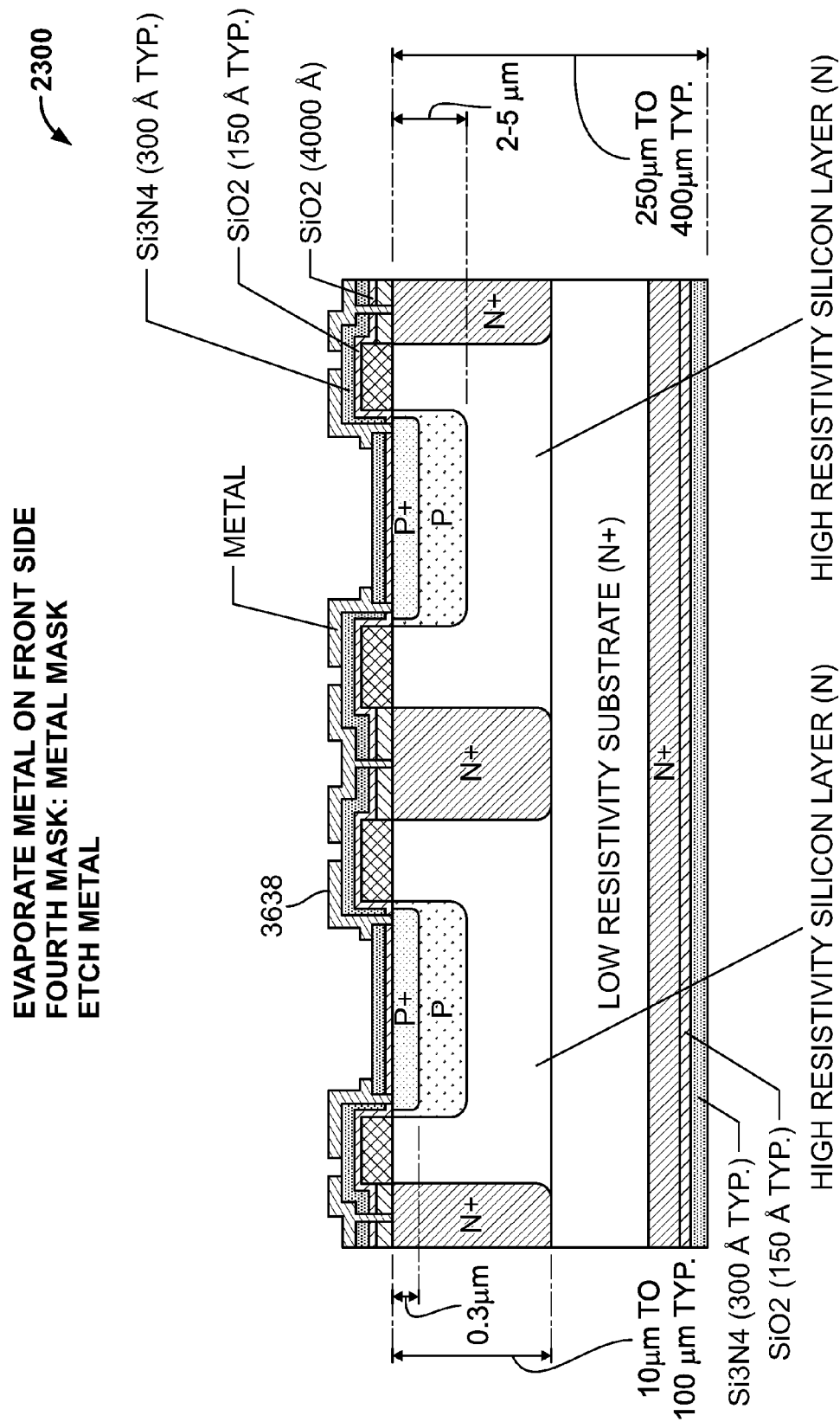
FIG. 36 is a cross-sectional view of the wafer shown in FIG. 35, illustrating a manufacturing step for a photodiode having top contacts only whereby the wafer is subjected to a metal masking process, for the manufacture of the photodiode without a deep p ring in accordance with one embodiment the present specification.
Figure 37:
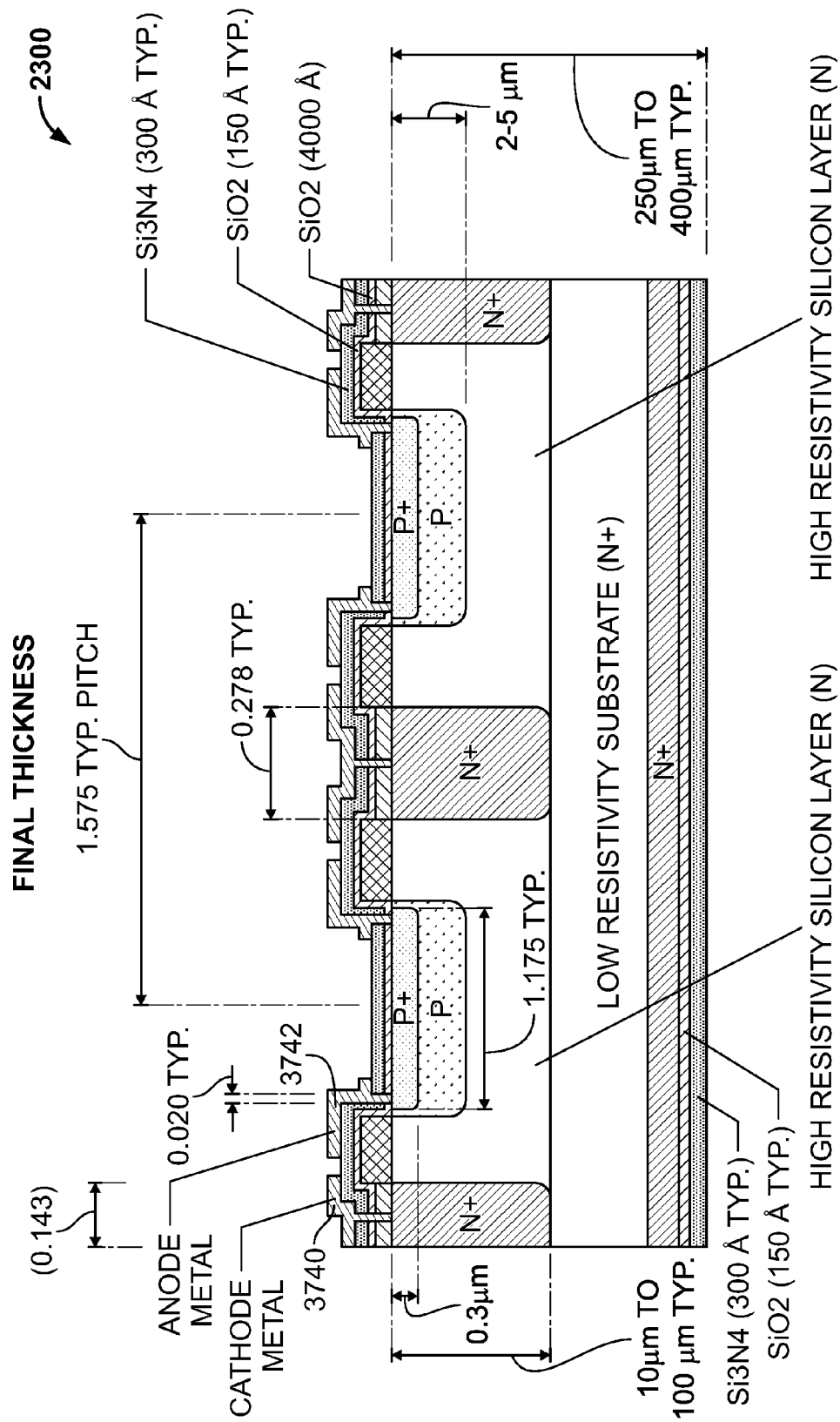
FIG. 37 is a cross-sectional view of the wafer shown in FIG. 36, illustrating a manufacturing step for a photodiode having top contacts only whereby the wafer is subjected to an additional metal masking process, for the manufacture of the photodiode without a deep p ring in accordance with one embodiment the present specification.

In another embodiment, the photodiode 2200 comprises anodes and a cathode on the top surface of the photodiode, as is illustrated and described in greater detail with respect to FIGS. 35-37.

Figure 38:
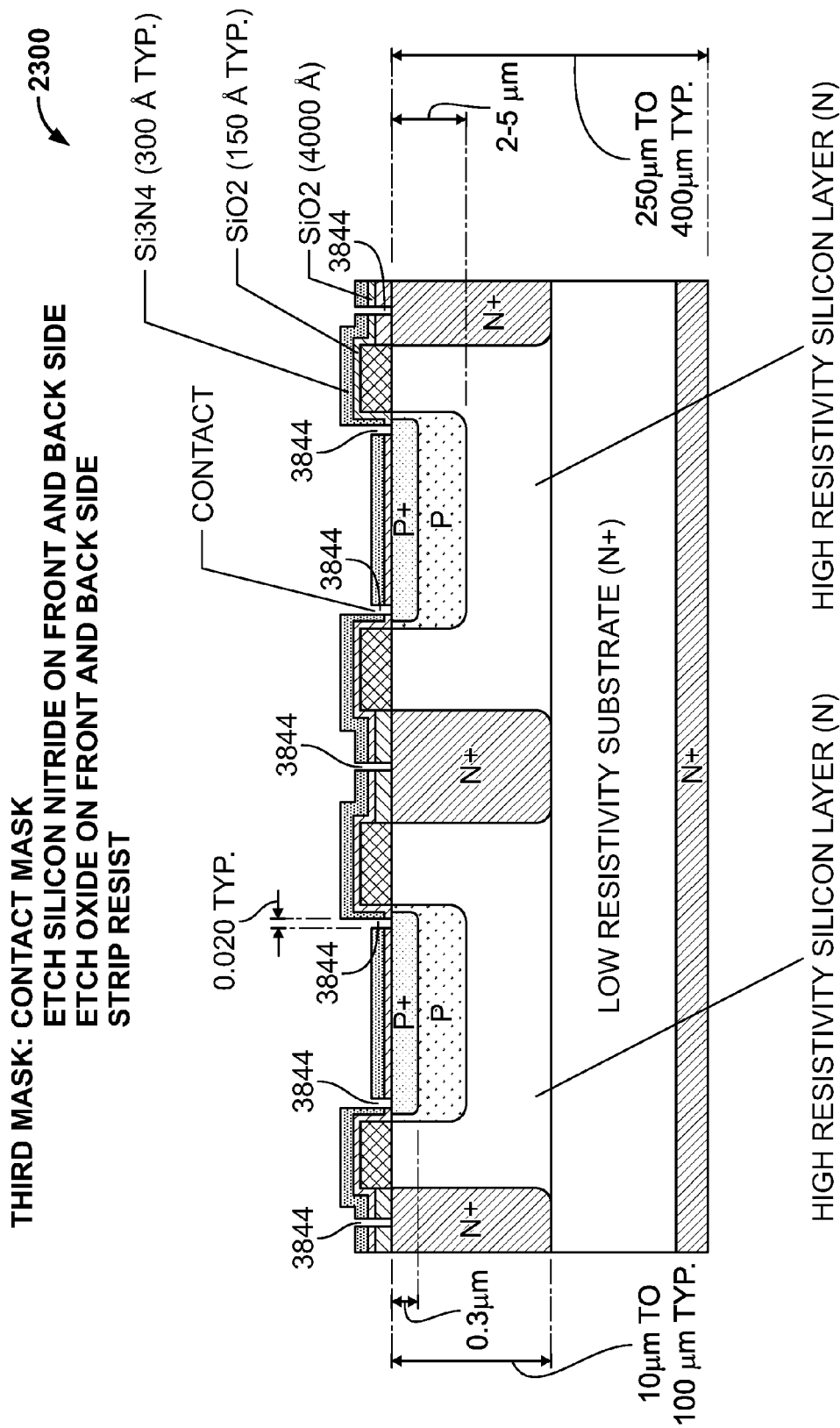
FIG. 38 is a cross-sectional view of the wafer shown in FIG. 31, illustrating a manufacturing step for a photodiode having both top and bottom contact devices whereby the wafer is subjected to an etching process, for the manufacture of the photodiode without a deep p ring in accordance with one embodiment the present specification.
Figure 39:
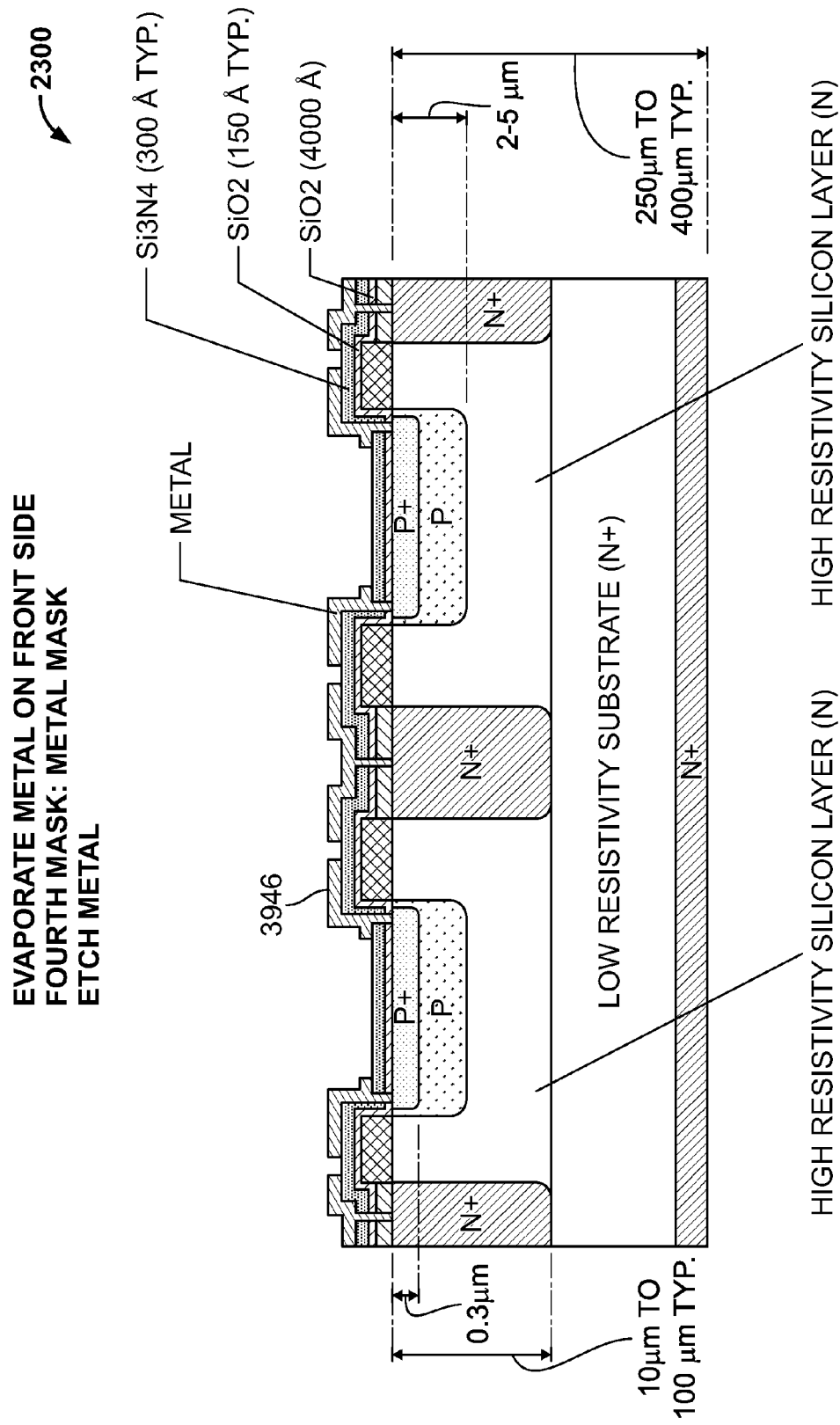
FIG. 39 is a cross-sectional view of the wafer shown in FIG. 38, illustrating a manufacturing step for a photodiode having both top and bottom contact devices whereby the wafer is subjected to a metal masking process, for the manufacture of the photodiode without a deep p ring in accordance with one embodiment the present specification.
Figure 40:
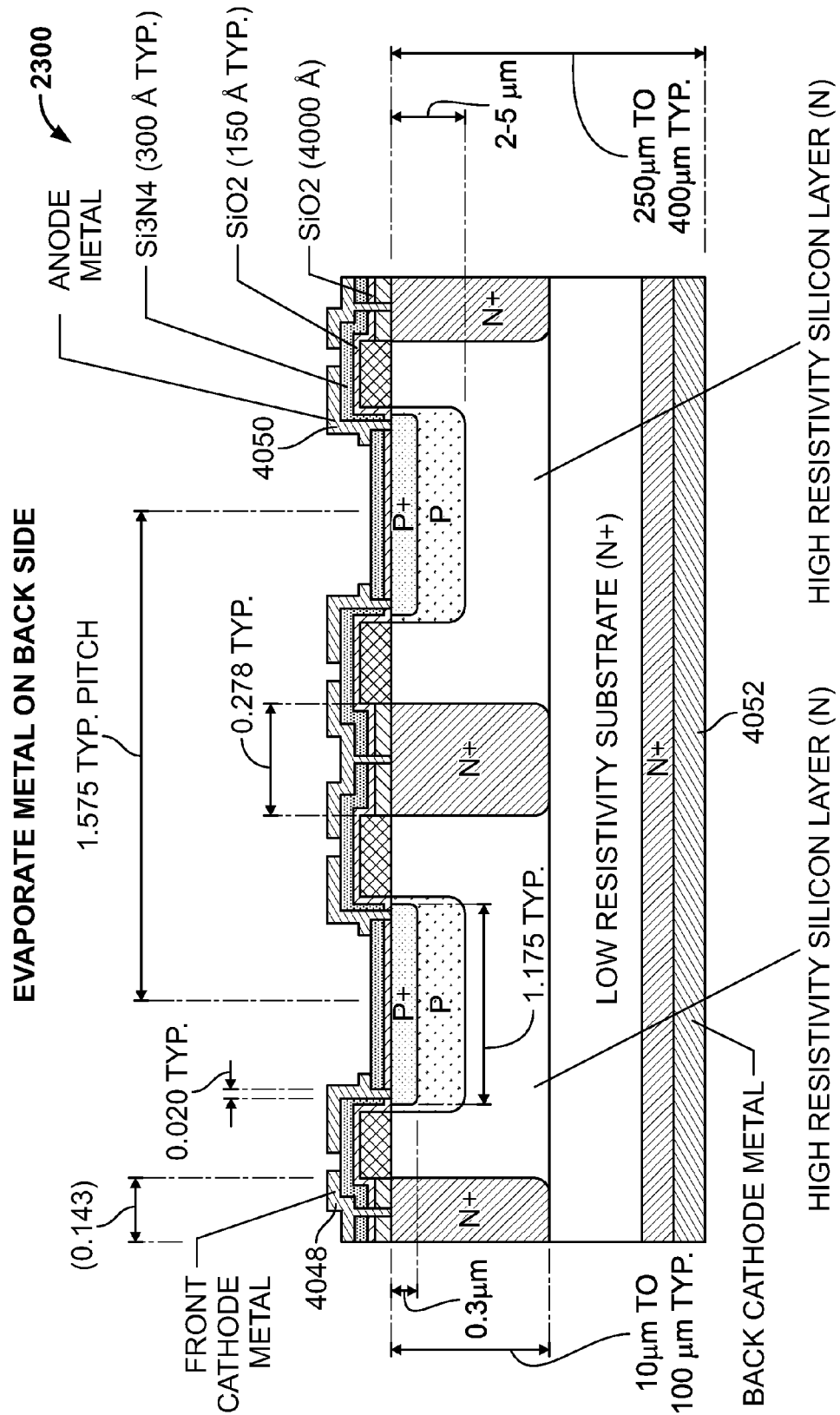
FIG. 40 is a cross-sectional view of the wafer shown in FIG. 39, illustrating manufacturing step for a photodiode having both top and bottom contact devices whereby the wafer is subjected to an additional metal masking process, for the manufacture of the photodiode without a deep p ring in accordance with one embodiment the present specification.

In yet another embodiment, the photodiode 2200 comprises an anode on the top surface of the photodiode, a cathode on the top surface of the photodiode, and a cathode on a backside of the photodiode, as illustrated and described in greater detail with respect to FIGS. 38-40.

FIGS. 23 through 40 depict cross-sectional views of exemplary manufacturing steps of the photodiode without deep p+ rings, in accordance with an embodiment of the present specification.

Figure 23:
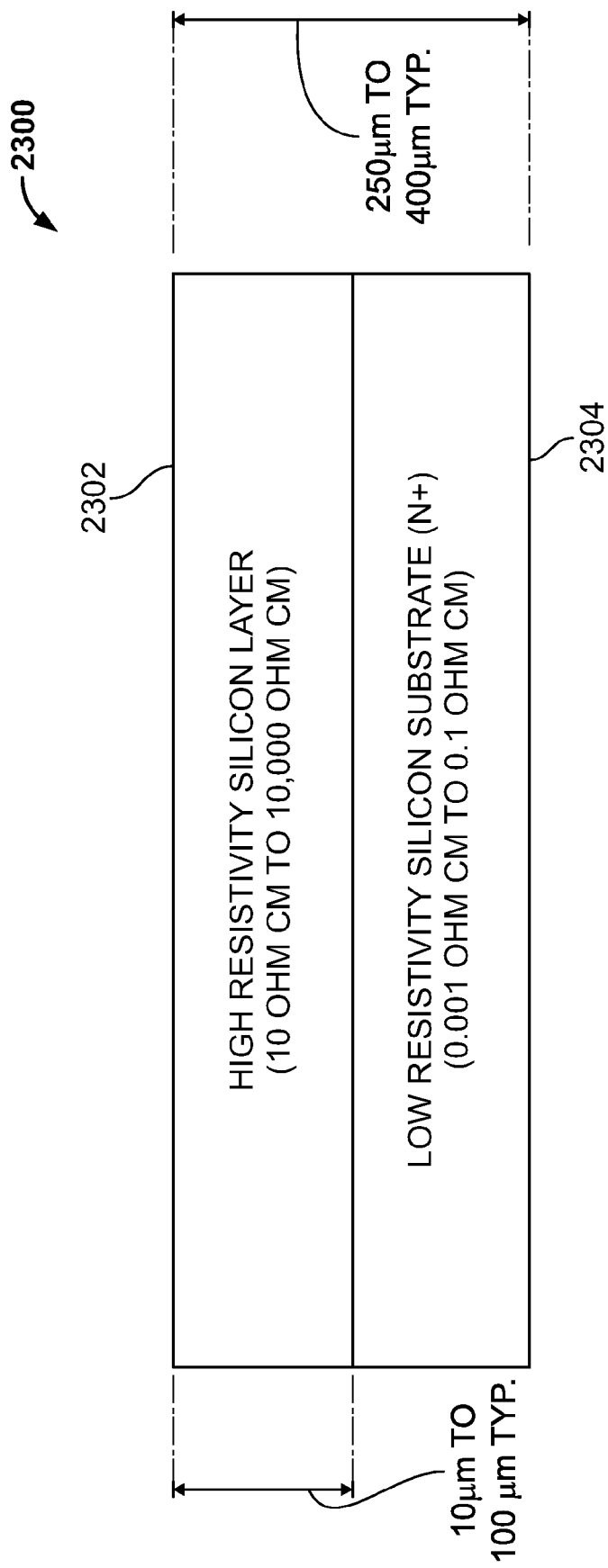
FIG. 23 illustrates a cross-sectional view of a substrate wafer used as a starting material for the manufacture of the photodiode without a deep p ring in accordance with one embodiment the present specification.

Referring now to FIG. 23, the starting material of the photodiode is a device wafer 2300 comprising a high resistivity silicon layer 2302 on top of a relatively low resistivity wafer 2304, which, in one embodiment, is a silicon, n-type wafer. In an embodiment, the resistivity of the silicon layer 2302 ranges from 10 ohm cm to 10,000 ohm cm and that of the silicon n type wafer 2304 ranges from 0.001 ohm cm to 0.1 ohm cm. In an embodiment, the device wafer 2300 has an overall thickness ranging from 250-400 µm and the silicon layer 2302 has a thickness ranging from 10-100 µm. While it is preferred that the device wafer 2300 be comprised of silicon, one of ordinary skill in the art would appreciate that any suitable semiconductor material, which can be processed in accordance with the manufacturing steps of the present specification, may be used. It should be understood by those of ordinary skill in the art, however, that the above specifications are not binding and that the type of material and resistivity can easily be changed to suit the design, fabrication, and functional requirements of the present specification.

Figure 24:
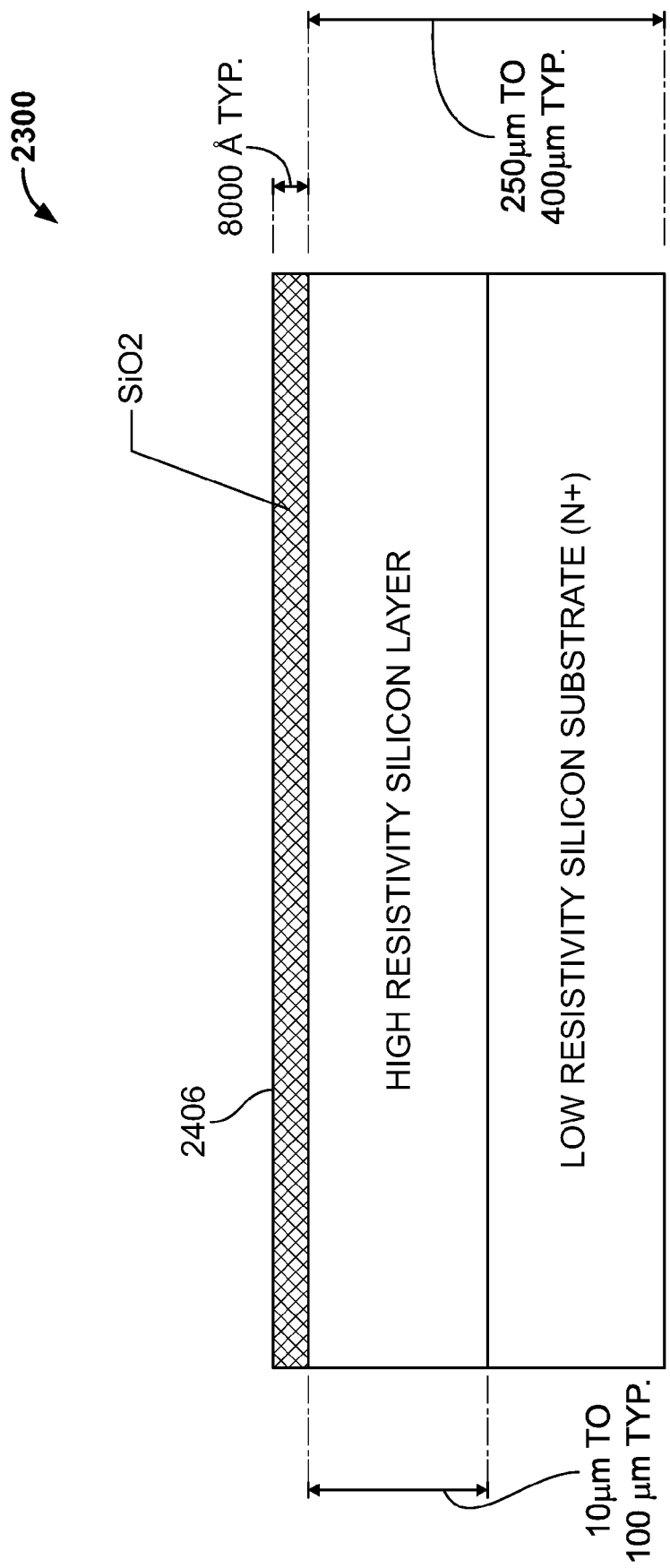
FIG. 24 illustrates a cross-sectional view of the wafer shown in FIG. 23, after a mask oxidation process step, for the manufacture of the photodiode without a deep p ring in accordance with one embodiment the present specification.

Referring to FIG. 24, the silicon layer 2302 is subjected to a standard mask oxidation process for growing a mask oxide layer 2406 on the silicon layer 2302. In one embodiment, the mask oxide layer 2406 comprises silicon oxide ($SiO_2$) and/or silicon nitride ($Si_3N_4$), and thermal oxidation is employed to achieve mask oxidation. In one embodiment, the oxide layer 2406 comprises $SiO_2$ having a thickness of approximately 8,000 Å. Standard mask oxidation is well known to those of ordinary skill in the art and will not be described in further detail herein.

Figure 25:
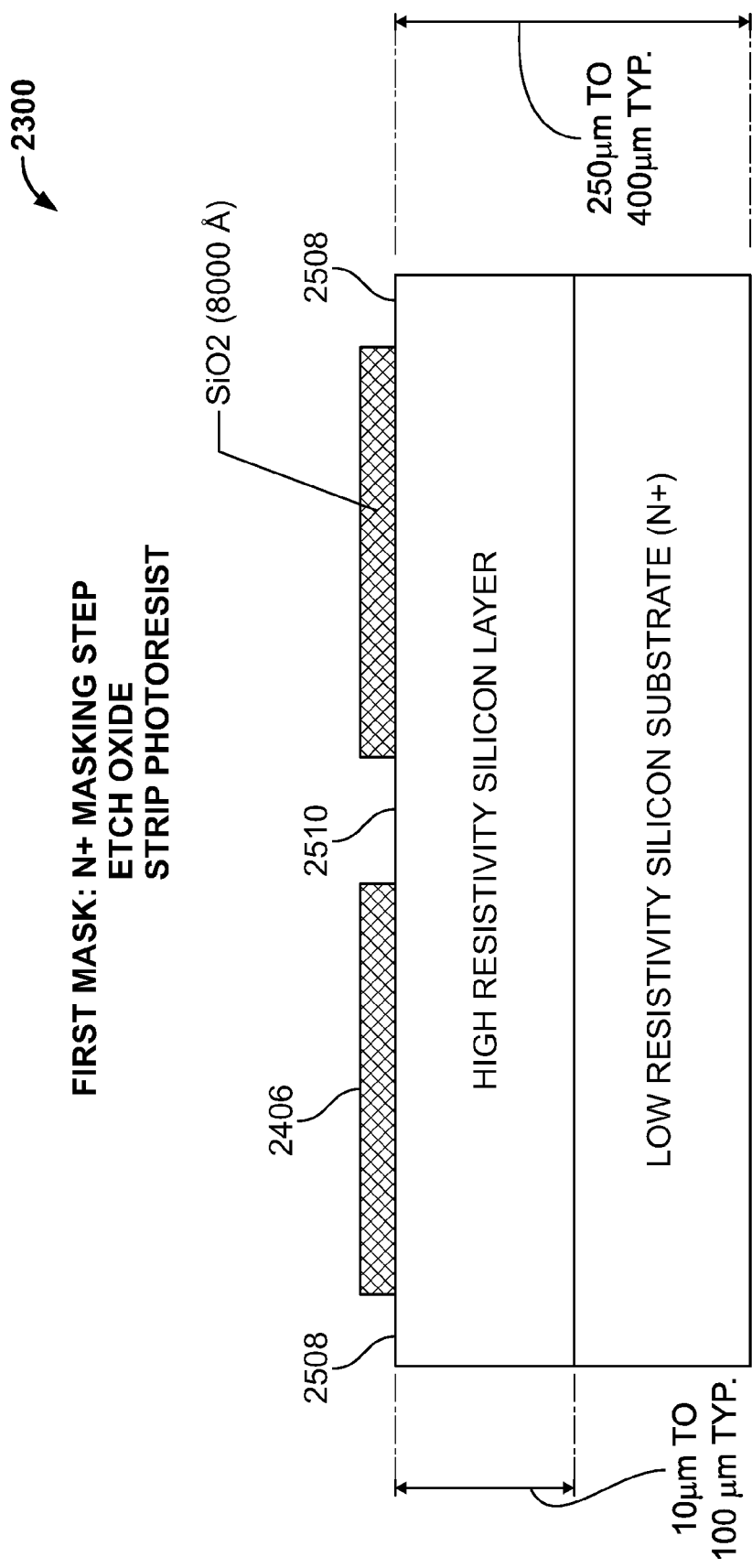
FIG. 25 illustrates a cross-sectional view of the wafer shown in FIG. 24, after a n+ photolithography process step, for the manufacture of the photodiode without a deep p ring in accordance with one embodiment the present specification.

As shown in FIG. 25, after the standard mask oxidation is complete, the device wafer 2300 is subjected to n+ photolithography. After selecting a suitable material and creating a suitable photoresist pattern, a thin photoresist layer is applied to the front and back side of device wafer 2300 to etch the pattern on the surfaces of the wafer. Generally, the photoresist layer is a photosensitive polymeric material for photolithography and photoengraving that can form a patterned coating on a surface. In one embodiment, the photoresist layer is applied via a spin coating technique. Spin coating is well known to those of ordinary skill in the art and will not be described in detail herein.

Next, the photoresist-coated device wafer 2300 is aligned with an n+ mask. N+ masking techniques are employed to protect portions of device wafer 2300. Generally, photographic masks are high precision plates containing microscopic images of preferred pattern or electronic circuits. They are typically fabricated from flat pieces of quartz or glass with a layer of chrome on one side. The mask geometry is etched in the chrome layer. In one embodiment, the n+ mask comprises a plurality of diffusion windows with appropriate geometrical and dimensional specifications. The n+ mask allows selective irradiation of the photoresist on the device wafer. Regions that are exposed to radiation are removed while those that are protected from diffusion remain shielded by the n+ mask.

An intense light, such as UV light, is projected through the mask, exposing portions of the photoresist layer in the pattern of the n+ mask. The exposed and remaining photoresist is then subjected to a suitable chemical or plasma etching process to reveal the pattern transfer from the mask to the photoresist layer. In one embodiment, the device wafer 2300 is subjected to oxide etching to remove portions 2508, 2510 of the silicon dioxide layer 2406.

Figure 26:
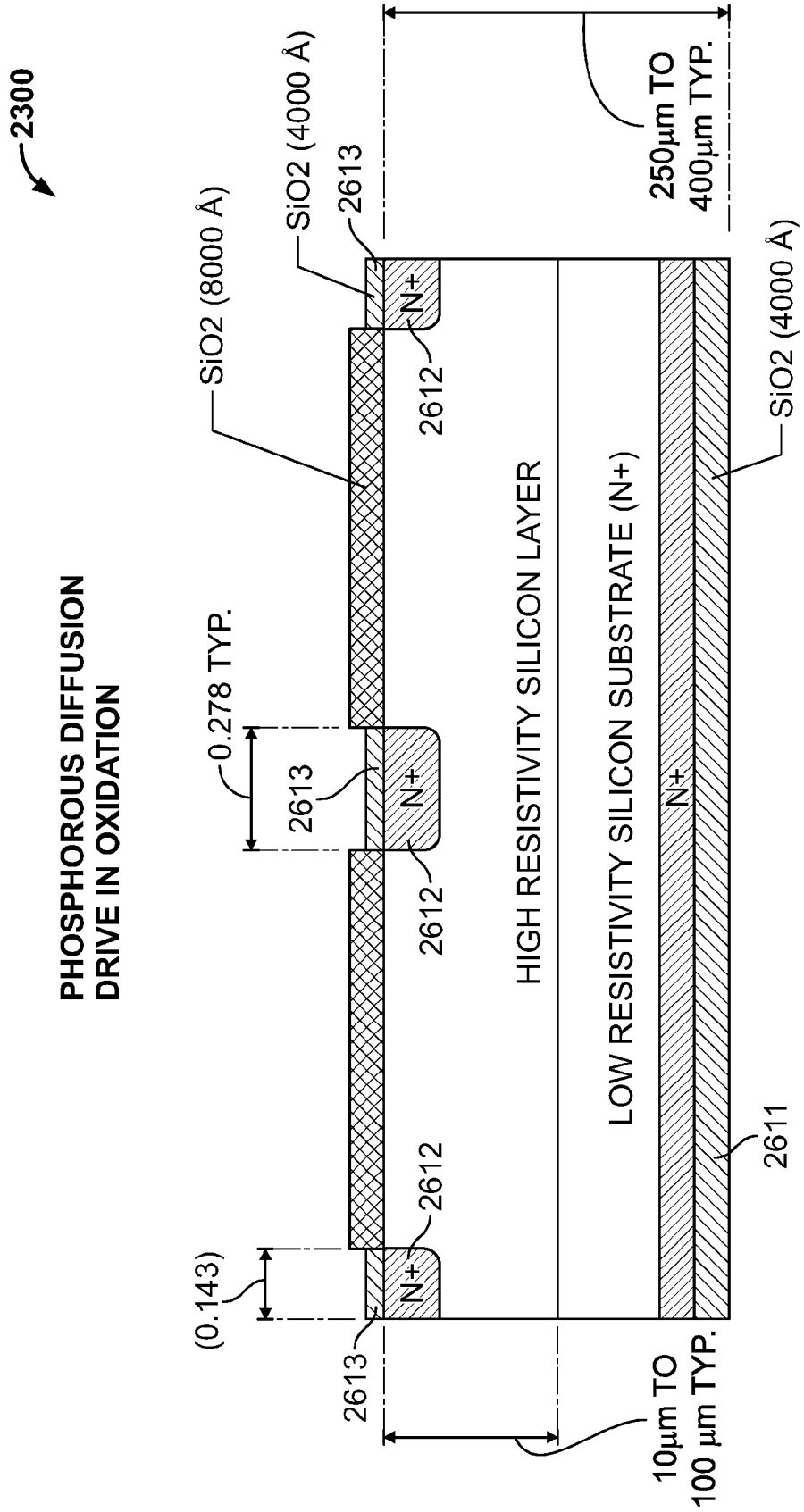
FIG. 26 illustrates a cross-sectional view of the wafer shown in FIG. 25, after a n+ diffusion process step, for the manufacture of the photodiode without a deep p ring in accordance with one embodiment the present specification.

Next as shown in FIG. 26 the device wafer 2300 is subjected is subjected to a standard mask oxidation process for growing a mask oxide layer 2611 on the silicon layer 2302. In one embodiment, the mask oxide layer 2611 comprises silicon oxide ($SiO_2$) and/or silicon nitride ($Si_3N_4$), and thermal oxidation is employed to achieve mask oxidation. In one embodiment, the oxide layer 2611 comprises $SiO_2$ having a thickness of approximately 4,000 Å.

Next, referring to FIG. 26 the device wafer 2300 is subjected to n+ diffusion followed by drive-in oxidation after the previous n+ masking and etching steps. Generally, diffusion facilitates propagation of a diffusing material through a host material. An appropriate amount of dopant atoms, such as phosphorous, is deposited onto the device wafer 2300 and fills the gaps left by the removed photoresist layer. Then, the wafer 2300 is subjected to a drive-in oxidation process that is used to redistribute the dopant atoms and deposit them deeper into the wafer. In one embodiment, this process fills the regions 2508, 2510, via deep diffusion, with n+ dopant 2612. In an embodiment, the width of the n+ diffused zones ranges from approximately 0.143 to 0.278 µm. In an embodiment, the n+ diffused zones are optional may not be present in the photodiode.

Next, the regions 2508, 2510 are covered with oxide layer 2613. In one embodiment, oxide layer 2613 has a thickness of approximately 4,000 Å.

Figure 27:
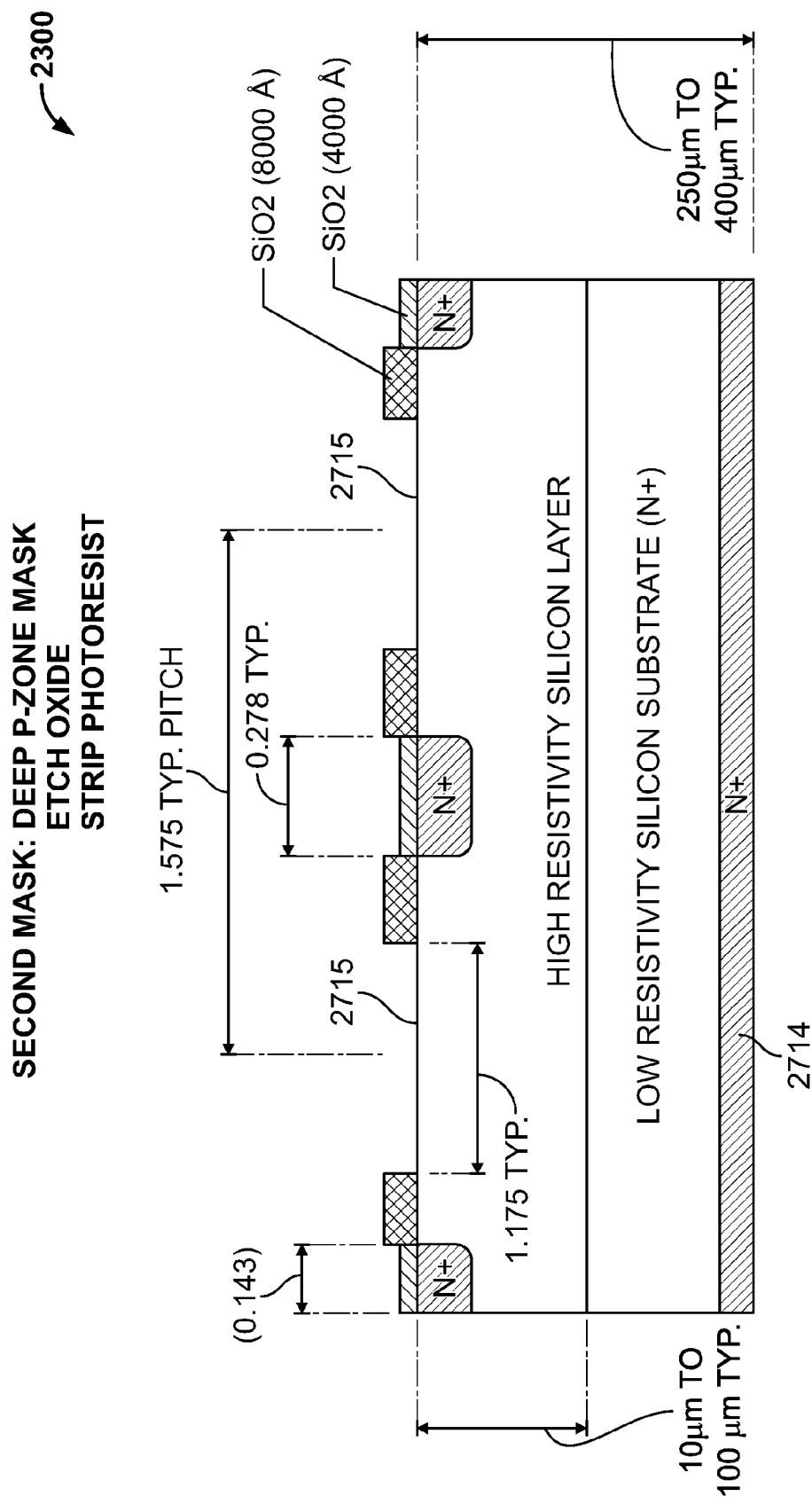
FIG. 27 illustrates a cross-sectional view of the wafer shown in FIG. 26, after an etching and lithography process step, for the manufacture of the photodiode without a deep p ring in accordance with one embodiment the present specification.

Next, as shown in FIG. 27, in a preferred embodiment, the device wafer 2300 is subjected to n+ masking and etching and n+ diffusion to create an n+ layer 2714 on a back side of the photodiode 2300, to provide an ohmic contact. In an embodiment, where the resistivity of the substrate being used to form the photodiode is very low, the n+ layer on the backside of the photodiode may be omitted. Further, as illustrated in FIG. 27, device wafer 2300 is subjected to a lithography process, creating deep p diffused regions 2715. In an embodiment, the exposed silicon surface of region 2715 is approximately 1.75 µm wide and is subsequently oxidized. As with any conventional lithography process, p lithography comprises at least the following tasks, but not limited to such tasks: substrate preparation; photoresist application; soft baking; mask alignment; exposure; development; hard backing; and etching. In addition, various other chemical treatments may be performed.

The p masking and diffusion process is similar to that delineated with respect to the n+ masking process described earlier and will not be repeated in detail herein. The p masking process further comprises deposition and deep drive-in oxidation, allowing for predefined and/or predetermined thermal budget in accord with the principles of the present specification.

Figure 28:
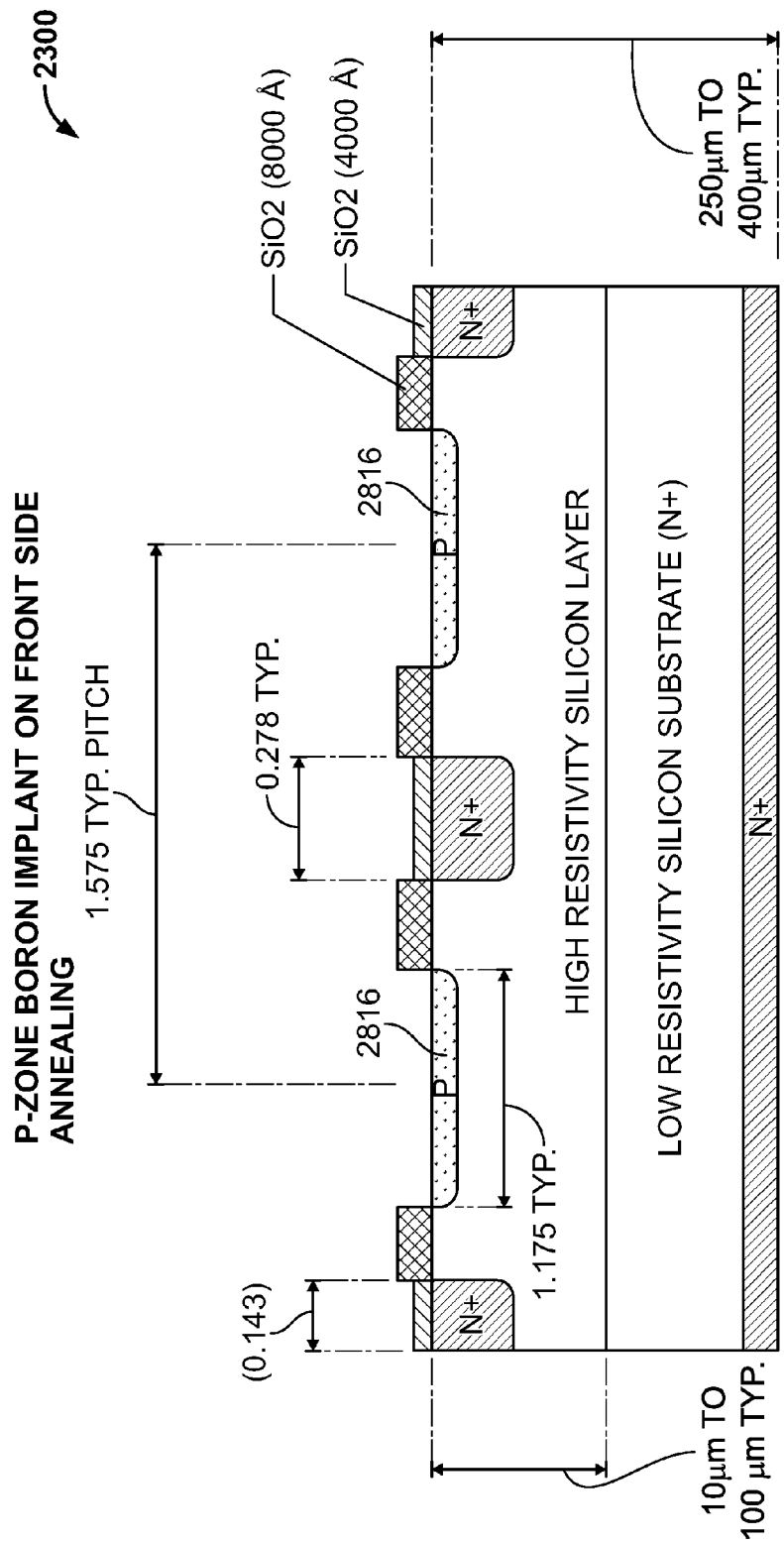
FIG. 28 illustrates a cross-sectional view of the wafer shown in FIG. 27, after a boron implant and annealing process step, for the manufacture of the photodiode without a deep p ring in accordance with one embodiment the present specification.

This is followed by boron implant and annealing, as shown in FIG. 28, to form a shallow p active area 2816. The active area specifications, among other parameters, comprise significant performance characteristics of the photodiode. Next, the regions 2816 are covered with an oxide layer.

Figure 29:
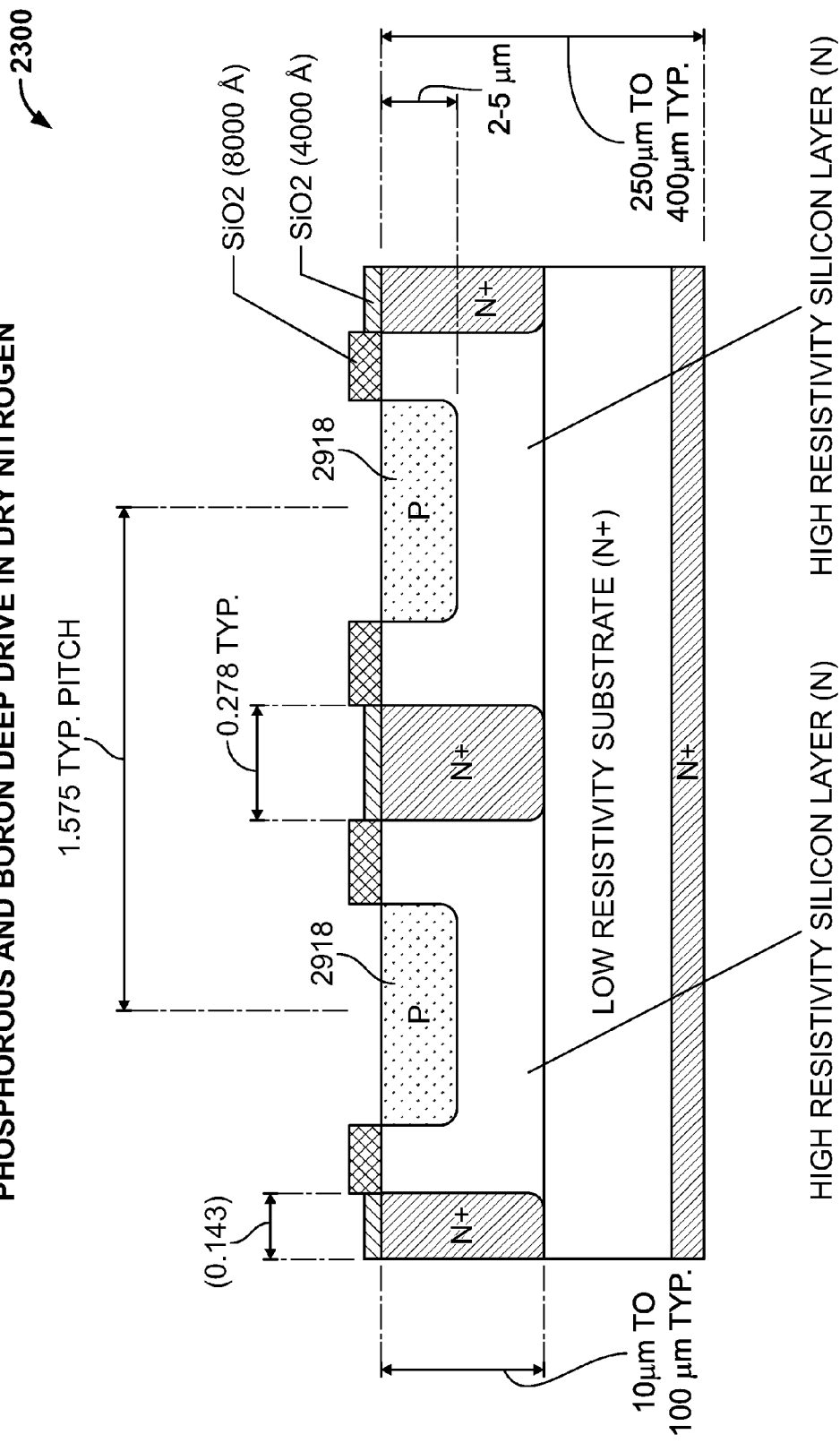
FIG. 29 illustrates a cross-sectional view of the wafer shown in FIG. 28, after a p diffusion process step, for the manufacture of the photodiode without a deep p ring in accordance with one embodiment the present specification.

Next, as shown in FIG. 29 device wafer 2300 is subjected to p diffusion followed by drive-in oxidation after the previous p masking and etching steps. An appropriate amount of dopant atoms, such as phosphorous, is deposited onto the substrate wafer and fills the gaps left by the removed photoresist layer. Then, the wafer 2300 is subjected to a drive-in oxidation process that is used to redistribute the dopant atoms and deposit them deeper into the wafer creating deep p active areas 2918. In an embodiment, the depth of the p type dopant ranges between 2 to 5 µm.

Figure 30:
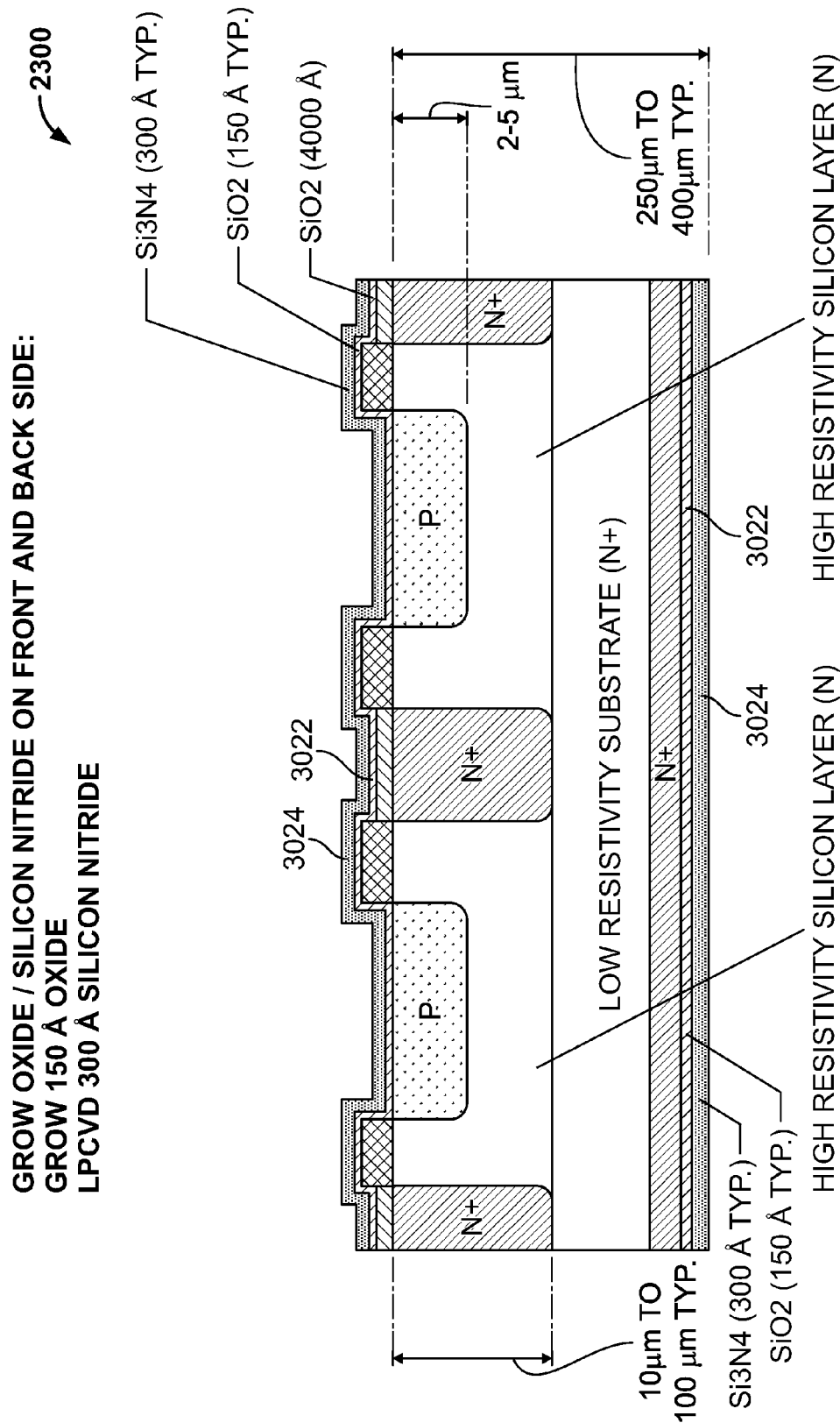
FIG. 30 illustrates a cross-sectional view of the wafer shown in FIG. 29, after a process for growing oxide and nitride layers on a front and backside step, for the manufacture of the photodiode without a deep p ring in accordance with one embodiment the present specification.

Next as shown in FIG. 30 layers of oxide such as silicon oxide 3022 and silicon nitride 3024 are grown on a front side 1126 and a backside 1128 of the wafer device 200. In an embodiment, the oxide layer 3022 has a thickness of approximately 150 Å and the nitride layer 3024 has a thickness of approximately 300 Å, forming an anti-reflective layer on the device wafer.

Figure 31:
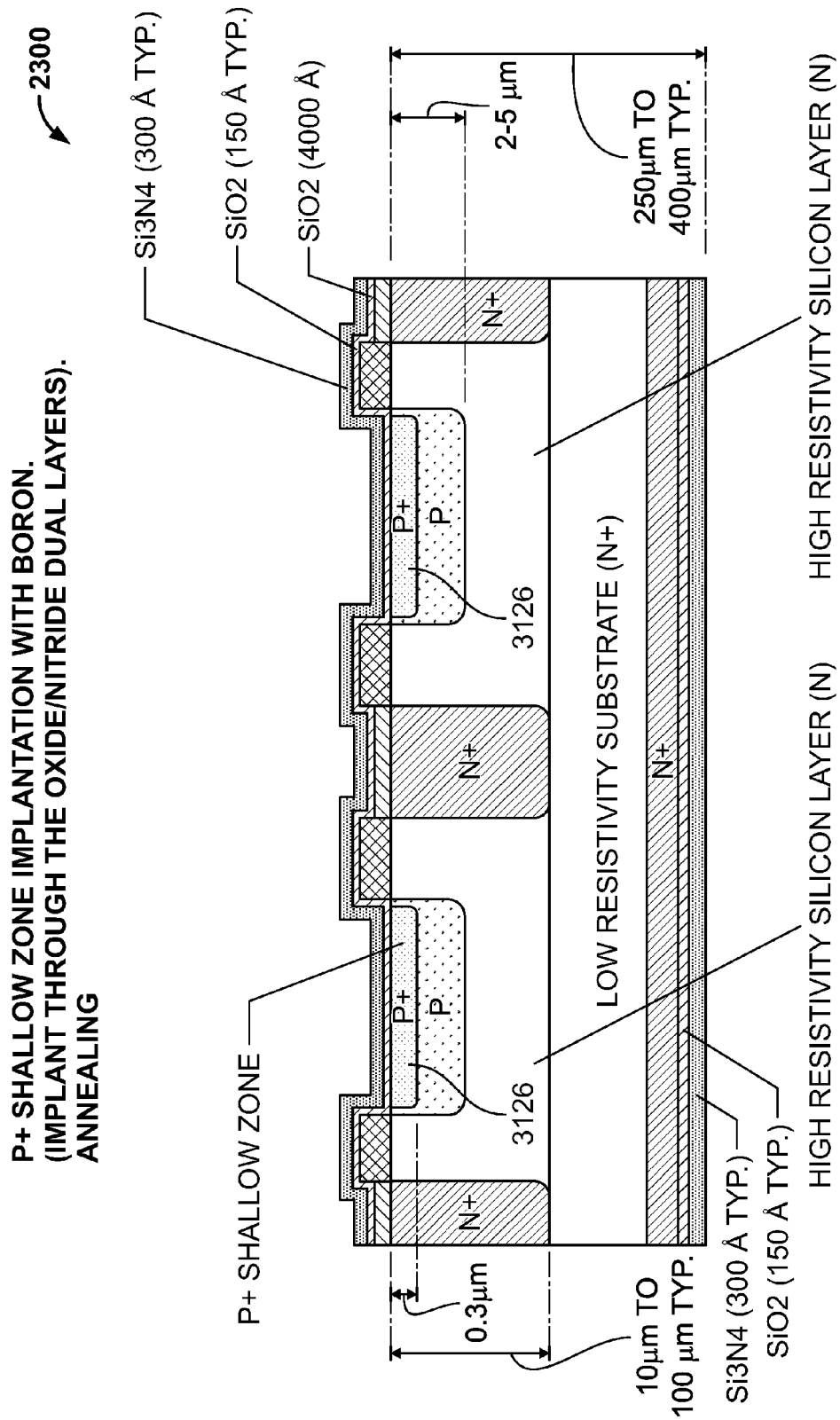
FIG. 31 illustrates a cross-sectional view of the wafer shown in FIG. 30, after a boron implant and annealing process step for forming shallow $p_+$ active areas, in one embodiment of the manufacture of the photodiode of the present specification.

This is followed by boron implant and annealing, as shown in FIG. 31, to form shallow p+ active areas 3126. In an embodiment, the depth of the shallow p+ areas 3126 is approximately 0.3 µm. The implant is formed through the silicon oxide 3022 and silicon nitride 3024 dual layer. Thus, the PN junction is moved deep down underneath the oxide interface rendering the photodiodes increased ruggedness and stability.

The improved P+ P N N+ junction photodiode of the present specification is front-side illuminated. The photodiode may be designed as having: top contacts with an anode and a cathode on a front/top side of the wafer device 2300, or bottom contact with an anode on a front side and a cathode on a back side of the wafer device 2300, or else both top and bottom contact devices with an anode on a front side, and a cathode on both front and back side of the wafer device 2300.

Figure 32:
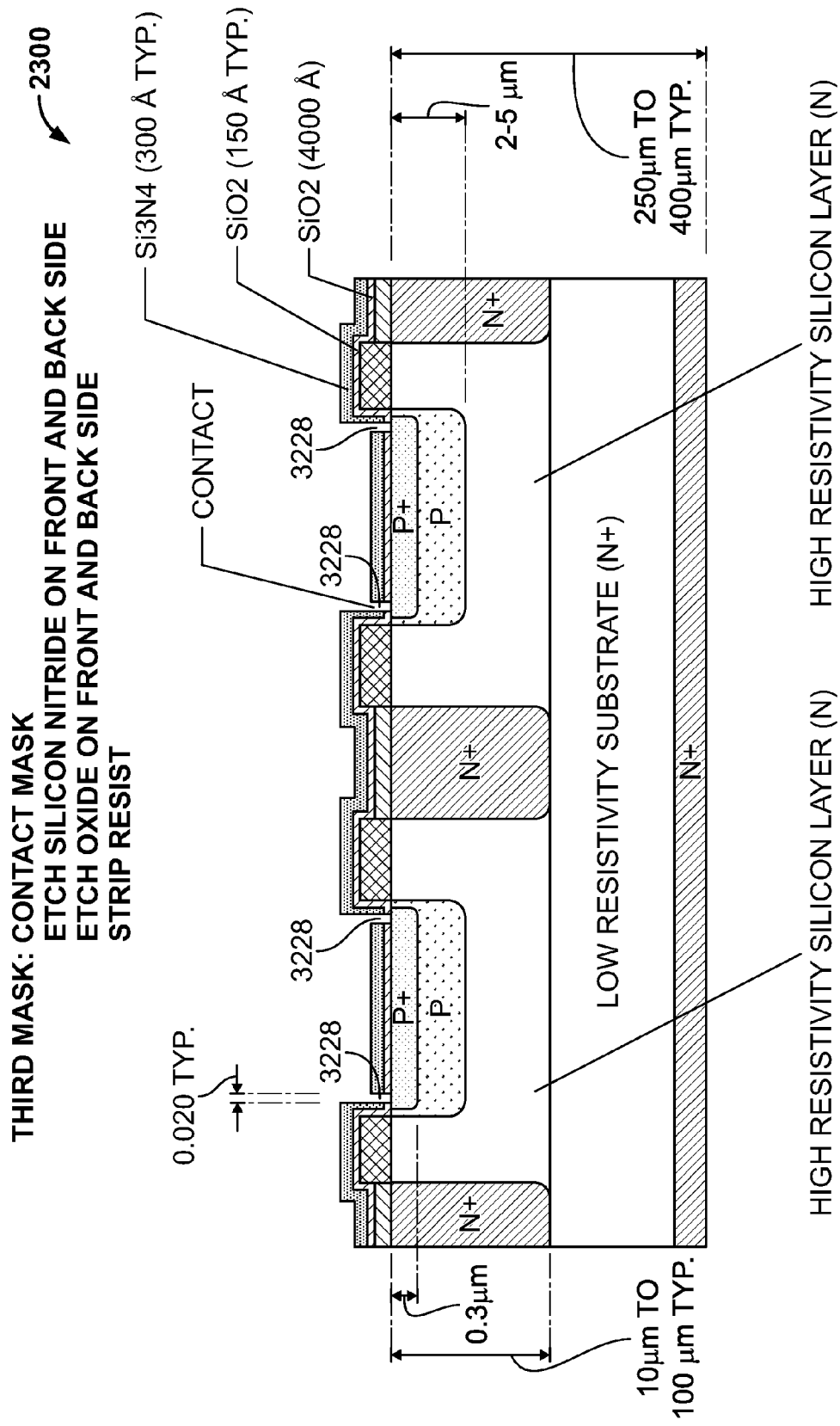
FIG. 32 is a cross-sectional view of the wafer shown in FIG. 31, illustrating a manufacturing step for a photodiode having bottom contacts only whereby the wafer is subjected to an etching process, for the manufacture of the photodiode without a deep p ring in accordance with one embodiment the present specification.
Figure 33:
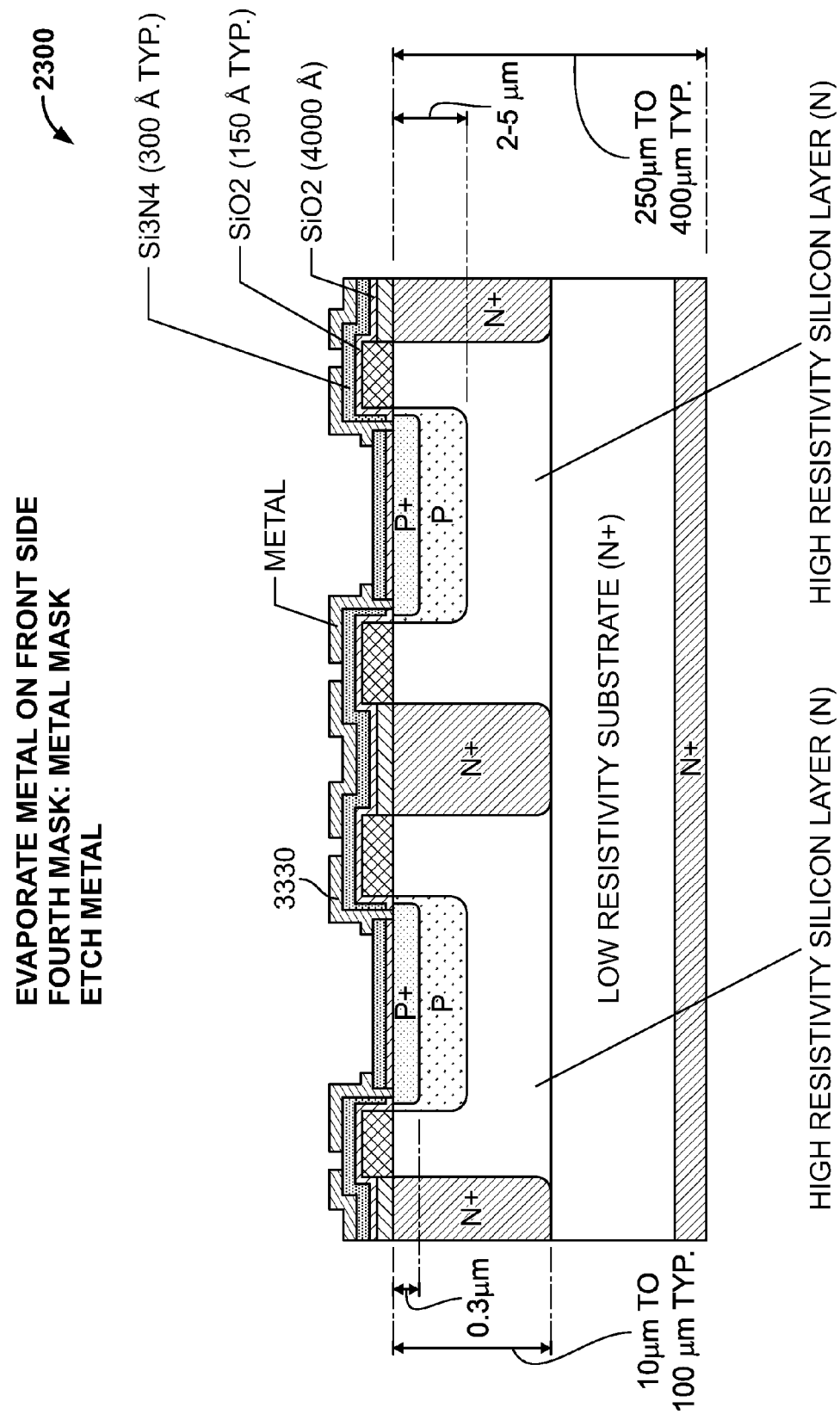
FIG. 33 is a cross-sectional view of the wafer shown in FIG. 32, illustrating a manufacturing step for a photodiode having bottom contacts only whereby the wafer is subjected to a metal masking process, for the manufacture of the photodiode without a deep p ring in accordance with one embodiment the present specification.
Figure 34:
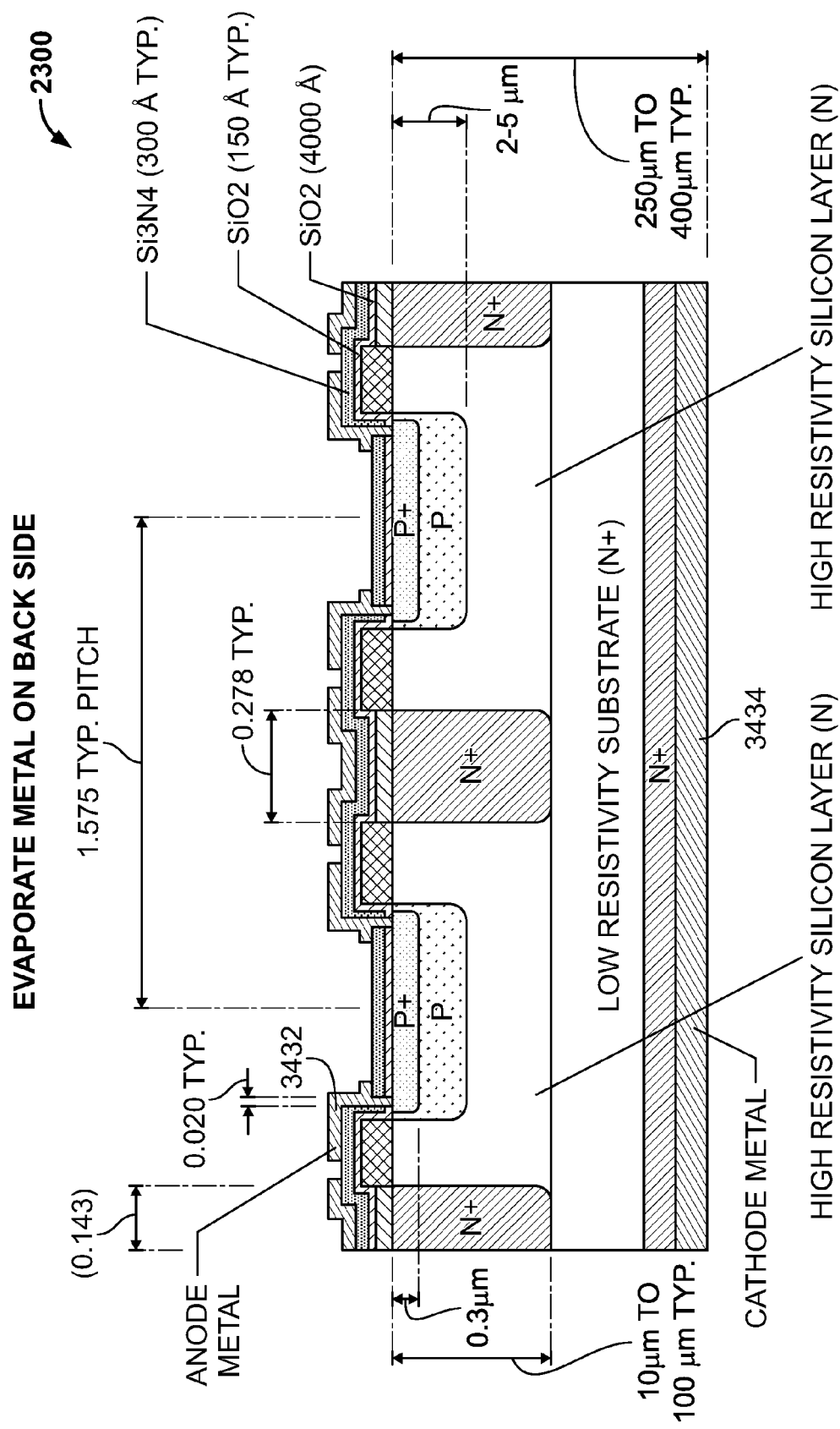
FIG. 34 is a cross-sectional view of the wafer shown in FIG. 33, illustrating a manufacturing step for a photodiode having bottom contacts only whereby the wafer is subjected to an additional metal masking process, for the manufacture of the photodiode without a deep p ring in accordance with one embodiment the present specification.

FIGS. 32, 33 and 34 illustrate manufacturing steps for fabricating a photodiode having bottom contact with an anode on a front side and a cathode on a back side of the wafer device 2300. Once shallow p+ active area 3126 is formed as illustrated in FIG. 31, the wafer device 2300 is subjected to a contact masking process. The nitride layer 3024 and the oxide layer 3022 are etched off from a front side of the wafer device 2300. Contact mask areas 3228 approximately 0.02 µm wide are formed on the front side. Next as shown in FIGS. 33 and 34, the wafer device 2300 is subjected to metal masking. A metal layer 3330 is deposited on the front side to form an anode 3432 and on the backside to form a cathode 3434. In various embodiments, the metal used for forming the cathode on the back side is a backside is a Cr/Au alloy.

FIGS. 35, 36 and 37 illustrate manufacturing steps for fabricating a photodiode having top contacts with an anode and a cathode on a front/top side of the wafer device 2300. Once shallow p+ active area 3126 is formed as illustrated in FIG. 31, the wafer device 2300 is subjected to a contact masking process. The nitride layer 3024 and the oxide layer 3022 are etched away from a front side of the wafer device 2300. Referring to FIG. 35, contact mask areas 3536 approximately 0.02 µm wide are formed on the front side. Next as shown in FIGS. 36 and 37, the wafer device 2300 is subjected to metal masking. A metal layer 3638 is deposited on the front side to form a cathode 3740 and an anode 3742. In various embodiments, the metal used for forming the cathode and anode on the front side is aluminum.

FIGS. 38, 39, and 40 illustrate manufacturing steps for fabricating a photodiode having both top and bottom contact devices with an anode on a front side, and a cathode on both front and back side of the wafer device 2300. Once shallow p+ active area 3126 is formed as illustrated in FIG. 31, the wafer device 2300 is subjected to a contact masking process. The nitride layer 3024 and the oxide layer 3022 are etched away from a front side and a backside of the wafer device 2300. Contact mask areas 3844 approximately 0.02 µm wide are formed on the front side. Next, as shown in FIGS. 39 and 40, the wafer device 2300 is subjected to metal masking. A metal layer 3946 is deposited on the front side to form a cathode 4048 and an anode 4050 and on the back side to form a cathode 4052. In various embodiments, the metal used for forming the cathode and anode on the front side is aluminum; whereas that used for forming the cathode on the backside is a Cr/Au alloy.

In an embodiment, the photodiode of the present invention is built on a high resistivity bulk wafer material instead of using a high resistivity layer over a low resistivity silicon wafer as the starting material. While a photodiode built on bulk wafer material is more structurally robust and therefore rugged, it has a lower shunt resistance and higher crosstalk when compared with devices made on a substrate having a high resistivity layer over a low resistivity silicon wafer. Typically, shunt resistance is tested as: 10 mV divided by the dark current (as measured at 10 mV), with respect to a photodiode. In order to obtain a high shunt resistance, the dark current is required to be as low as possible. Dark current, however, is generated throughout the volume of a high resistivity wafer layer. For example, a 250 μm thick high resistivity silicon bulk wafer generates more dark current than a 10 μm thick high resistivity layer on a 240 μm low resistivity substrate as the dark current generated in the low resistivity substrate is very small and negligible. In order to achieve low cross-talk on a multi-element array, the N+ region needs to extend throughout to reach the backside of the wafer. This is an expensive procedure as it would take a very long time to diffuse to have the N+ region 250 μm deep in a case of a 250 μm thick bulk wafer and thus, significantly increases the cost of the photodiode array.

Figure 41:
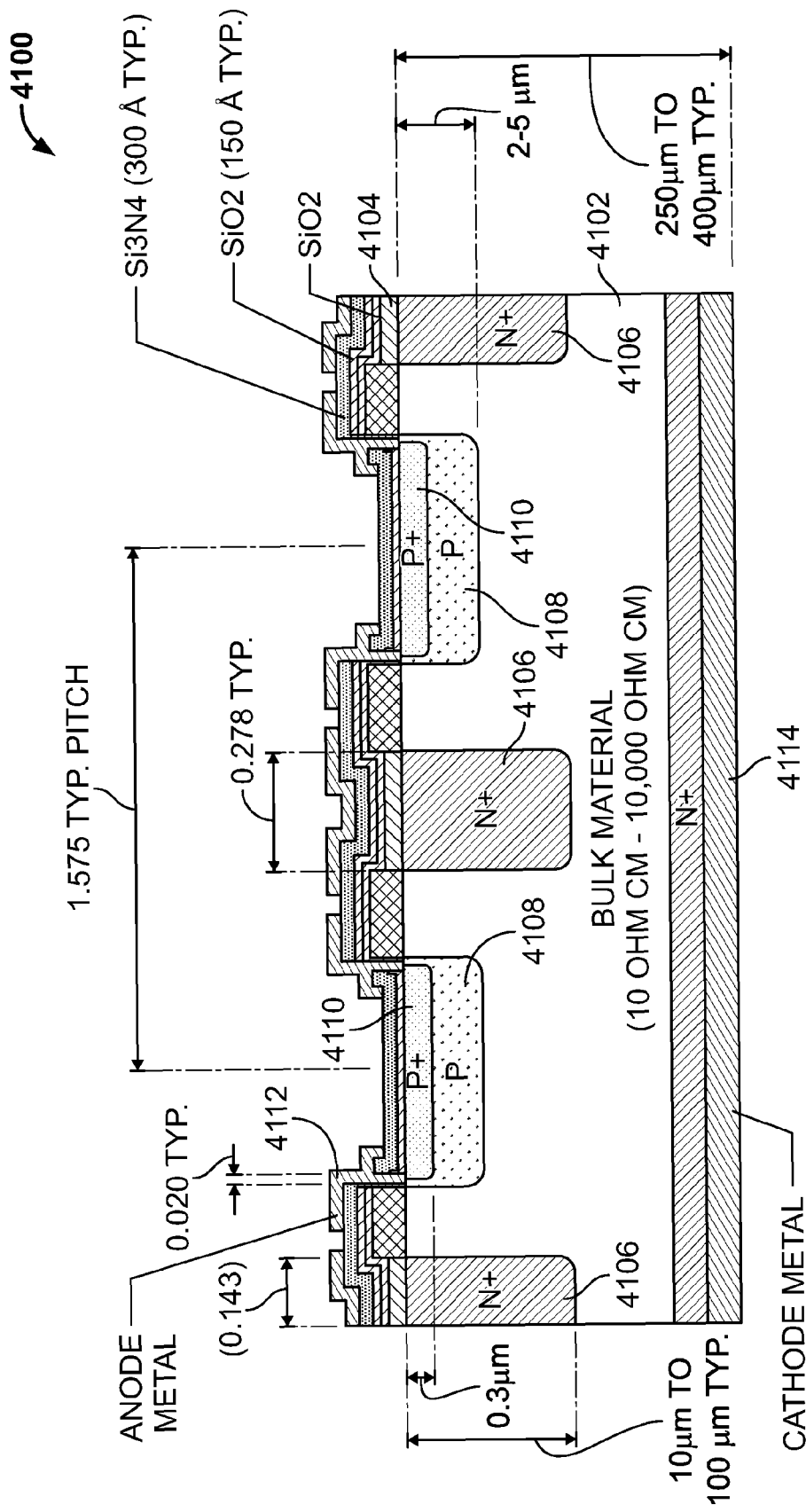
FIG. 41 illustrates a photodiode fabricated on a bulk wafer material, in accordance with an embodiment of the present specification.

FIG. 41 illustrates a photodiode fabricated on a bulk wafer material, in accordance with an embodiment of the present specification. The photodiode 4100 comprises bulk wafer starting material 4102 having a resistivity ranging from 10 ohm cm to 10,000 ohm cm. In an embodiment, the bulk wafer material 4102 has a thickness ranging from 250 μm to 400 μm.

The photodiode 4102 further comprises a mask oxide layer 4104 comprising silicon oxide ($SiO_2$) and/or silicon nitride ($Si_3N_4$), whereby thermal oxidation is employed to achieve the mask oxidation. In one embodiment, the oxide layer 2204 comprises $SiO_2$ having a thickness of approximately 4,000 Å. In one embodiment the $SiO_2$ layer defines a top surface of the photodiode 4100.

The photodiode also comprises three n+ diffused zones 4106 below the top surface of the photodiode 4100 and positioned within the bulk wafer material 4102, on an extreme right edge and an extreme left edge, as well as in the center of the photodiode 4100.

The photodiode 4100 further comprises two p diffused regions 4108 positioned within the bulk wafer material 4102. In an embodiment, the p diffused regions 4108 have a thickness of approximately 2-5 μm. Also, in an embodiment, each p diffused region 4108 is positioned between two n+ diffused regions 4106. The photodiode 4100 further comprises two shallow p+ diffused zones or regions 4110 positioned directly on top of the p diffused regions 4108 and below the top layer of the photodiode as illustrated in FIG. 41. In an embodiment, the depth of the shallow p+ zones 4110 is approximately 0.3 μm. In one embodiment, as shown in FIG. 41 the photodiode 4100 further comprises anodes 4112 on the top surface of the photodiode and a cathode 4114 on a backside of the photodiode 4100. In another embodiment, the photodiode 4100 comprises both anodes and a cathode on the top surface of the photodiode.

Figure 42:
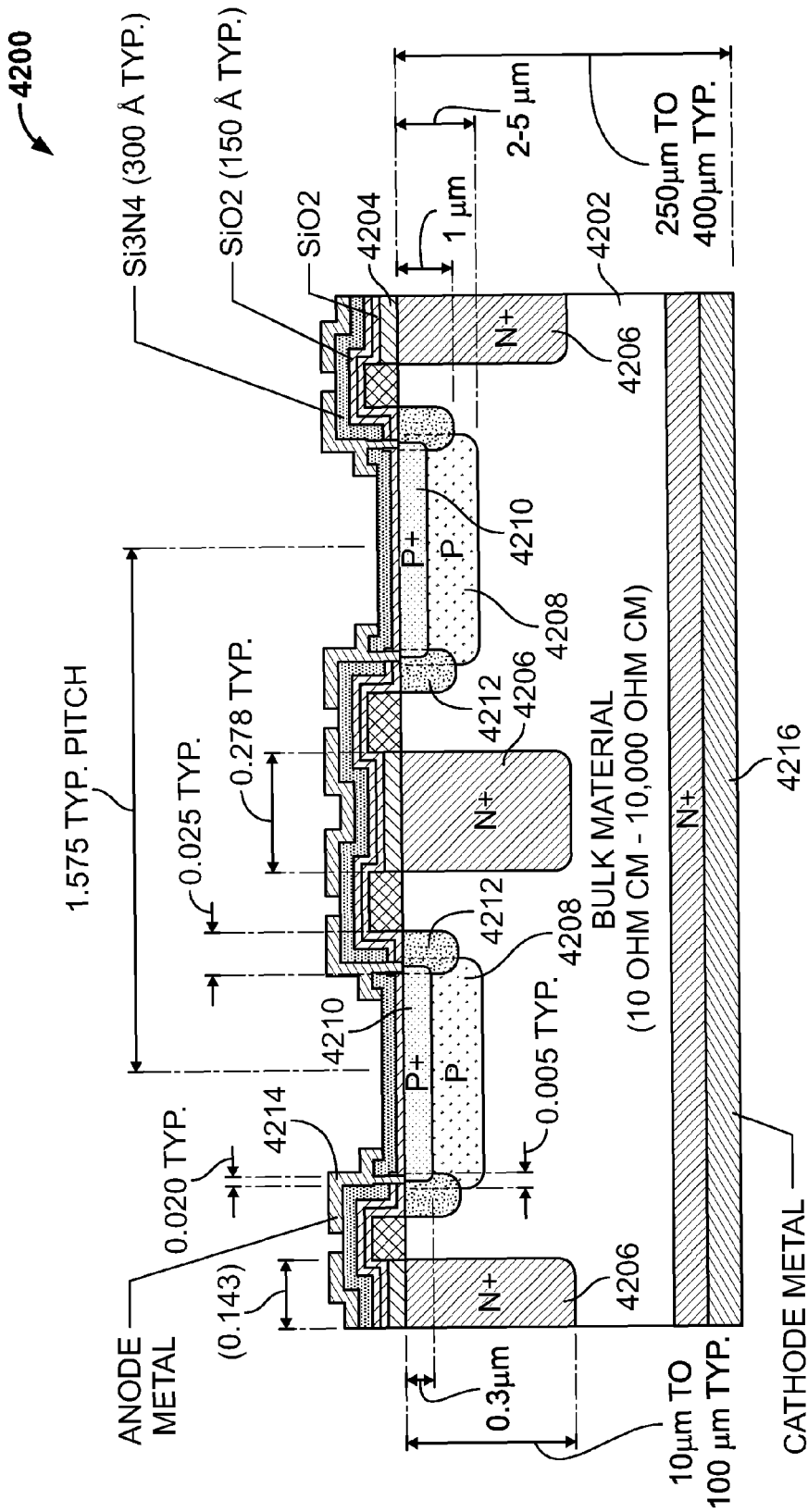
FIG. 42 illustrates a photodiode fabricated on a bulk wafer material, in accordance with an embodiment of the present specification.

FIG. 42 illustrates a photodiode built on a bulk wafer material, in accordance with an embodiment of the present specification. The photodiode 4200 comprises bulk wafer starting material 4202 having a resistivity ranging from 10 ohm cm to 10,000 ohm cm. In an embodiment, the bulk wafer material 4202 has a thickness ranging from 250 μm to 400 μm.

The photodiode 4200 represents a two element array and further comprises a mask oxide layer 4204 comprising silicon oxide ($SiO_2$) and/or silicon nitride ($Si_3N_4$), whereby thermal oxidation is employed to achieve the mask oxidation. In one embodiment, the oxide layer 4204 comprises $SiO_2$ having a thickness of approximately 8,000 Å. In one embodiment the $SiO_2$ layer defines a top surface of the photodiode 4200.

The photodiode 4200 also comprises three n+ diffused zones 4206 below the top surface of the photodiode 4200 and positioned within the bulk wafer material 4202, on an extreme right edge and an extreme left edge, as well as in the center of the photodiode 4200. In an embodiment, the three n+ diffused zones 4206 are separated from each other. The photodiode 4200 further comprises two p diffused regions 4208 having a thickness of approximately 2-5 μm. Also, in an embodiment, each p diffused region 4208 is positioned between two n+ diffused regions 4206. The photodiode 4200 further comprises two shallow p+ diffused zones or regions 4210 positioned directly on top of the p diffused regions 4206 and below the top layer of the photodiode 4200 as illustrated in FIG. 42. In an embodiment, the depth of the shallow p+ zones 4210 is approximately 0.3 μm.

In an embodiment, the p+ diffused zones 4210 and a portion of the p doped zones 4208 is surrounded by p+ doped rings 4212. In one embodiment, as shown in FIG. 42 the photodiode 4200 further comprises anodes 4214 on the top surface of the photodiode 4200 and a cathode 4216 on a backside of the photodiode 4200.

The above examples are merely illustrative of the structure and manufacturing steps of the photodiode array of the present specification. Although only a few embodiments of the present specification have been described herein, it should be understood that the present specification might be embodied in many other specific forms without departing from the spirit or scope of the invention. Therefore, the present examples and embodiments are to be considered as illustrative and not restrictive, and the invention may be modified within the scope of the appended claims.

I claim:

1. A photodiode having a top surface defined by at least one $SiO_2$ layer comprising:
   a low resistivity substrate;
   a high resistivity silicon layer positioned atop the low resistivity substrate and below the top surface of the photodiode;
   a first P doped zone within the high resistivity silicon layer, wherein the first P doped zone has a thickness of 2-5 μm;
   a first P+ doped zone positioned between the top of the first P doped zone and the top of the photodiode.

2. The photodiode of claim 1 wherein the low resistivity substrate has a thickness in a range of 150 μm to 350 μm.

3. The photodiode of claim 1 wherein the low resistivity substrate is doped n+.

4. The photodiode of claim 1 wherein the high resistivity silicon layer has a thickness in a range of 10 μm to 100 μm.

5. The photodiode of claim 1 wherein the high resistivity silicon layer is doped n.

6. The photodiode of claim 1 wherein the first P+ doped zone and a portion of the first P doped zone is surrounded by P+ doped ring.

7. The photodiode of claim 1 further comprising a first N+ region extending throughout the thickness of the high resistivity silicon layer.

8. The photodiode of claim 7 further comprising a second N+ region extending throughout the thickness of the high resistivity silicon layer, wherein the second N+ region is separated from the first N+ region by a third region and wherein the first P doped zone and first P+ doped zone is located in the third region.

9. The photodiode of claim 8 further comprising a third N+ region extending throughout the thickness of the high resistivity silicon layer, wherein the third N+ region is separated from the second N+ region by a fourth region.

10. The photodiode of claim 1 further comprising a second P doped zone within said fourth region in the high resistivity silicon layer, wherein the second P doped zone has a thickness of 2-5 µm.

11. The photodiode of claim 2 further comprising a second P+ doped zone positioned between the top of the second P doped zone and the top of the photodiode in the fourth region.

12. The photodiode of claim 1 wherein all of the first P+ doped zone and a portion of the first P doped zone is surrounded by P+ doped ring.

13. The photodiode of claim 1 wherein all of the second P+ doped zone and a portion of the second P doped zone is surrounded by P+ doped ring.

14. The photodiode of claim 1 further comprising an anode and a cathode on the top surface of the photodiode.

15. The photodiode of claim 1 further comprising an anode on the top surface of the photodiode and a cathode on a backside of the photodiode.

16. The photodiode of claim 1 further comprising an anode on the top surface of the photodiode, a cathode on the top surface of the photodiode, and a cathode on a backside of the photodiode.

* * * * *